(12) United States Patent
Park et al.

(10) Patent No.: US 9,355,913 B2
(45) Date of Patent: May 31, 2016

(54) 3D SEMICONDUCTOR DEVICES AND METHODS OF FABRICATING SAME

(71) Applicant: SAMSUNG ELECTRONICS CO., LTD., Suwon-Si, Gyeonggi-Do (KR)

(72) Inventors: Sang-Yong Park, Suwon-si (KR); Jintaek Park, Hwaseong-si (KR); Hansoo Kim, Suwon-si (KR); Juhyuck Chung, Suwon-si (KR); Wonseok Cho, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/047,578

(22) Filed: Oct. 7, 2013

(65) Prior Publication Data
US 2014/0038400 A1    Feb. 6, 2014

Related U.S. Application Data

(62) Division of application No. 13/297,493, filed on Nov. 16, 2011, now Pat. No. 8,564,050.

(30) Foreign Application Priority Data

Nov. 17, 2010    (KR) .................. 10-2010-0114544

(51) Int. Cl.
| | |
|---|---|
| H01L 21/82 | (2006.01) |
| H01L 21/44 | (2006.01) |
| H01L 29/792 | (2006.01) |
| H01L 21/8234 | (2006.01) |
| H01L 27/115 | (2006.01) |
| H01L 29/76 | (2006.01) |

(Continued)

(52) U.S. Cl.
CPC .. *H01L 21/823475* (2013.01); *H01L 27/11519* (2013.01); *H01L 27/11548* (2013.01); *H01L 27/11556* (2013.01); *H01L 27/11565* (2013.01); *H01L 27/11575* (2013.01); *H01L 27/11582* (2013.01); *H01L 29/7926* (2013.01)

(58) Field of Classification Search
None
See application file for complete search history.

(56) References Cited

U.S. PATENT DOCUMENTS

| | | | |
|---|---|---|---|
| 2007/0252201 A1 | 11/2007 | Kito et al. | |
| 2009/0020744 A1 | 1/2009 | Mizukami et al. | |

(Continued)

FOREIGN PATENT DOCUMENTS

| | | |
|---|---|---|
| CN | 101055875 A | 10/2007 |
| CN | 10-1651144 A | 2/2010 |

(Continued)

*Primary Examiner* — Mamadou Diallo
*Assistant Examiner* — Jay C Chang
(74) *Attorney, Agent, or Firm* — Volentine & Whitt, PLLC

(57) ABSTRACT

A three dimensional (3D) semiconductor device includes; a vertical channel extending from a lower end proximate a substrate to an upper end and connecting a plurality of memory cells, and a cell array comprising the plurality of cells, wherein the cell array is arranged in a gate stack of layers having a stair-stepped structure disposed on the substrate. The gate stack includes a lower layer including a lower select line coupled to a lower non-memory transistor proximate the lower end, upper layers including conductive lines respectively coupled to an upper non-memory transistor proximate the upper end and connected as a single conductive piece to form an upper select line, and intermediate layers respectively including a word line and coupled to a cell transistor, wherein the intermediate layers are disposed between the lower select line and the upper select line.

17 Claims, 55 Drawing Sheets

(51) Int. Cl.
*H01L 29/788* (2006.01)
*H01L 29/66* (2006.01)

(56) References Cited

U.S. PATENT DOCUMENTS

| | | | |
|---|---|---|---|
| 2009/0121271 A1* | 5/2009 | Son et al. | 257/315 |
| 2009/0224309 A1 | 9/2009 | Kidoh et al. | |
| 2009/0267135 A1* | 10/2009 | Tanaka et al. | 257/324 |
| 2009/0310425 A1 | 12/2009 | Sim et al. | |
| 2010/0195395 A1* | 8/2010 | Jeong et al. | 365/185.17 |
| 2010/0213526 A1 | 8/2010 | Wada et al. | |
| 2011/0256672 A1 | 10/2011 | Wada et al. | |
| 2011/0284947 A1 | 11/2011 | Kito et al. | |
| 2011/0287597 A1 | 11/2011 | Kito et al. | |
| 2013/0242654 A1 | 9/2013 | Sim et al. | |
| 2014/0264718 A1 | 9/2014 | Wada et al. | |

FOREIGN PATENT DOCUMENTS

| | | |
|---|---|---|
| JP | 60-200541 | 10/1985 |
| JP | 1-98243 A | 4/1989 |
| JP | 6-291192 A | 10/1994 |
| JP | 2009212280 A | 9/2009 |
| JP | 2009-224465 | 10/2009 |
| JP | 2010-199311 A | 9/2010 |

* cited by examiner

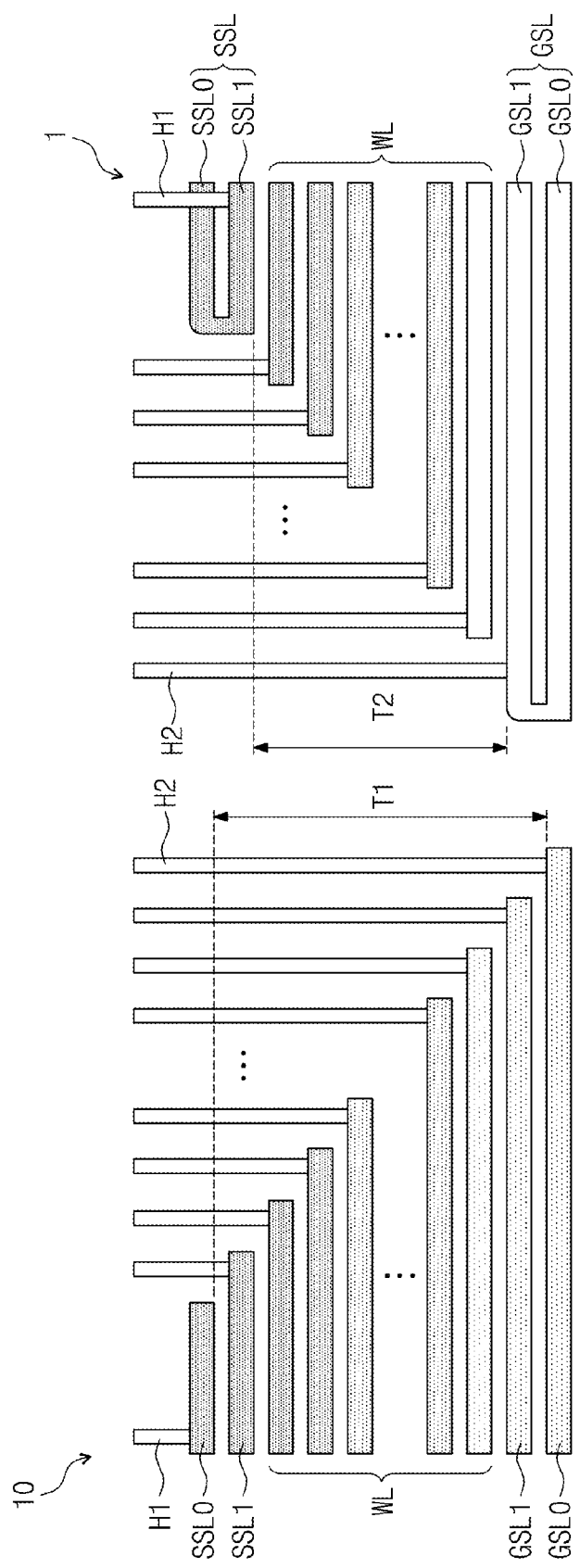

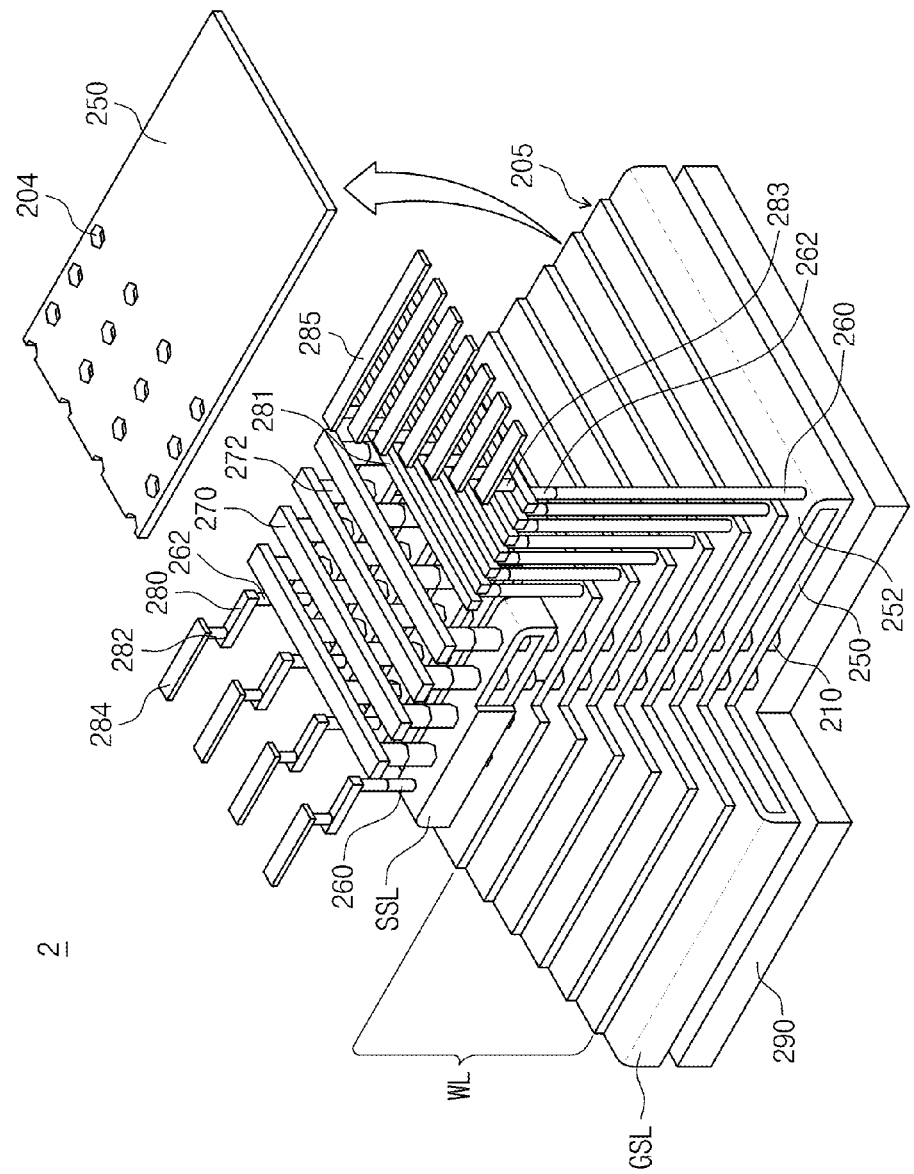

3D SEMICONDUCTOR DEVICES AND METHODS OF FABRICATING SAME

CROSS-REFERENCE TO RELATED APPLICATIONS

This is a Divisional Application of U.S. application Ser. No. 13/297,493, filed Nov. 16, 2011, which is a U.S. non-provisional patent application claims priority under 35 U.S.C. §119 to Korean Patent Application No. 10-2010-0114544 filed Nov. 17, 2010, the subject matter of which is hereby incorporated by reference.

BACKGROUND OF THE INVENTION

The present inventive concept relates to semiconductor devices, and more particularly, to multi-layer or three dimensional (3D) semiconductor devices and methods of fabricating same.

The demand for inexpensive semiconductor devices having high performance continues to drive integration density. In turn, increased integration density places greater demands on semiconductor fabrication processes. The integration density of two-dimensional (2D) or planar-type semiconductor devices is determined in part by the area occupied by the individual elements (e.g., memory cells) making up the constituent integrated circuitry. The area occupied by individual elements is largely determined by the sizing parameters (e.g., width, length, pitch, narrowness, adjacent separation, etc.) of the patterning technology used to define the individual elements and their interconnections. In recent years, the provision of increasingly "fine" patterns has necessitated the development and use of very expensive pattern formation equipment. Thus, the dramatic improvements in the integration density of contemporary semiconductor devices has come at considerable cost, and yet designers continue to run up against the practical boundaries of fine pattern development and fabrication.

As a result of the foregoing and a number of related fabrication challenges, increased integration density has more recently demanded the development of multi-layer or so-called three-dimensional (3D) semiconductor devices. For example, the single fabrication layer conventionally associated with the memory cell arrays of 2D semiconductor memory devices is being replaced by a multi-fabrication layer or three-dimensional (3D) arrangements of memory cells.

SUMMARY OF THE INVENTION

Various embodiments of the inventive concept provide highly integrated semiconductor devices and methods of fabricating same. Certain embodiments of the inventive concept provide semiconductor devices configured to prospectively prevent process accidents, thereby improving fabrication yield of devices that exhibit excellent electrical characteristics. Other embodiments of the inventive concept provide methods of fabrication for such semiconductor devices. Certain embodiments of the inventive concept provide semiconductor devices configured to prevent or minimize process errors that may arise when contacts are formed in connection with word line pads. Other embodiments of the inventive concept provides related methods of fabrication for such semiconductor devices.

In one embodiment, a three dimensional (3D) semiconductor memory device is provided that comprises memory cells arranged in a plurality of layers vertically stacked on a substrate, wherein the memory cells are series connected by a vertical channel extending from a lower end proximate the substrate and coupled to a lower non-memory cell to an upper end coupled to an upper non-memory cell, wherein the plurality of layers collectively forms a stair-stepped structure and each one of the plurality of layers comprises a successively exposed end portion serving as a pad, and at least one of the upper non-memory cell and the lower non-memory cell comprises a plurality of vertically stacked non-memory cells connected as one conductive piece.

In another embodiment, a 3D semiconductor device is provided that comprises; a vertical channel extending from a lower end proximate a substrate to an upper end and connecting a plurality of memory cells, and a cell array comprising the plurality of cells, wherein the cell array is arranged in a gate stack of layers having a stair-stepped structure disposed on the substrate. The gate stack comprises; a lower layer including a lower select line coupled to a lower non-memory transistor proximate the lower end, a plurality of upper layers including conductive lines respectively coupled to an upper non-memory transistor proximate the upper end and connected as a single conductive piece to form an upper select line, and a plurality of intermediate layers respectively including a word line and coupled to a cell transistor, wherein the plurality of intermediate layers is disposed between the lower select line and the upper select line.

In another embodiment, a 3D semiconductor device is provided and comprises; a vertical channel extending from a lower end proximate a substrate to an upper end and connecting a plurality of memory cells, and a cell array comprising the plurality of cells, wherein the cell array is arranged in a gate stack of layers having a stair-stepped structure disposed on the substrate. The gate stack comprises; a plurality of lower layers respectively including conductive lines coupled to a lower non-memory transistor proximate the lower end and connected as a second conductive piece to form a lower select line, a plurality of upper layers respectively including conductive lines coupled to an upper non-memory transistor proximate the upper end and connected as a single conductive piece to form an upper select line, and a plurality of intermediate layers respectively including a word line coupled to a cell transistor, wherein the plurality of intermediate layer is disposed between the lower select line and the upper select line.

In still another embodiment, a method of fabricating a semiconductor device is provided. The method comprises; forming a plurality of vertical channels extending from a substrate, and forming a gate stack having a stair-stepped structure by vertically stacking a plurality of layers each respectively including a gate, wherein at least one of an uppermost layer and a lowermost layer comprises vertically adjacent multi layers connected via a conductor.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings:

FIGS. 2A through 2C are views for comparing the semiconductor device of an embodiment with a semiconductor device having a different structure, FIGS. 2A and 2C being sectional views, FIG. 2B being a plan view;

FIGS. 3A and 3B are perspective view illustrating a semiconductor device according to an embodiment of the inventive concept;

DETAILED DESCRIPTION

Exemplary embodiments of the inventive concept will now be described in some additional detail with reference to the accompanying drawings. The inventive concept may, however, be embodied in different forms and should not be construed as being limited to only the illustrated embodiments. Rather, these embodiments are provided so that this disclosure will be thorough and complete, and will fully convey the scope of the inventive concept to those skilled in the art.

Throughout the written description and drawings, like reference numbers and labels are used to denote like or similar elements.

Figure 1A:
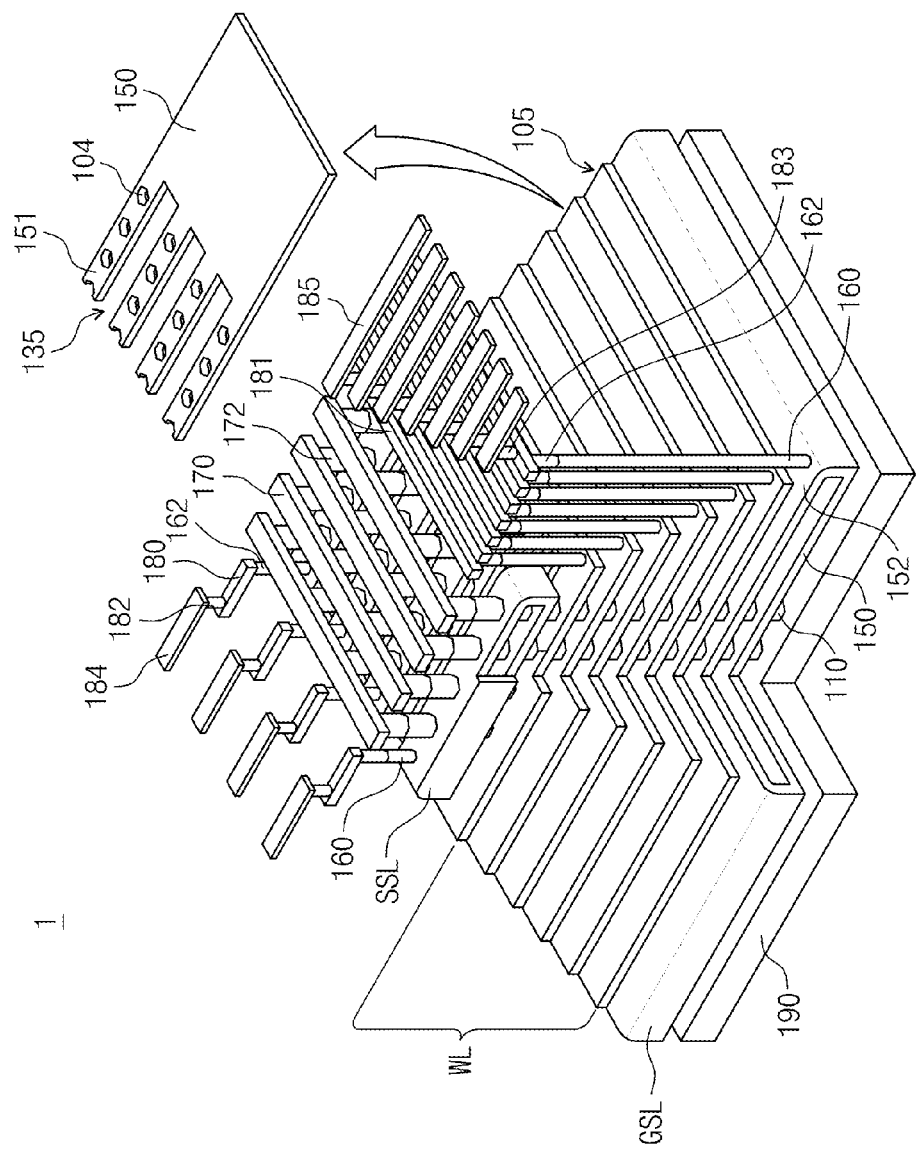
FIGS. 1A and 1B are perspective views illustrating a semiconductor device according to an embodiment of the inventive concept.
Figure 1B:
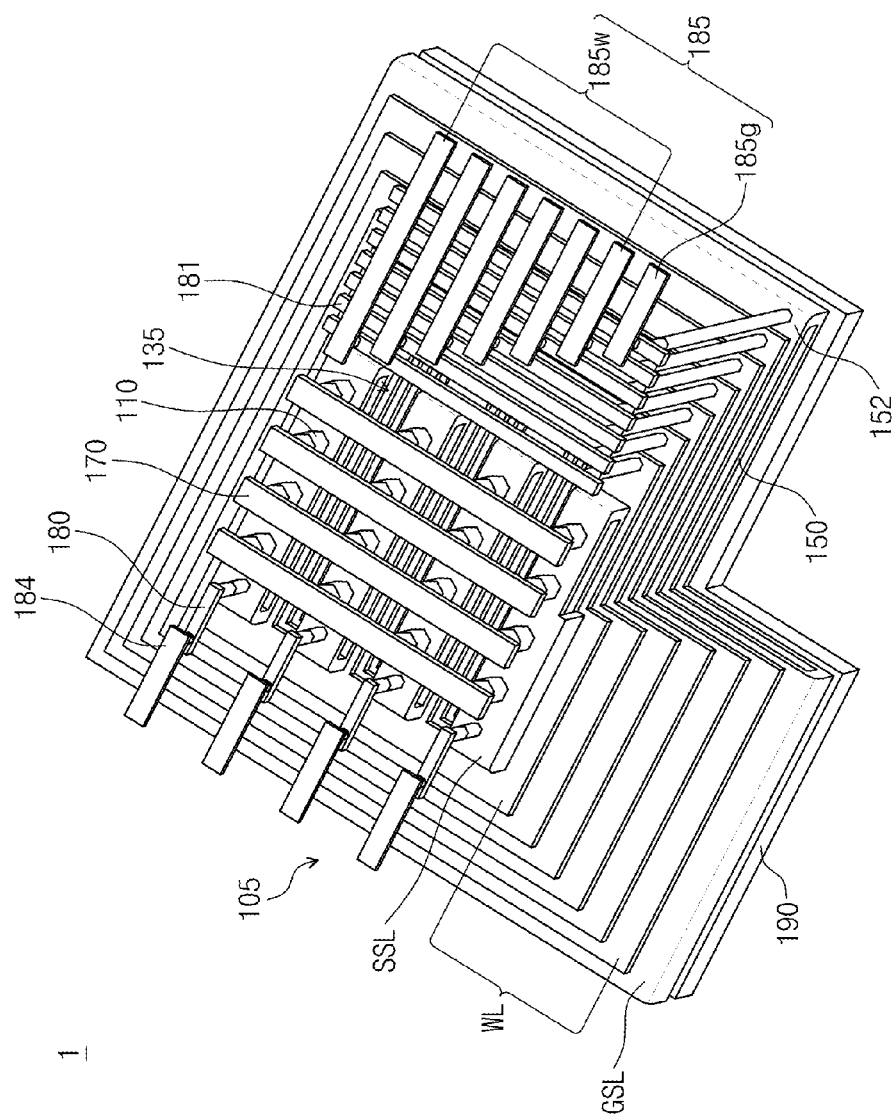

FIGS. 1A and 1B are perspective views illustrating a semiconductor device according to an embodiment of the inventive concept.

Referring to FIGS. 1A and 1B, a semiconductor device 1 may include a plurality of vertical channels 110 disposed on (extending upward from) a semiconductor substrate 190, a plurality of gates 150 constituting word lines WL and selection lines SSL and GSL that are vertically stacked along the extension direction of the vertical channels 110, and a plurality of bit lines 170 connected to the vertical channels 110.

It should be noted that certain relative geometric terms (e.g., vertical, horizontal, above, below, adjacent, upper, lower, etc.) will be used throughout this description for the sake of clarity. Those skilled in the art will recognize that such terms are arbitrary and relative in their descriptive nature. They do not limit the disposition of the illustrated embodiments to any given orientation or the illustrated, exemplary geometry.

Lower parts of the vertical channels 110 may be connected to the semiconductor substrate 190, and upper parts of the vertical channels 110 may be respectively connected to the bit lines 170 through contact pads 172. The gates 150 may constitute ground selection lines GSL close to the semiconductor substrate 190, string selection lines SSL close to the bit lines 170, and a plurality of word lines WL disposed between the ground selection lines GSL and the string selection lines SSL. The ground selection line GSL, word lines WL, and string selection line SSL that are arranged along a vertical channel 110 at predetermined intervals may be electrically connected in series to form a cell string 72 (refer to FIG. 1J). All the word lines WL may constitute memory cells. Alternatively, word lines WL next to the selection lines SSL and GSL may constitute dummy cells, and the other word lines WL may constitute memory cells. According to the embodiment illustrated in FIG. 1A, the semiconductor device 1 may be a flash memory device including a cell array in which a plurality of memory cells are vertically arranged and electrically connected in series.

Figure 2A:
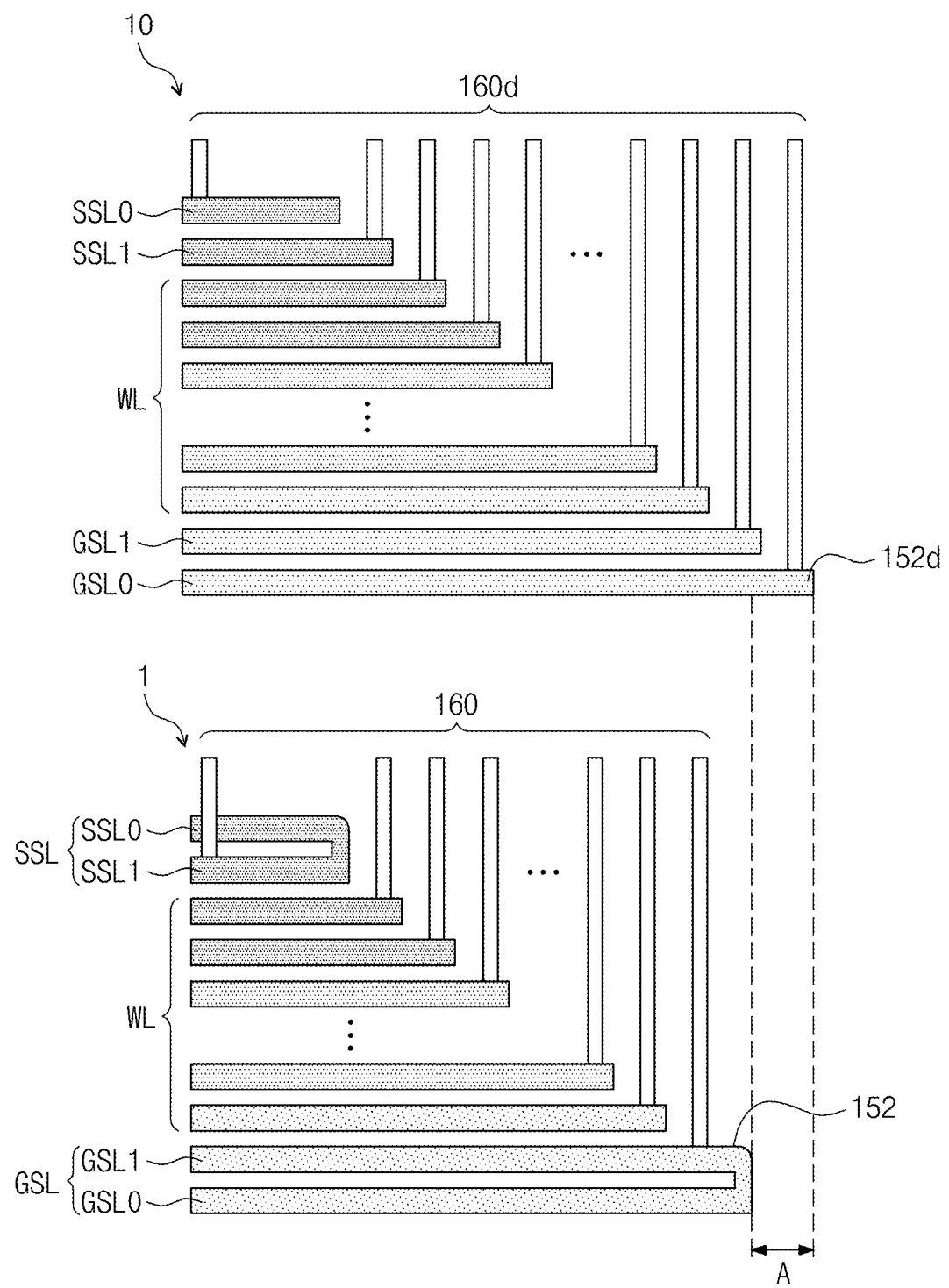
Figure 2B:
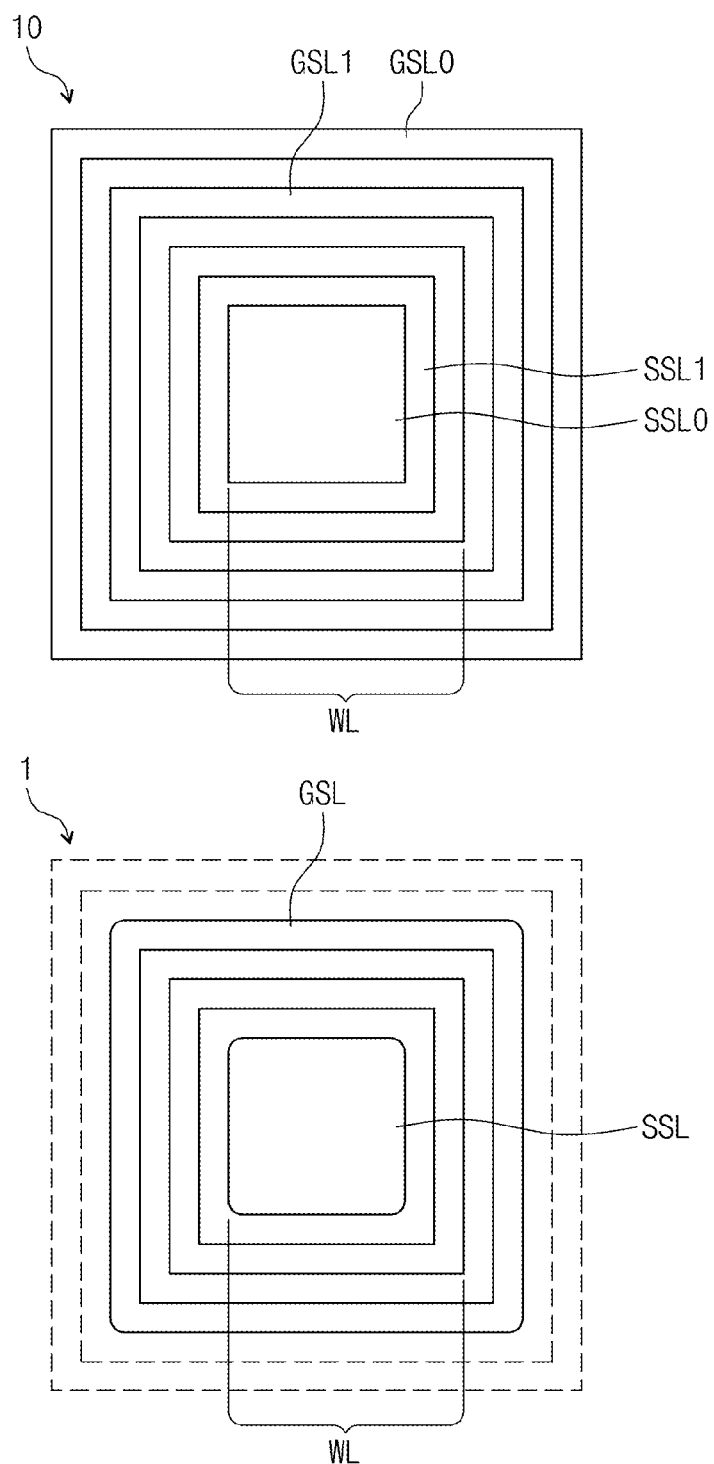

In certain embodiments, at least one of the selection lines SSL and GSL may have a multi-layer structure. For example, the string selection line SSL may have a two-layer structure. In this case, the channel length of cells constituted by the string selection line SSL may be increased to improve leakage current characteristics. The ground selection line GSL may have a single-layer structure or two-layer structure. For example, the gates 150 constituting the string selection line SSL may have a two-layer line shape; the gate 150 constituting the word line WL may have a single-layer rectangular plate shape; and the gates 150 constituting the ground selection line GSL may have a rectangular plate shape or a two-layer rectangular plate shape. In addition, upper and lower layers of at least one of the select lines SSL and GSL may have the same size or similar sizes and may be vertically connected to each other as one piece to decrease the size of the semiconductor device 1 as shown in FIGS. 2A and 2B and described hereafter. The upper edges and/or corners of the two-layer string selection line SSL may be rounded. Similarly, the upper edges and corners of the two-layer ground selection line GSL may be rounded. The upper edges and/or corners of the word lines WL may be angulated or rounded.

The gates 150 constituting the word lines WL and the ground selection lines GSL may include branches 151 separated by word line cuts 135. A plurality of channel holes 104 may be formed through the branches 151 so that the vertical channels 110 can be disposed through the branches 151.

The semiconductor device 1 may include contacts 160 that connect the lines GSL, WL, and SSL to driving circuits. The contacts 160 may have a plug shape such as a vertical pillar. Lower parts of the contacts 160 may be connected to the gates 150, and upper parts of the contacts 160 may be electrically connected to metal lines 184 and 185 connected to the driving circuits. For example, the contacts 160 may be connected to the metal lines 184 and 185 through contact pads 162. The metal lines 184 and 185 may include first metal lines 184 that electrically connect the string select lines SSL to one or more string select line driving circuits, and second metal lines 185 that connect the word lines WL and the ground selection lines GSL to one or more word line driving circuits and one or more ground selection line driving circuits.

As shown in FIG. 1B, the second metal lines 185 may include a metal line 185g that connects the ground selection line GSL to the ground selection line driving circuit, and metal lines 185w that connect the word lines WL to the word line driving circuit.

Returning to FIG. 1A, intermediate metal lines 180 and 181 may be further disposed between the contacts 160 and the metal lines 184 and 185. The intermediate metal lines 180 and 181 may include first intermediate metal lines 180 electrically to the first metal lines 184, and second intermediate metal lines 181 electrically connected to the second metal lines 185. In this case, the first intermediate metal lines 180 may be connected to the first metal lines 184 through contact pads 182, and the second intermediate metal lines 181 may be connected to the second metal lines 185 through contact pads 183.

The thicknesses of the gates 150 may be uniform or non-uniform. For example, the thicknesses of the gates 150 may be uniform regardless of whether the gates 150 constitute the word lines WL or selection lines GSL and SSL. In another example, the gates 150 constituting the word lines WL may have a first thickness, and the gates 150 constituting the selection lines GSL and SSL may have a second thickness smaller or greater than the first thickness. For example, the second thickness may be greater than the first thickness. In this case, the vertical distances between the gates 150 may be uniform or non-uniform.

Figure 1C:
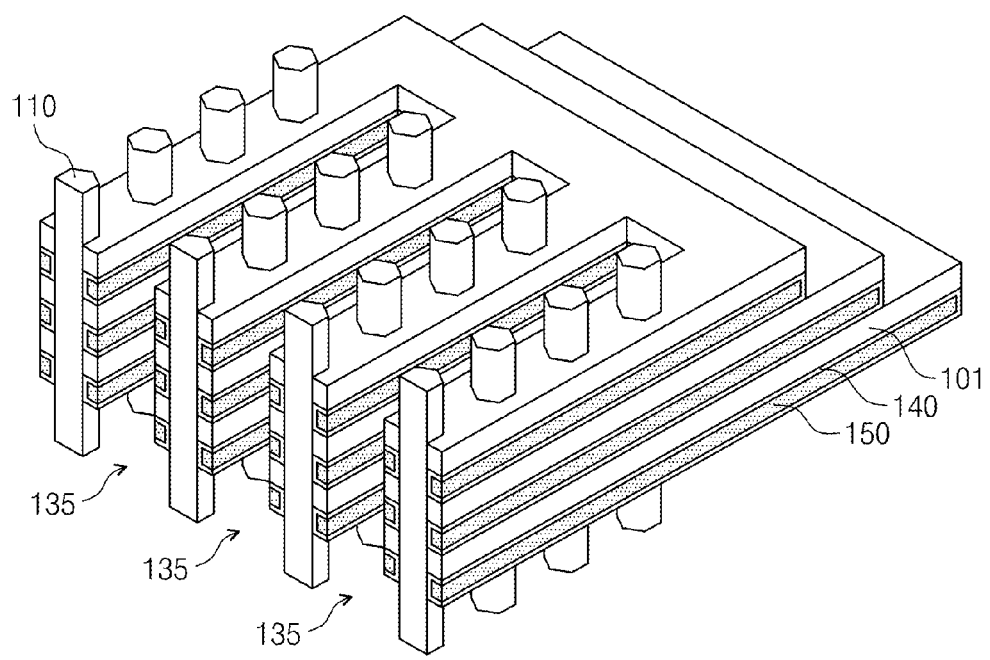
FIGS. 1C through 1G are partial enlarged views illustrating the semiconductor device of an embodiment of the inventive concept.
Figure 1D:
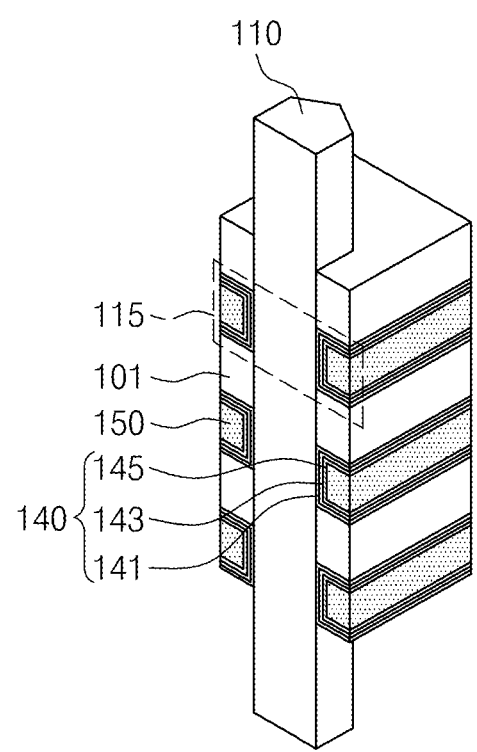

For example, certain insulating layers 101, like the some shown in FIG. 1D may have the same thickness regardless of the positions of the insulating layers 101. In another example, insulating layers 101 between the word lines WL may have a third thickness; and an insulating layer 101 between the word line WL and the ground selection line GSL, and/or an insulating layers 101 between the word line WL and the string selection line SSL may have a fourth thickness less than or greater than the third thickness. For example, the fourth thickness may be greater than the third thickness.

Returning to FIG. 1A, the four sides of the gates 150 may be arranged in a stair-stepped pyramid shape to form a gate stack 105. In this case, each of the gates 150 (or constituent layers respectively including the gates 150) may not be completely covered by a successive upper gate 150, but may be partially exposed, such that pads (lower and intermediate) 152 may be defined for contact with the contacts 160. Thus, the pads 152 are not separate from the gates 150, but are in the illustrated embodiment, exposed portions of the gates 150. When the gates 150 are stacked in a stair shape arrangement as described above, the pads 152 will also be arranged in a stair shape. Thus, the respective heights of the contacts 160 may be non-uniform. In this case, some of the gates 150 disposed at upper positions may be undesirably removed during an etch process used to form contact holes 137 (refer to FIG. 4H), and thus a contact hole penetrating more than one gate 150 may be formed.

The area or width of the (upper) pads 152 of the string selection lines SSL and/or the (lower) ground selection lines GSL may be greater than the area or width of the (intermediate) pads 152 of the word lines WL. This will be described later in some additional detail with reference to FIG. 4F.

In certain embodiments, at least one of the selection lines SSL and GSL may have a multi-layer structure, for example, a two-layer structure wherein separate layers are connected to each other. For example, the string selection line SSL may have a two-layer structure so that the pads 152 of the gates 150 may be vertically connected. In this case, as described later with respect to FIG. 2C, sufficient etch margin may be ensured and excessive etching prevented or greatly reduced. The contacts 160 electrically connected to the string selection line SSL may be connected to upper layer or lower layer through the upper layer. In another example, the ground selection line GSL may have a two-layer structure. In this case, the contacts 160 electrically connected to the ground selection line GSL may be connected to upper layer thereof. In another example, both the string selection line SSL and the ground selection line GSL may have a two-layer structure in which upper and lower pads 152 are vertically connected.

FIGS. 1C through 1G are partial enlarged views further illustrating the semiconductor device 1 of FIG. 1A.

Referring to FIGS. 1C and 1D, the insulating layers 101 may be disposed between the gates 150, and information storage layers 140 may be disposed between the vertical channels 110 and the gates 150. The information storage layers 140 may include charge storage layers 143 surrounding lateral sides of the vertical channels 110. For example, the charge storage layers 143 may be trap insulating layers, floating gates, or insulation layer comprising conductive nano-dots. In an embodiment, the information storage layers 140 may further include tunnel insulating layers 141 and blocking insulating layers 145. Since the gates 150 are vertically stacked, a plurality of memory cells 115 connected in series along the extension direction of the vertical channels 110 may be configured.

Figure 1E:
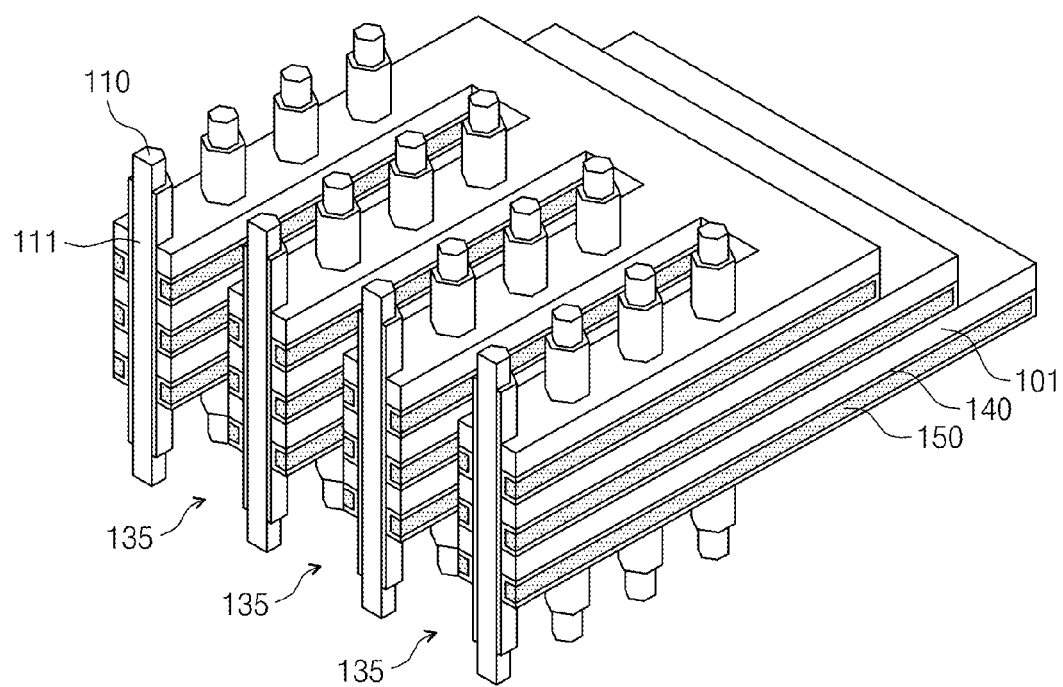

Referring to FIG. 1E, the vertical channel 110 may have a hallow-tubular or "macaroni" structure in which an insulator 111 is disposed. In this case, since insulator 111 is disposed in the vertical channel 110, the vertical channel 110 may be thinner as compared with the case shown in FIG. 1D, and thus carrier trap sites may be reduced for better electric characteristics.

Figure 1F:
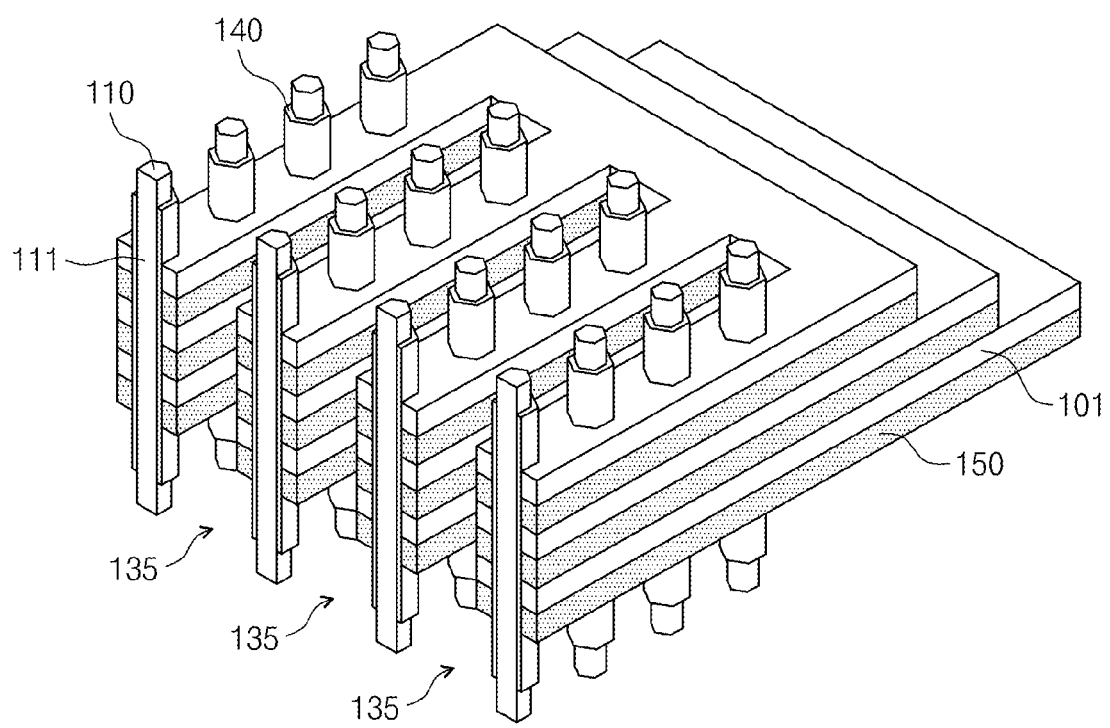
Figure 1G:
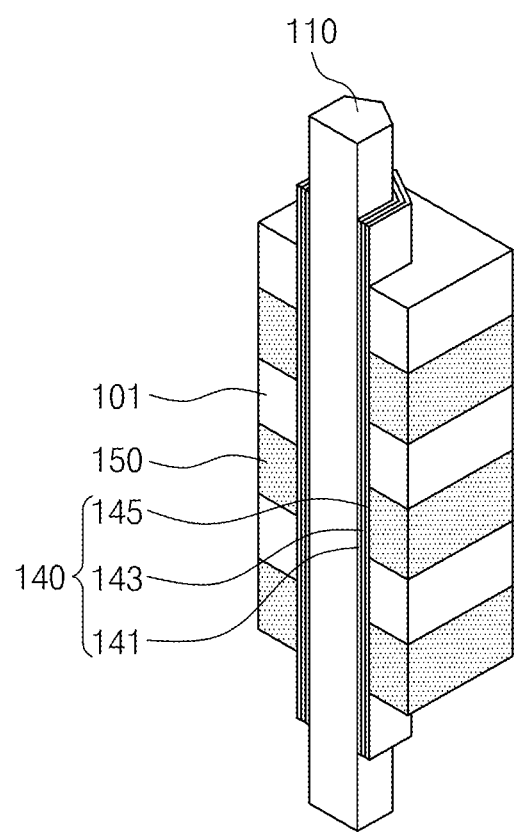

Referring to FIGS. 1F and 1G, the information storage layer 140 may extend vertically along the side wall of the vertical channel 110. In this case, since the information storage layer 140 is not disposed between the insulating layers 101, the vertical distance between the insulating layers 101 can be reduced, and the vertical height of the semiconductor device 1 can be also reduced. In the information storage layers 140, the charge storage layer 143 may be disposed between the tunnel insulating layer 141 and the blocking insulating layer 145. The vertical channel 110 may have a bulk structure as shown in FIG. 1C or a macaroni structure as shown in FIG. 1E.

Figure 1H:
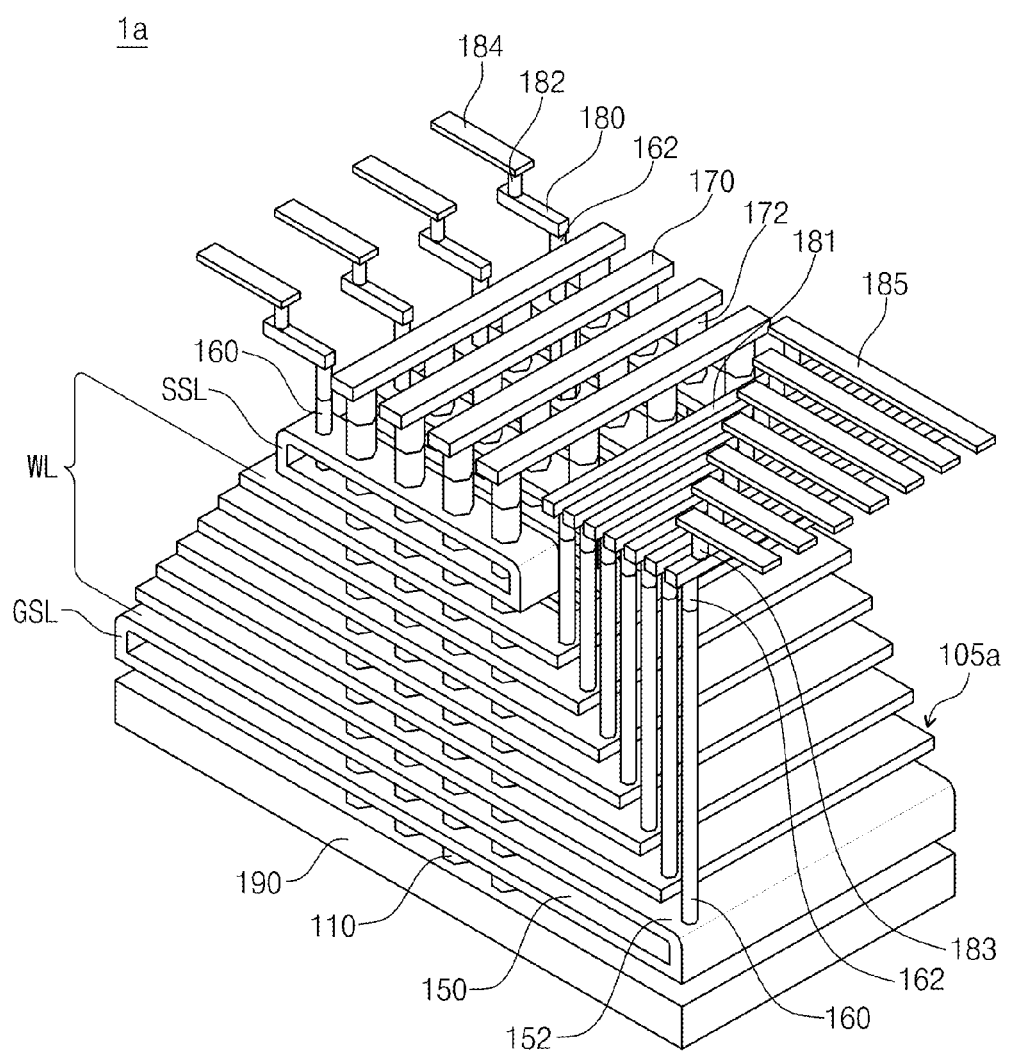
FIG. 1H is a perspective view illustrating a semiconductor device according to an embodiment of the inventive concept.

FIG. 1H is a perspective view illustrating a semiconductor device according to an embodiment of the inventive concept.

Referring to FIG. 1H, a semiconductor device 1a may include a gate stack 105a in which vertical channels 110 are disposed on a semiconductor substrate 190 and gates 150 are vertically stacked in the extension direction of the vertical channels 110. Opposite sides of the gate stack 105a may have a stair shape. For example, opposite sides of the gate stack 105a may be stepped in directions perpendicular to the extension direction of bit lines 170, and the other sides of the gate stack 105a may have a vertically stacked shape. The other structures of the semiconductor device 1a are substantially similar to corresponding structures previously described in relation to the semiconductor device 1 shown in FIGS. 1A through 1G.

Figure 1I:
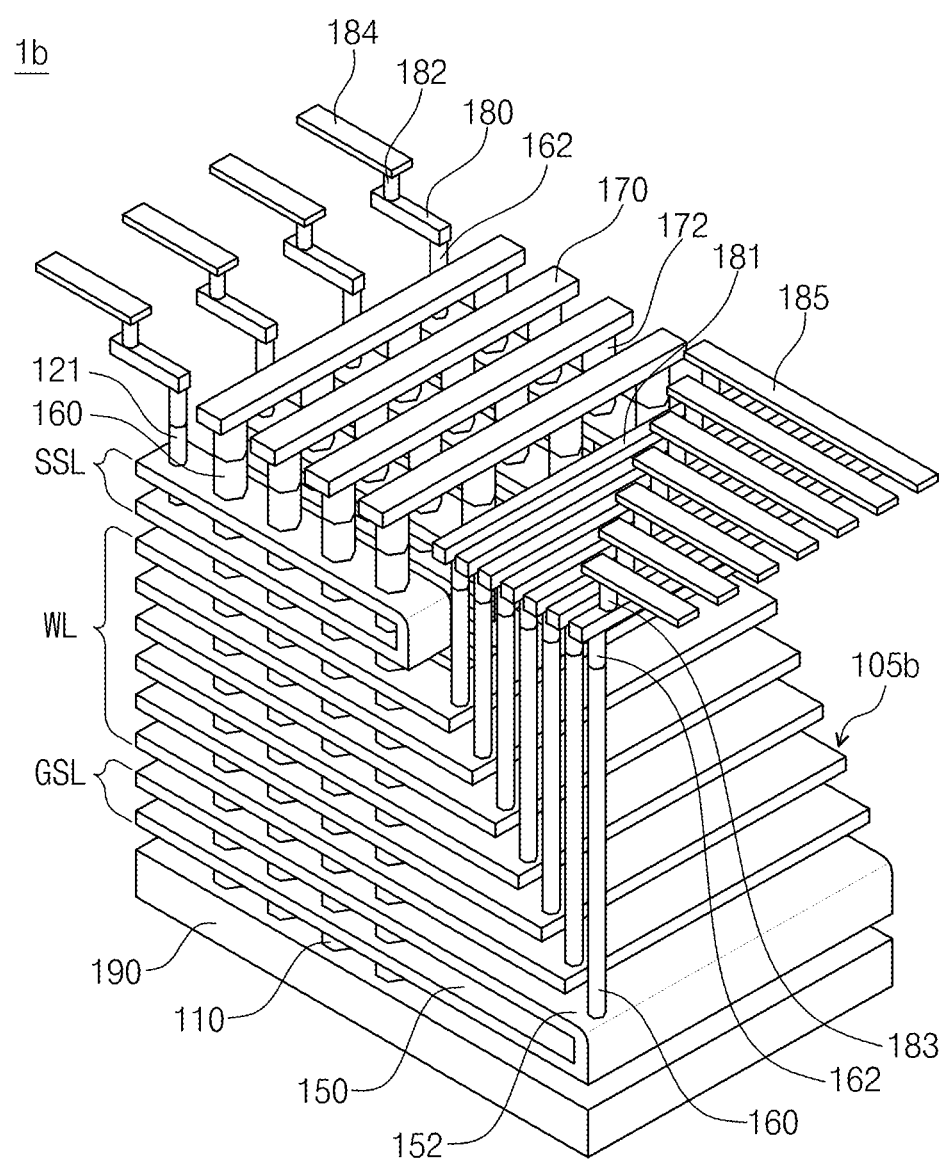
FIG. 1I is a perspective view illustrating a semiconductor device according to an embodiment of the inventive concept.

FIG. 1I is a perspective view illustrating a semiconductor device according to an embodiment of the inventive concept.

Referring to FIG. 1I, a semiconductor device 1b may include a stair-shaped stack 105b in which gates 150 are vertically stacked in the extension direction of vertical channels 110 disposed on a semiconductor substrate 190. At one side, the gates 150 may be stacked in a stair shape which is perpendicular to the extension direction of bit lines 170, and at the other sides, the gates 150 may be vertically stacked. The other structures of the semiconductor device 1b are substantially similar to corresponding structures previously described in relation to the semiconductor device 1 shown in FIGS. 1A through 1G.

Figure 1J:
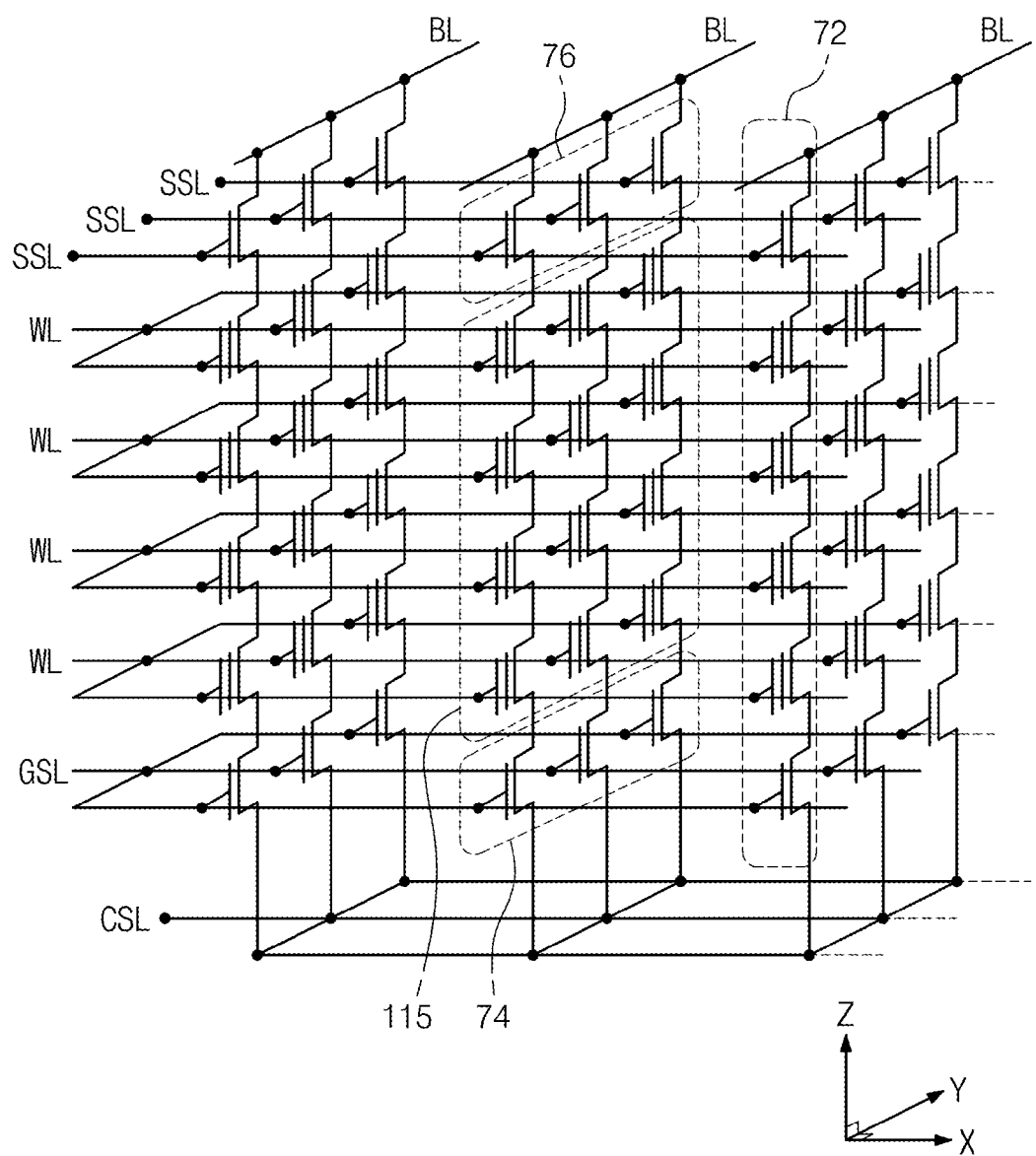
FIG. 1J is an equivalent circuit diagram illustrating the semiconductor device of an embodiment of the inventive concept.

FIG. 1J is an equivalent circuit diagram further illustrating the semiconductor device 1 shown in FIGS. 1A through 1G.

Referring to FIG. 1J together with FIGS. 1A and 1B, in the semiconductor device 1, memory cells or memory transistors 115 are constituted by the vertical channels 110 and the gates 150 constituting the word lines WL, and upper non-memory cells or upper non-memory transistors 76 are constituted by the vertical channels 110 and the gates 150 constituting the string selection lines SSL. Lower non-memory cells or lower non-memory transistors 74 are constituted by the vertical channels 110 and the gates 150 constituting the ground selection lines GSL. A part of the semiconductor substrate 190 forms a source corresponding to a common source line CSL. Along one vertical channel 110, an upper non-memory cell 76, a lower non-memory cell 74, and a plurality of memory cells 115 between the upper and lower non-memory cells 76 and 74 may be connected in series to form a cell string 72 electrically connected to a bit line BL. The equivalent circuit diagram of FIG. 1J also informs the electrically connective nature of other semiconductor devices described herein, not just the semiconductor device 1 shown in FIGS. 1A through 1G.

Within the embodiment of FIG. 1J, each of the word lines WL may have a planar structure and substantially perpendicular to the cell string 72. The memory cells 115 may be distributed along the word lines WL. The string selection lines SSL may cross the bit lines BL in the X direction. The string selection lines SSL spaced in the Y direction are electrically connected to the bit lines BL spaced in the X direction, respectively. Thus, the memory cells 115 can be individually selected. The ground selection lines GSL may have a planar structure and substantially perpendicular to the cell string 72. Electrical connection between the vertical channel 110 and the semiconductor substrate 190 may be controlled through the ground selection lines GSL.

In the semiconductor device 1 shown in FIGS. 1A through 1G, a programming operation may be performed by charging a charge storage layer by applying a voltage between a selected word line WL and the vertical channel 110. For example, a programming operation may be performed by applying a program voltage Vprog to a selected word line WL to inject electrons to a charge storage layer of the memory cell 115 by Fowler-Nordheim Tunneling. At this time, since memory cells (transistors) connected to other word lines WL (i.e., the non-selected word lines) can be programmed by the program voltage Vprog applied to the selected word line WL, boosting technology is used to prevent such undesired programming.

In read operation, a word line WL to which a memory cell 115 to be read is connected is set to 0 volt and another word lines are set to a read voltage Vread. As a result, it is determined whether a current is charged into a bit line BL according to whether the threshold voltage Vth of the memory cell 115 to be read is more or less than 0 volt. Therefore, data information of the memory cell 115 can be read by sensing the current of the bit line BL.

An erase operation can be performed by unit of block using a gate induced drain leakage current (GIDL). In one example, the electrical potential of vertical channels 110 is elevated by applying an erase voltage Verase to a selected bit line BL and the semiconductor substrate 190. At this time, the electrical potential of the vertical channel 110 may be elevated after a predetermined delay. By this, GIDL is generated from terminals of gates 150 corresponding to ground selection lines GSL, and electrons generated by the GIDL are ejected to the semiconductor substrate 190, and generated holes are ejected to the vertical channels 110. Accordingly, an electrical potential close to the erase voltage Verase can be applied to the vertical channels 110 to which memory cells 115 are connected. At this time, if the voltage potential of word lines WL is set to 0 volt, electrons accumulated in the memory cell 115 are ejected, so that data may be erased. Word lines WL of non-selected blocks can be floated to prevent this non-intended erase operation.

The foregoing method is just one possible method of operation for the semiconductor device 1 shown in FIGS. 1A through 1G according to certain embodiments of the inventive concept. Those skilled in the art will recognize that other methods of operation, including differently defined, interrelated control voltages, might alternately be used in conjunction with one or more embodiments of the inventive concept.

Figure 1K:
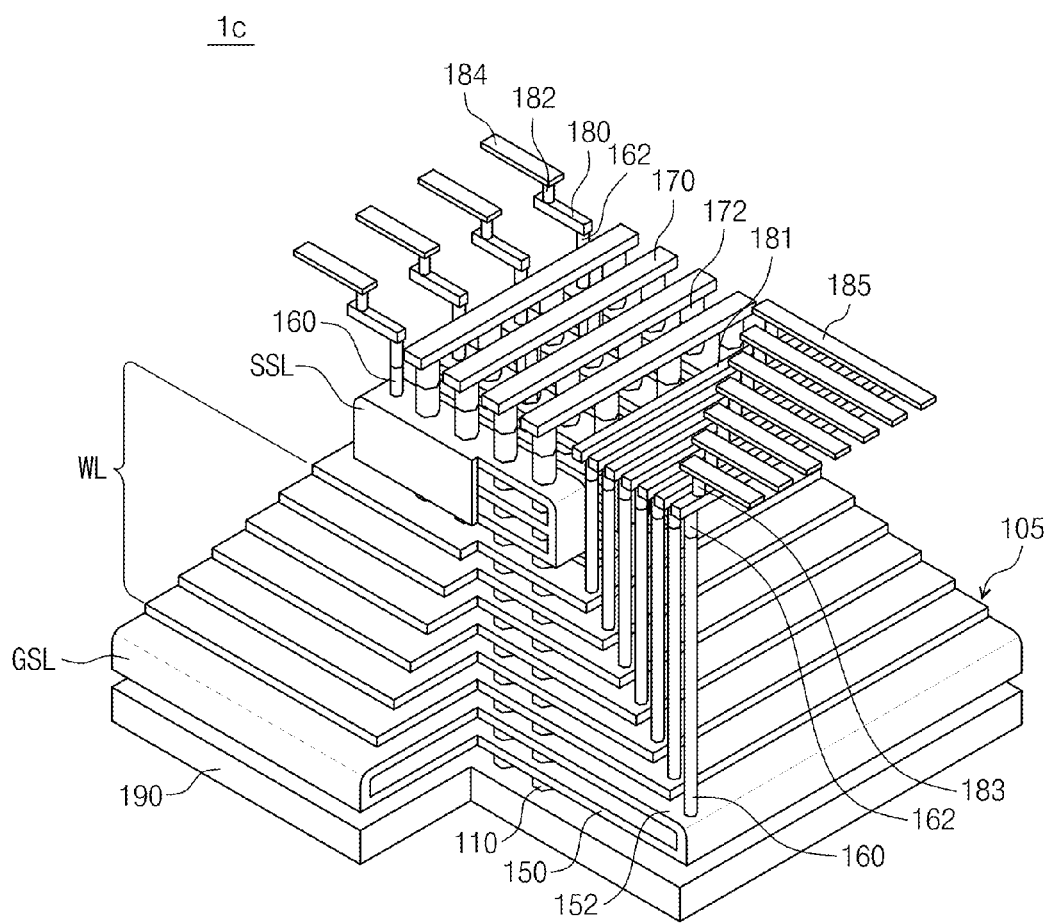
FIGS. 1K through 1M are perspective views illustrating modification examples of the selection lines of the semiconductor device of an embodiment.
Figure 1L:
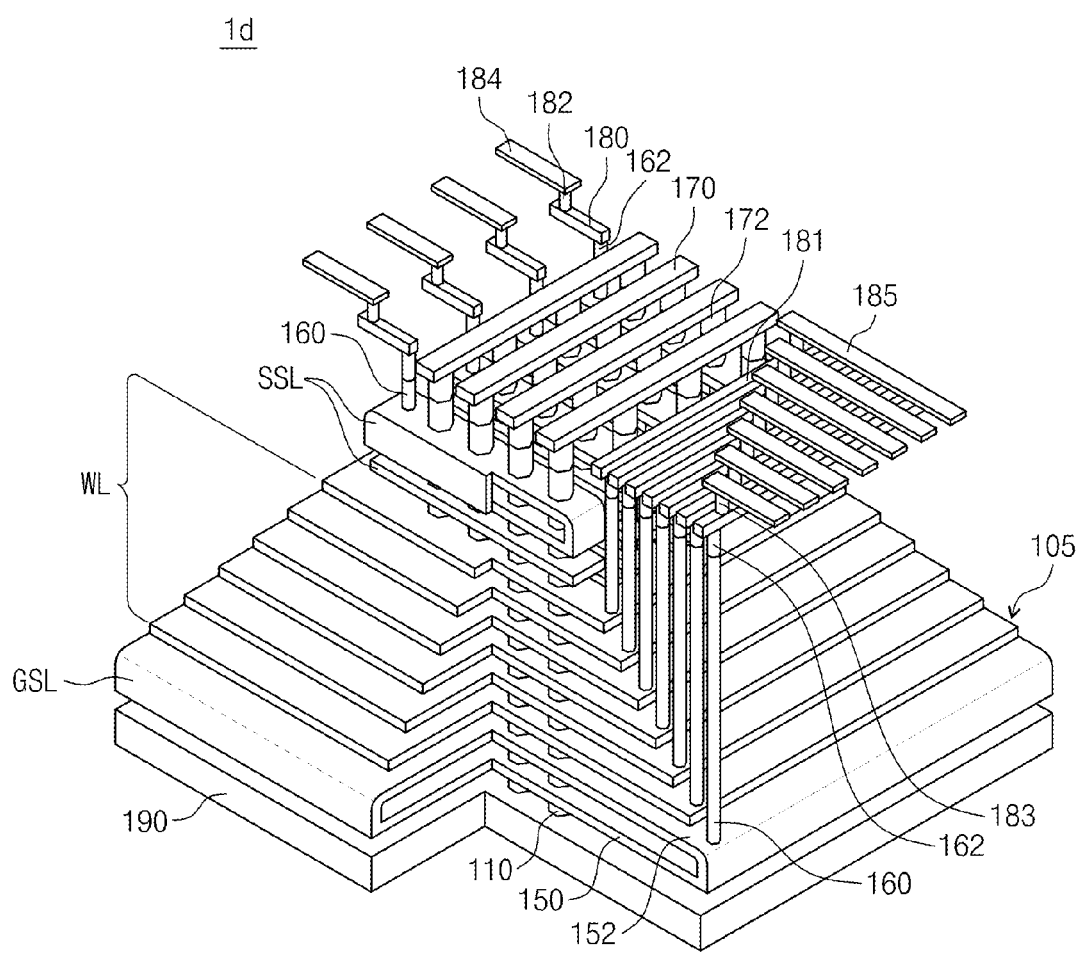
Figure 1M:
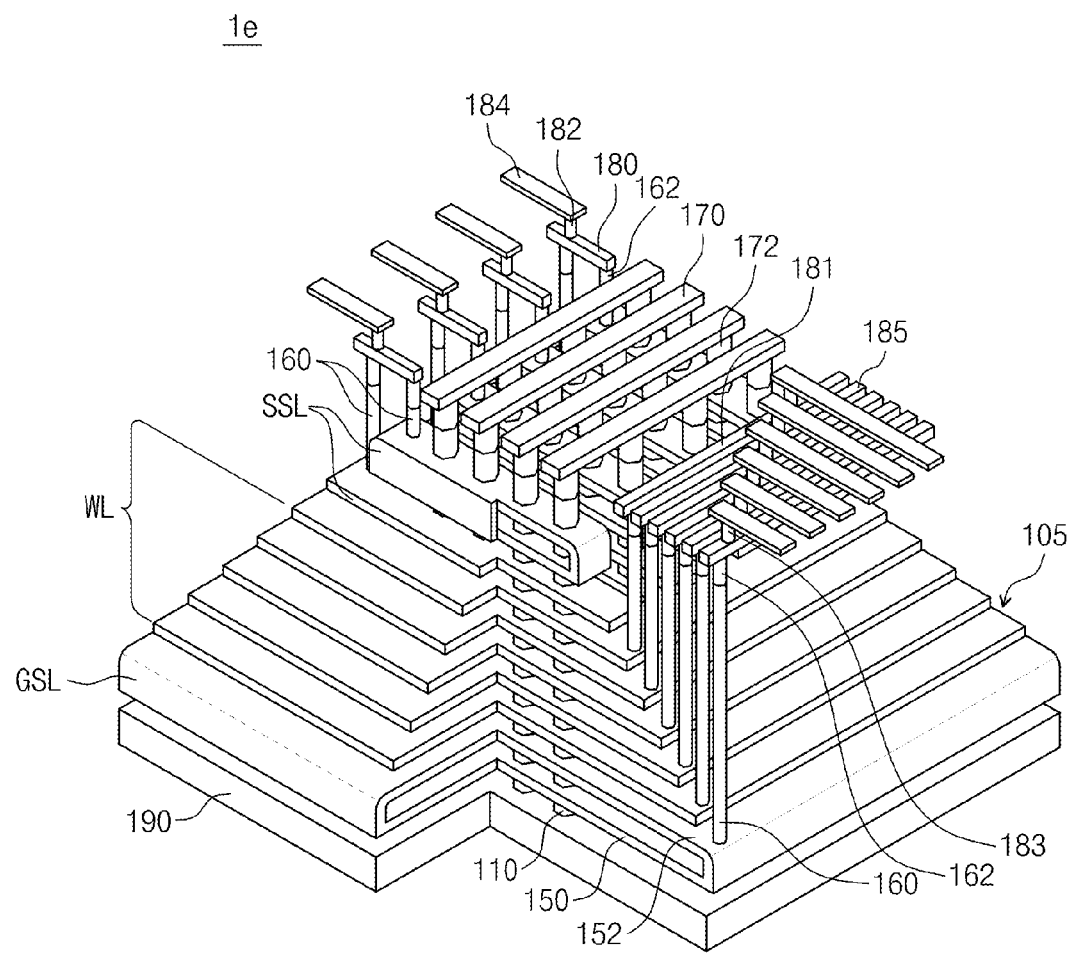

FIGS. 1K through 1M are perspective views illustrating one possible modification related to the selection lines of semiconductor devices according to certain embodiments of the inventive concept.

Referring to FIG. 1K, a semiconductor device 1c may include string selection lines SSL having a three-layer structure. For example, three line-shaped (lateral running) gates 150 having the same or similar sizes may be vertically stacked to form the three-layer string selection lines SSL. In the illustrated embodiment, the string selection lines SSL may be formed by three (non-memory cell) gates 150 that commonly connected as one conductive piece. Contacts 160 may be electrically connected to the string selection lines SSL by connecting the contacts 160 to an upper layer of the string selection lines SSL, middle layer of the string selection lines SSL through the upper layer, or lower layer of the string selection lines SSL through the upper and middle layers. Ground selection lines GSL may have a single-layer structure or a multi-layer structure. For example, the ground selection lines GSL may have a three-layer structure like the string selection lines SSL.

Referring to FIG. 1L, a semiconductor device 1d may include three-stage string selection lines SSL formed by vertically connecting three line-shaped gates 150 having the same or similar sizes. In the illustrated embodiment, two upper layers of the string selection lines SSL may be separate from a lower layer of the string selection lines SSL. For example, the two upper gates 150 of three gates 150 may be commonly connected as one piece to form a two-layer string selection line SSL, and the lower gate 150 may form single-layer string selection lines SSL separate from the upper two-layer string selection lines SSL. Contacts 160 may be electrically connected to the string selection lines SSL by connecting the contacts 160 to the uppermost gate 150 of the three gates 150 or the lowermost gate 150 through the uppermost and middle gates 150. Ground selection lines GSL may have a single-layer structure or a two-layer structure. The other structures of the semiconductor device 1d are substantially similar to the structures previously described in relation to the semiconductor device 1 shown in FIGS. 1A through 1G.

Referring to FIG. 1M, a semiconductor device 1e may include string selection lines SSL having a structure in which upper two layers are separate from a lower layer like the string selection lines SSL of the semiconductor device 1d. Upper two gates 150 may have the same or similar sizes. However, unlike the string selection lines SSL of the semiconductor device 1d of FIG. 1L, the lowermost gate 150 may be larger than the upper two gates 150. Two contacts 160 may be connected to of the string selection lines SSL, respectively. For example, the semiconductor device 1e may include contacts 160 connected to upper two-layer string selection lines SSL and lower single-layer string selection lines SSL, respectively. The contacts 160 may be connected to first intermediate metal lines 180 in a manner such that two contacts 160 are commonly connected to a first intermediate metal line 180. In another example, one contact 160 may be connected to one string selection line SSL like in the case shown in FIG. 1L.

Referring again to FIG. 1A, at least one of the selection lines SSL and GSL of the semiconductor device 1 may be configured by upper and lower layers which have the same or similar sizes and are commonly connected as one piece. Thus, the size of the semiconductor device 1 and the number of the contacts 160 may be reduced, and the process margin improved when the contacts 160 are formed. In the following description, the semiconductor device 1 will be compared with a semiconductor device 10 including string selection lines SSL0 and SSL1 and ground selection lines GSL0 and GSL1.

FIGS. 2A through 2C are cross-sectional views comparing the semiconductor device 1 previously described in relation to FIGS. 1A through 1G with another semiconductor device 10 having a different structure according to another embodiment of the inventive concept. FIG. 2B is a related plan view of semiconductor device 10 and semiconductor device.

Referring to FIG. 2A, in the semiconductor device 1, the string selection line SSL has a two-layer structure constituted by two layers having the same or similar sizes and connected as one piece, and the ground selection line GSL has a two-layer structure constituted by two layers having the same sizes or similar sizes and connected as one piece. The total area or size occupied by the pads 152 of the string selection line SSL and/or the ground selection line GSL can be reduced. When the area or size occupied by pads 152d of the semiconductor device 10 is compared with the area or size occupied by the pads 152 of the semiconductor device 1, it can be understood that the area or size occupied by the pads 152 of the semiconductor device 1 is markedly reduced. In this way, as compared with the semiconductor device 10, the size of the semiconductor device 1 may be reduced by the relative area "A" shown in FIG. 2A without reduction in the effective integration density of the semiconductor device 1. FIG. 2B further illustrates this outcome. In addition, since the number of pads 152 is reduced, the number of contacts 160 of the semiconductor device 1 (e.g., eight contacts 160) can also be reduced as compared with the number of contacts 160d used by the semiconductor device 10 (e.g., ten contacts 160d).

Referring to FIG. 2C, an etching depth T1 necessary to form a second contact hole H2 while maintaining a first contact hole H1 in an etch process for forming contact holes in the semiconductor device 10 is greater than an etch depth T2 necessary for the semiconductor device 1. Thus, the small etch depth T2 can be ensured owing to an etch margin that allows a first contact hole H1 to penetrate the upper string selection line SSL0 and extend to the lower string selection line SSL1. In other words, when contact holes are formed, sufficient process margin may be ensured owing to the connected two-layer structure of the string selection lines SSL.

The descriptions given in relation to FIGS. 2A through 2C may be applied to the case where the string selection lines SSL of the semiconductor device 1 has a connected two-layer structure and the ground selection lines GSL of the semiconductor device 1 has a separate two-layer structure like in the semiconductor device 10, or the case where the string selection lines SSL of the semiconductor device 1 have a separate two-layer structure like in the semiconductor device 10 and the ground selection lines GSL of the semiconductor device 1 has a connected two-layer structure. In addition, the descriptions given with reference to FIGS. 2A through 2C may also be applied to the three-layer string selection lines SSL shown in FIGS. 1K through 1M.

Figure 3B:
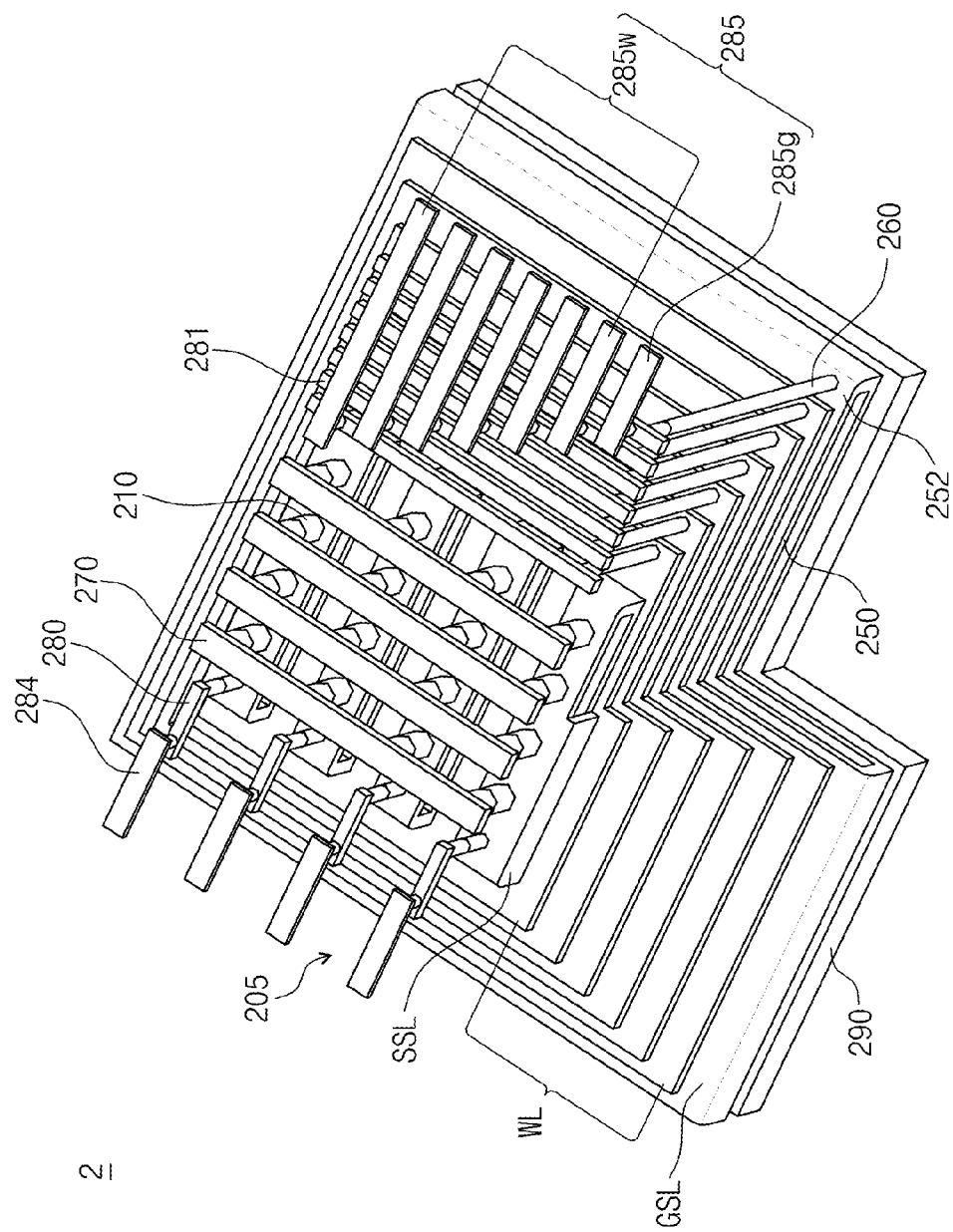

FIGS. 3A and 3B are perspective view illustrating a semiconductor device according to another embodiment of the inventive concept.

Referring to FIGS. 3A and 3B, a semiconductor device 2 may include a pyramid-shaped gate stack 205. The gate stack 205 may include a plurality of gates 250 which are vertically stacked along the extension direction of a plurality of vertical channels 210 provided on a semiconductor substrate 290. In another example, the gate stack 205 may have a stair shape at its both sides like that shown in FIG. 1H or at its one side like that shown in FIG. 1I. The gates 250 may be stacked in a stair shape so that exposed parts of the gates 250 can be used as pads 252. The semiconductor device 2 may include a plurality of contacts 260 connected to the pads 252, a plurality of first metal lines 284 and a plurality of second metal lines 285 electrically connected to the contacts 260 to electrically connect the gates 250 to driving circuits, and a plurality of bit lines 270 electrically connected to the vertical channels 210. A plurality of first intermediate metal lines 280 and a plurality of second intermediate metal lines 281 may be disposed between the metal lines 284 and 285 and the contacts 260.

The gates 250 may constitute string selection lines SSL, word lines WL, and ground selection lines GSL in a direction from upper side to lower side. The lines SSL, WL, and GSL may be electrically connected in series along a vertical channel 210 to form a cell string. The gates 250 constituting the string selection lines SSL or the gates 250 constituting the ground selection lines GSL may have a line shape, and the others may have a plate shape. Alternatively, all the gates 250 constituting the string selection lines SSL and the ground selection lines GSL may have a line shape. As an example, the gate 250 constituting the string selection lines SSL may have a two-layer, line-shaped structure in which upper and lower layers having the same size or similar sizes are connected as one piece; the gates 250 constituting the ground selection lines GSL may have a two-layer, rectangular plate structure in which upper and lower layers having the same size or similar sizes are connected as one piece; and the gates 250 constituting the word lines WL may have a single-layer rectangular plate structure. In another example, the string selection lines SSL may have a three-layer structure as shown in FIGS. 1K through 1M.

The contacts 260 connected to the string selection lines SSL may be connected to the first metal lines 284 through pads 262, or the contacts 260 may be connected to the first intermediate metal lines 280 connected to the first metal lines 284 through pads 282, so as to electrically connect the string selection lines SSL to one or more string selection line driving circuits. The contacts 260 connected to the word lines WL and the ground selection lines GSL may be connected to the second metal lines 285 through pads 262, or the contacts 260 may be connected to the second intermediate metal lines 281 which are connected to the second metal lines 285 through pads 283, so as to connect the ground selection lines GSL to one or more ground selection line driving circuits and the word lines WL to one or more word line driving circuits. The second metal lines 285 may include metal lines 285g connecting the ground selection lines GSL to the ground selection line driving circuit, and metal lines 285w connecting the word lines WL to the word line driving circuit.

Figure 3C:
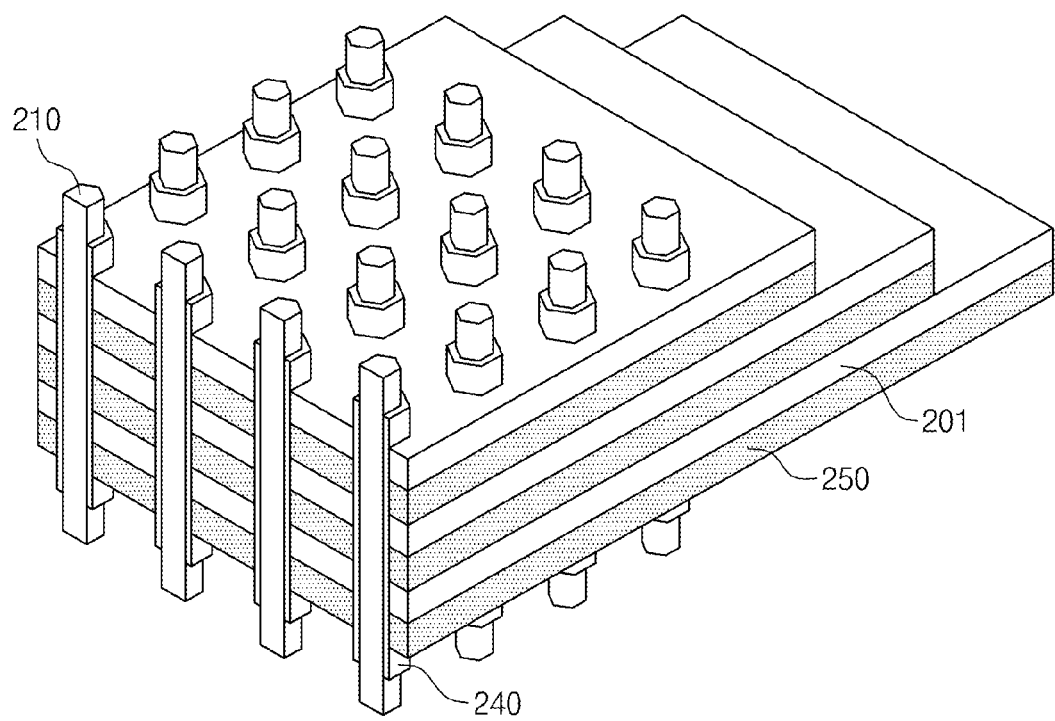
FIGS. 3C through 3E are partial enlarged views illustrating the semiconductor device of an embodiment of the inventive concept.
Figure 3D:
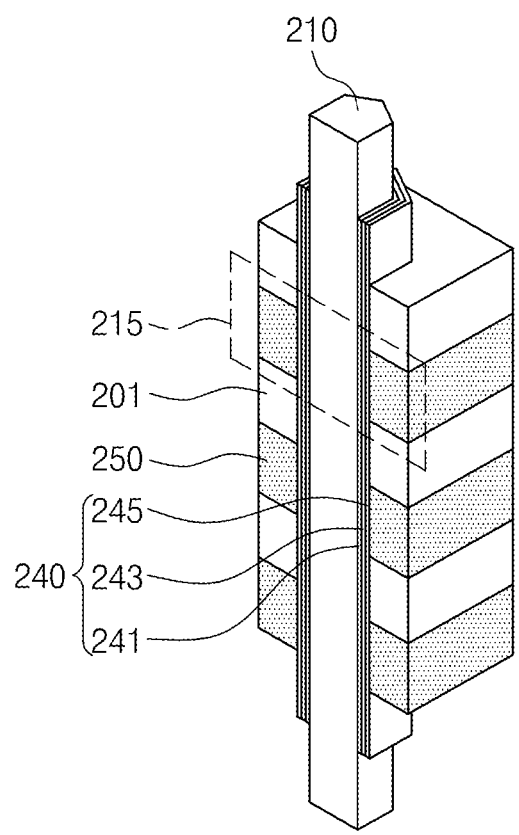
Figure 3E:
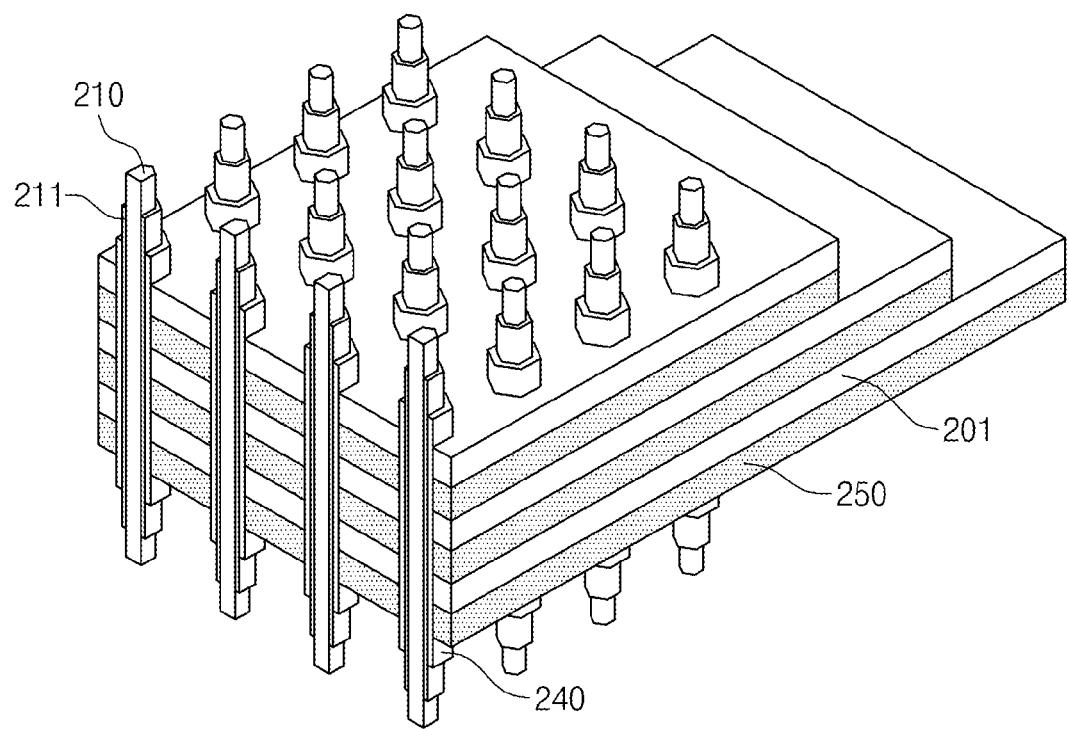

FIGS. 3C through 3E are partial enlarged views further illustrating the semiconductor device 2 shown in FIGS. 3A and 3B.

Referring to FIGS. 3C and 3D, insulating layers 201 may be disposed between the gates 250, and information storage layers 240 may extend vertically along the sidewalls of the vertical channels 210 in the length direction of the vertical channels 210. The information storage layers 240 may comprise a tunnel insulating layer 241, a charge storage layer 243, and a blocking insulating layer 245 are sequentially stacked on the sidewall of the vertical channel 210. The gates 250 may be connected in series along the extension direction of the vertical channels 210 to form memory cells 215.

Referring to FIG. 3E, the vertical channels 210 may have a macaroni structure filled with an insulator 211 so that the vertical channels 210 can be thinner for reducing carrier trap sites.

FIGS. 4A through 4G are perspective views explaining one possible method of fabricating a semiconductor device according to an embodiment of the inventive concept.

Figure 4A:
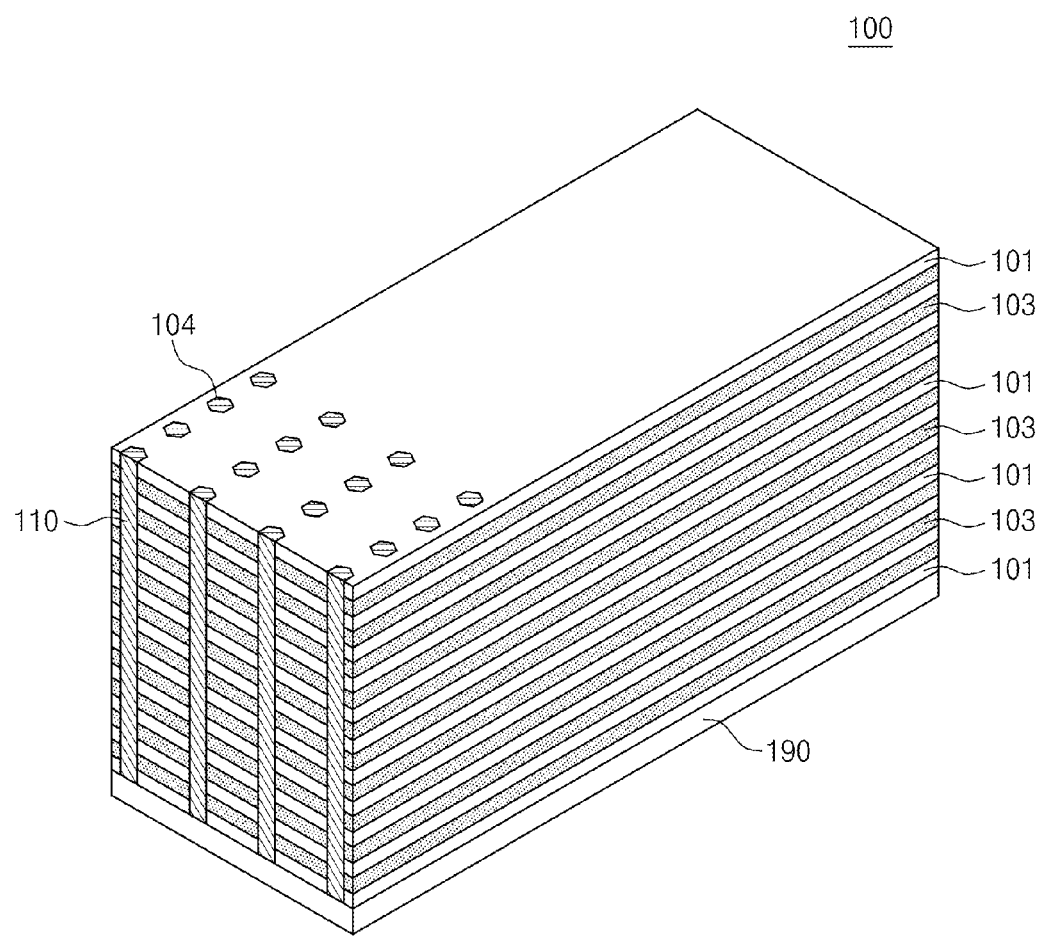
FIGS. 4A through 4G are perspective views for explaining a method of fabricating a semiconductor device according to an embodiment of the inventive concept.

Referring to FIG. 4A, a mold stack 100 may be disposed on a semiconductor substrate 190, and a plurality of channel holes 104 may be formed through the mold stack 100 to expose the top surface of the semiconductor substrate 190. The semiconductor substrate 190 may be formed of a semiconductor material. For example, the semiconductor substrate 190 may be a silicon wafer or a silicon-on-insulator (SOI) substrate. The mold stack 100 may include a plurality of insulating layers 101 and a plurality of sacrificial layers 103 that are alternately stacked. The uppermost layer of the mold stack 100 may be the insulating layer 101. The insulating layers 101 and the sacrificial layers 103 may be formed of materials having an etch selectivity. For example, the insulating layers 101 may be silicon oxide layers or silicon nitride layers, and the sacrificial layers 103 may be silicon layers, silicon oxide layers, silicon nitride layers, or silicon carbide layers which are different from the insulating layers 101. In the illustrated embodiment, the insulating layers 101 may be silicon oxide layers, and the sacrificial layers 103 may be silicon nitride layers.

Figure 4B:
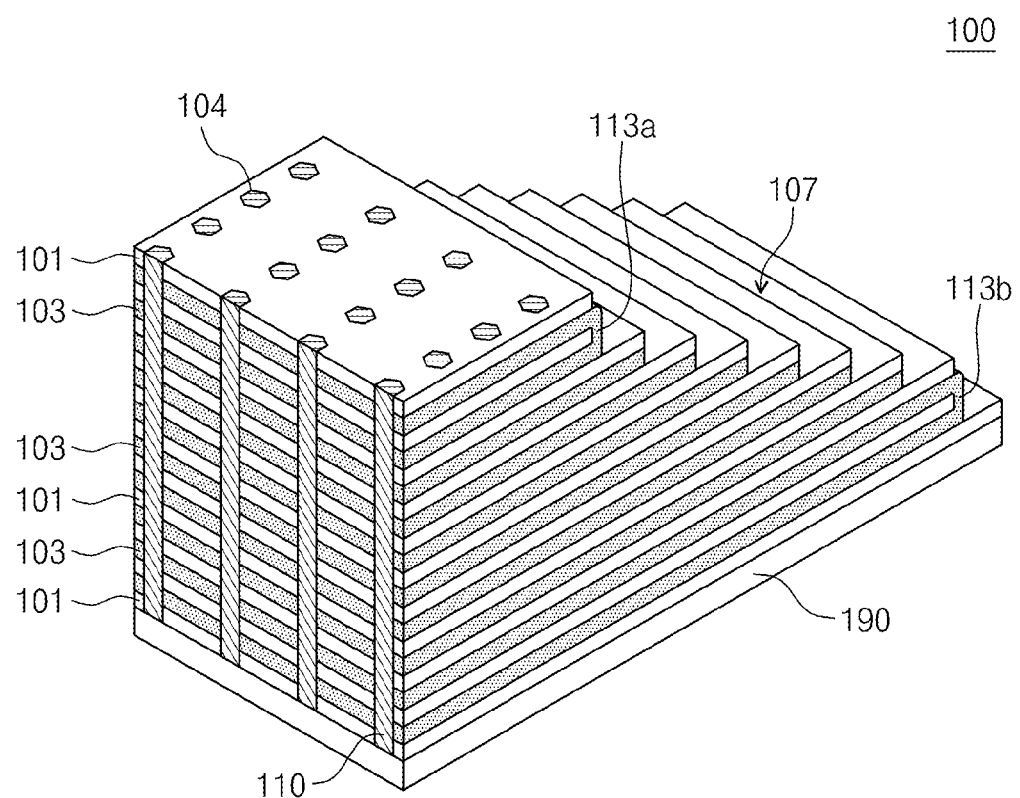

Referring to FIG. 4B, a plurality of vertical channels 110 may be disposed in the channel holes 104 so that the vertical channels 110 can be connected to the semiconductor substrate 190. For example, the vertical channels 110 may be formed of a semiconductor material by epitaxial growth or chemical vapor deposition. The vertical channels 110 may have one of a polycrystalline structure, a single crystalline structure, and an amorphous structure. The vertical channels 110 may have a bulk structure as shown in FIG. 1C or a macaroni structure as shown in FIG. 1E.

After the channel forming process, a step patterning process may be performed. For example, the mold stack 100 may be patterned in a stair shape to form a stair structure 107. As illustrated in FIG. 4B, a single side of the mold stack 100 may be patterned to form the stair structure 107. However, the inventive concept is not limited to only this particular approach. For example, the stair structure 107 may be formed from all four sides, or opposing sides of the mold stack 100.

In the step patterning process, a first sacrificial spacer 113a may be formed to structurally connect the uppermost sacrificial layer 103 and the next sacrificial layer 103 directly under the uppermost sacrificial layer 103. Alternatively, a second sacrificial spacer 113b may also be formed to structurally connect the lowermost sacrificial layer 103 and the next sacrificial layer 103 directly above the lowermost sacrificial layer 103. The stair structure 107 may be formed by etching the mold stack 100 sequentially. The etch process may be performed by trimming a mask sequentially (trim process described later) or enlarging a mask sequentially (attach process described later).

Figure 4C:
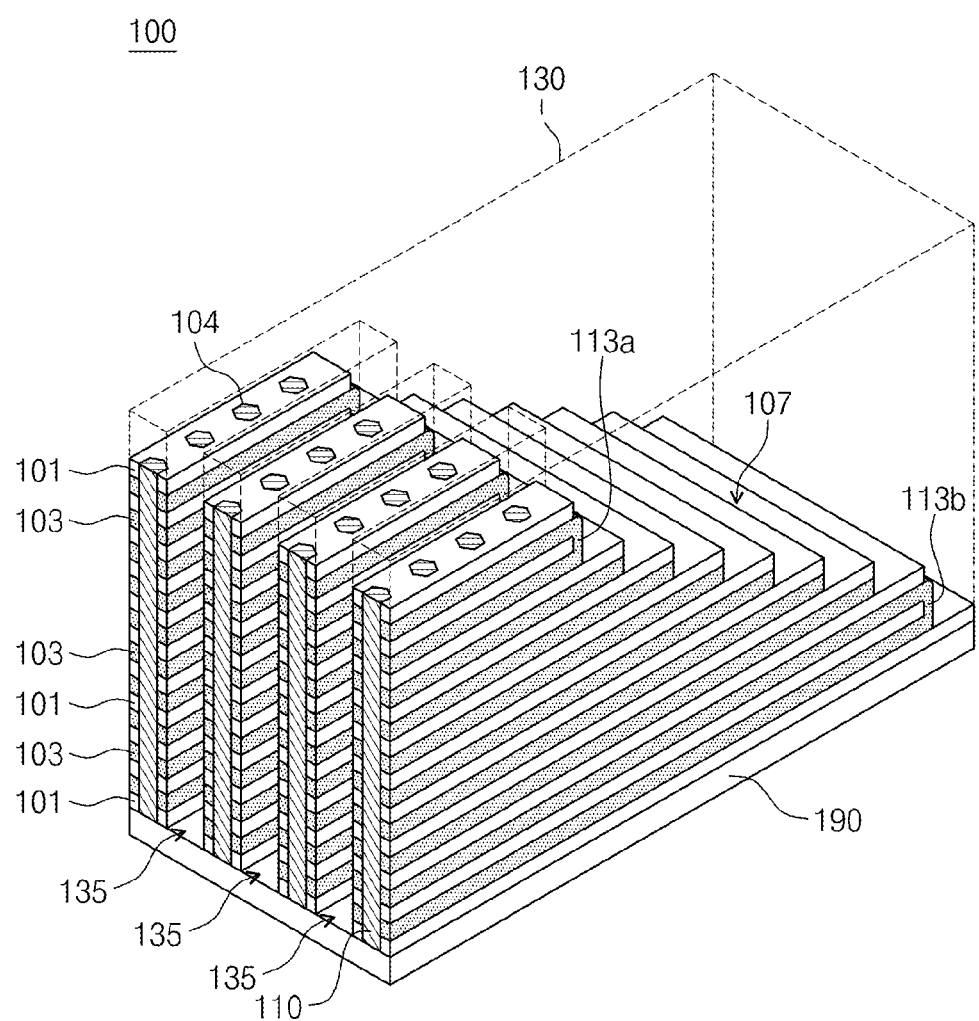

Refer to FIG. 4C, a plurality of word line cuts 135 may be formed. For example, an insulating layer 130 may be disposed on the mold stack 100, and the insulating layer 130 and the mold stack 100 may be patterned by anisotropic etching to form the word line cuts 135 through which the semiconductor substrate 190 or the lowermost insulating layer 101 are exposed. At this time, the word line cuts 135 may be formed in a manner such that the uppermost insulating and sacrificial layers 101 and 103, and the next insulating and sacrificial layers 101 and 103 directly under the uppermost insulating and sacrificial layers 101 and 103 have a line shape.

Figure 4D:
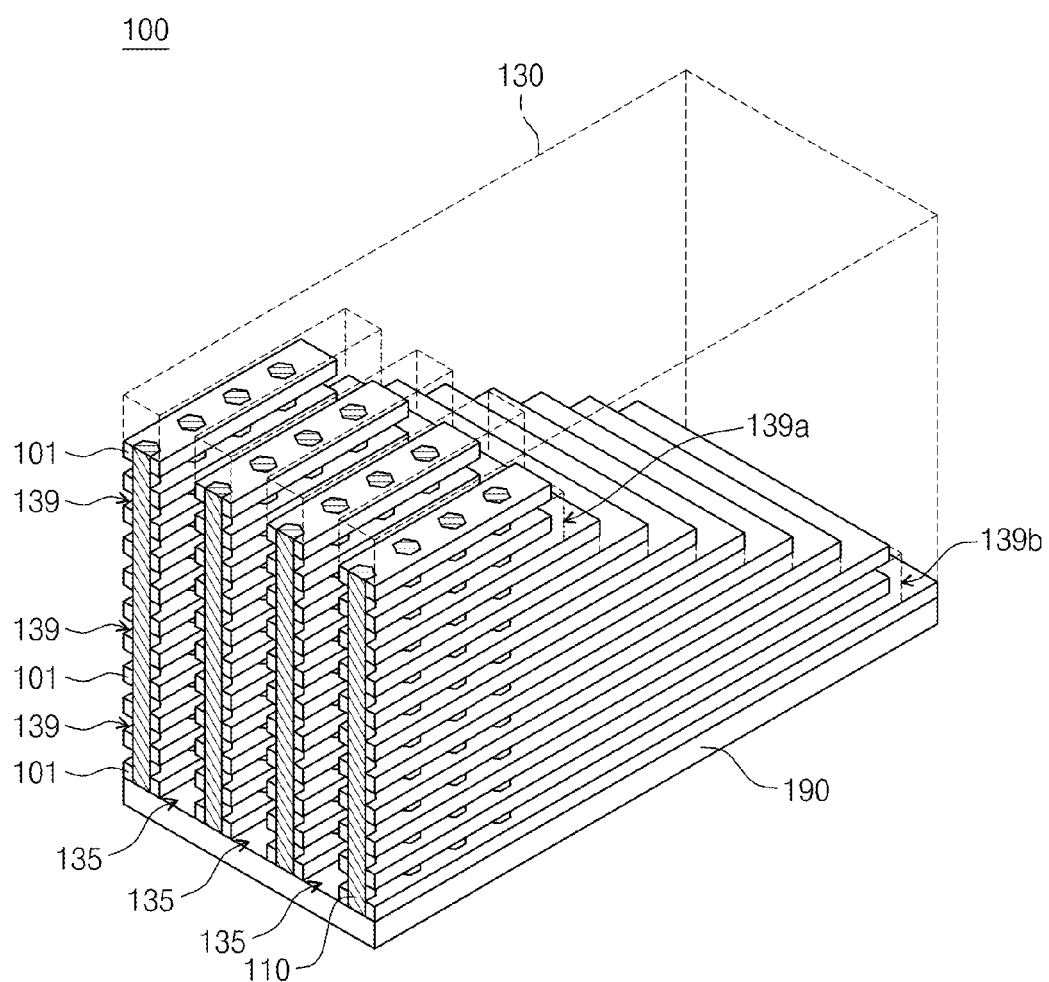

Referring to FIG. 4D, an isotropic etch process may be performed using an etchant by which the sacrificial layers 103 can be selectively removed so as to form recess regions 139 between the insulating layers 101. For example, if the insulating layers 101 are silicon oxide layers and the sacrificial layers 103 are silicon nitride layers, an etchant containing a phosphoric acid may be supplied through the word line cuts 135 to remove the sacrificial layers 103. The first sacrificial spacer 113a and the second sacrificial spacer 113b may be removed together with the sacrificial layers 103 to form first spacer regions 139a and a second spacer region 139b.

Figure 4E:
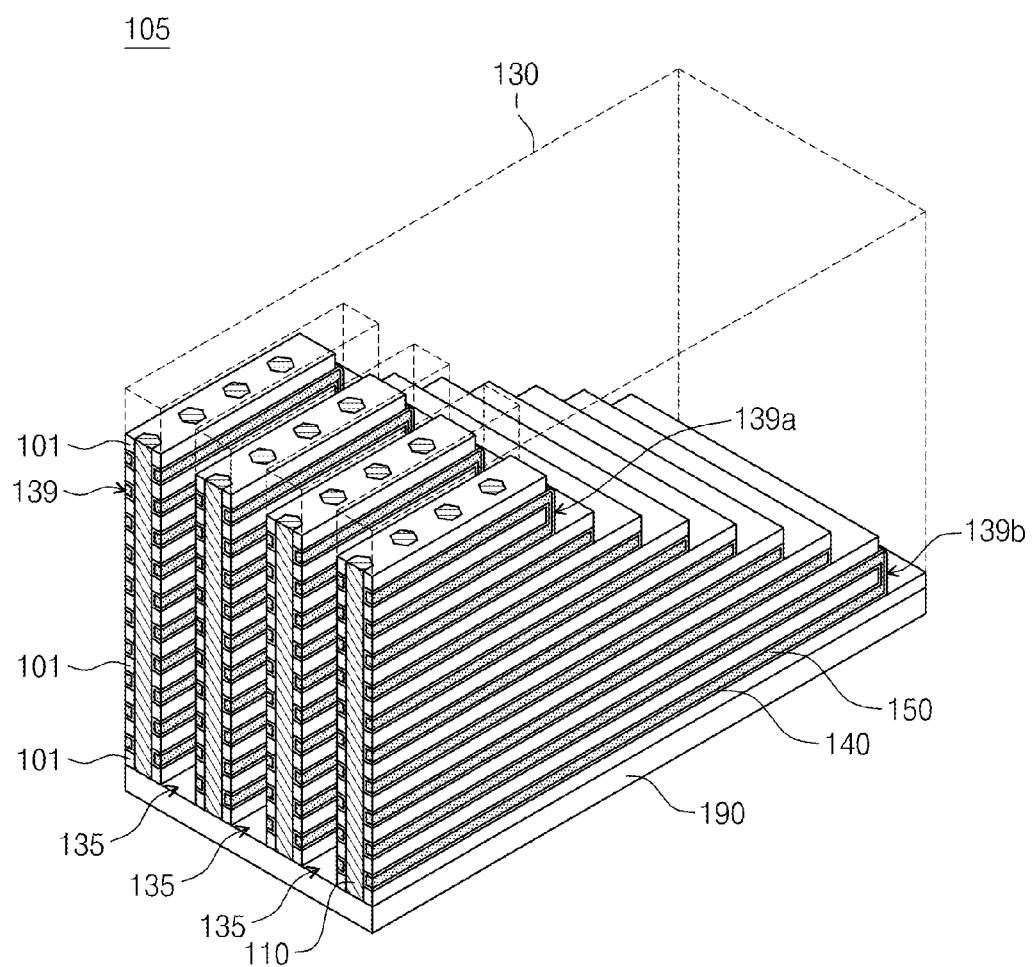

Referring to FIG. 4E, a gate stack 105 having a stair structure may be formed by sequentially forming information storage layers 140 and gates 150 in the recess regions 139 and the spacer regions 139a and 139b. For example, the information storage layers 140 may be formed through a deposition process having good step coverage characteristics (e.g., a chemical vapor deposition (CVD) process or atomic layer deposition (ALD) process) so that the information storage layers 140 may cover the recess regions 139 with a small and substantially uniform thickness.

As shown in the foregoing exemplary embodiments, the information storage layers 140 may include tunnel insulating layers 141, charge storage layers 143, and blocking insulating layers 145. The tunnel insulating layers 141 may include at least one of a silicon oxide layer and a silicon nitride layer, and the blocking insulating layers 145 may include at least one of a silicon oxide layer, a silicon nitride layer, and an aluminum oxide layer. The charge storage layers 143 may be insulating layers including trap insulating layers, floating gates, or insulating layers comprising conductive nano-dots. For example, the tunnel insulating layers 141 may include a silicon oxide layer, the blocking insulating layers 145 may include a silicon oxide layer or aluminum oxide layer, and the charge storage layers 143 may include a silicon nitride layer.

The gates 150 may fill the recess regions 139 and the spacer regions 139a and 139b covered with the information storage layers 140. For example, the gates 150 may be formed by filling a conductive material in the recess regions 139 and the spacer regions 139a and 139b and the word line cuts 135, and by selectively removing the conductive material filled in the word line cuts 135 using an anisotropic etching. The gates 150 may be vertically spaced by the insulating layers 101 and have a vertically stacked stair shape. The gates 150 may include at least one of doped silicon, tungsten, a metal nitride layer, and metal silicide layer. For example, the gates 150 may be formed of tungsten, titanium nitride, or a combination thereof.

In the illustrated embodiment, since the gates 150 are formed through a replacement process by filling a material in the recess regions 139, various materials can be used for forming the gates 150. If the gates 150 are formed not by the replacement process, it may be difficult to form the gates 150 of metal material. For example, if the mold stack 100 is formed of insulating layers and metal layers, it may be difficult to form the vertical channels 110 or the stair structure 107 in a desired shape.

The uppermost gate 150 and the next gate 150 directly under the uppermost gate 150 may be vertically connected as one piece to form a two-layer structure. Similarly, the lowermost gate 150 and the next gate 150 directly above the lowermost gate 150 may be vertically connected as one piece to form a two-layer structure.

Figure 4F:
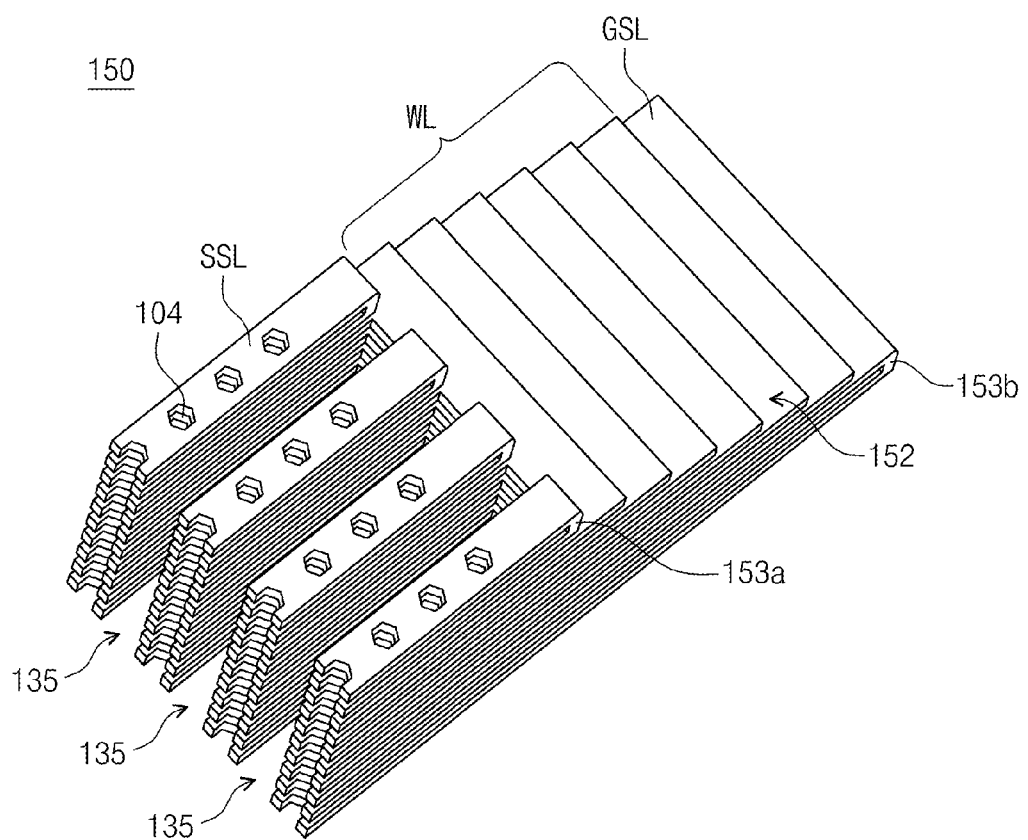

Referring to FIG. 4F, the gates 150 may have a stair shape, and pads 152 may be defined at the gates 150, respectively. Exposed parts of the gates 150 not covered with upper neighboring gates 150 are defined as the pads 152. Contacts 160 (refer to FIG. 4G) may be connected to the pads 152 in a later process. As shown in FIG. 5E, the widths or areas of the pads 152 may be affected by the reduction amount of a mask. The uppermost gate 150 and the next gate 150 directly under the uppermost gate 150 may be vertically connected to each other by a first spacer gate 153a to form a two-layer line-shaped string selection line SSL. The first spacer gate 153a may be formed through a replacement process by filling the first spacer region 139a (refer to FIG. 4D) with a conductive material. The lowermost gate 150 and the next gate 150 directly above the lowermost gate 150 may be vertically connected to each other by a second spacer gate 153b to form a two-layer line-shaped ground selection line GSL. The second spacer gate 153b may be formed through a replacement process by filling the second spacer region 139b (refer to FIG. 4D) with a conductive material. The other gates 150 may constitute word lines WL having a single-layer plate structure. The string selection lines SSL may have a line shape divided by the word line cuts 135, and the word lines WL and the ground selection line GSL may have a plate shape including branches separated by the word line cuts 135. The width or area of the pads 152 of the string selection lines SSL may be increased due to the first spacer gates 153a. Similarly, the width or area of the pad 152 of the ground selection lines GSL may be increased by the second spacer gate 153b.

Figure 4G:
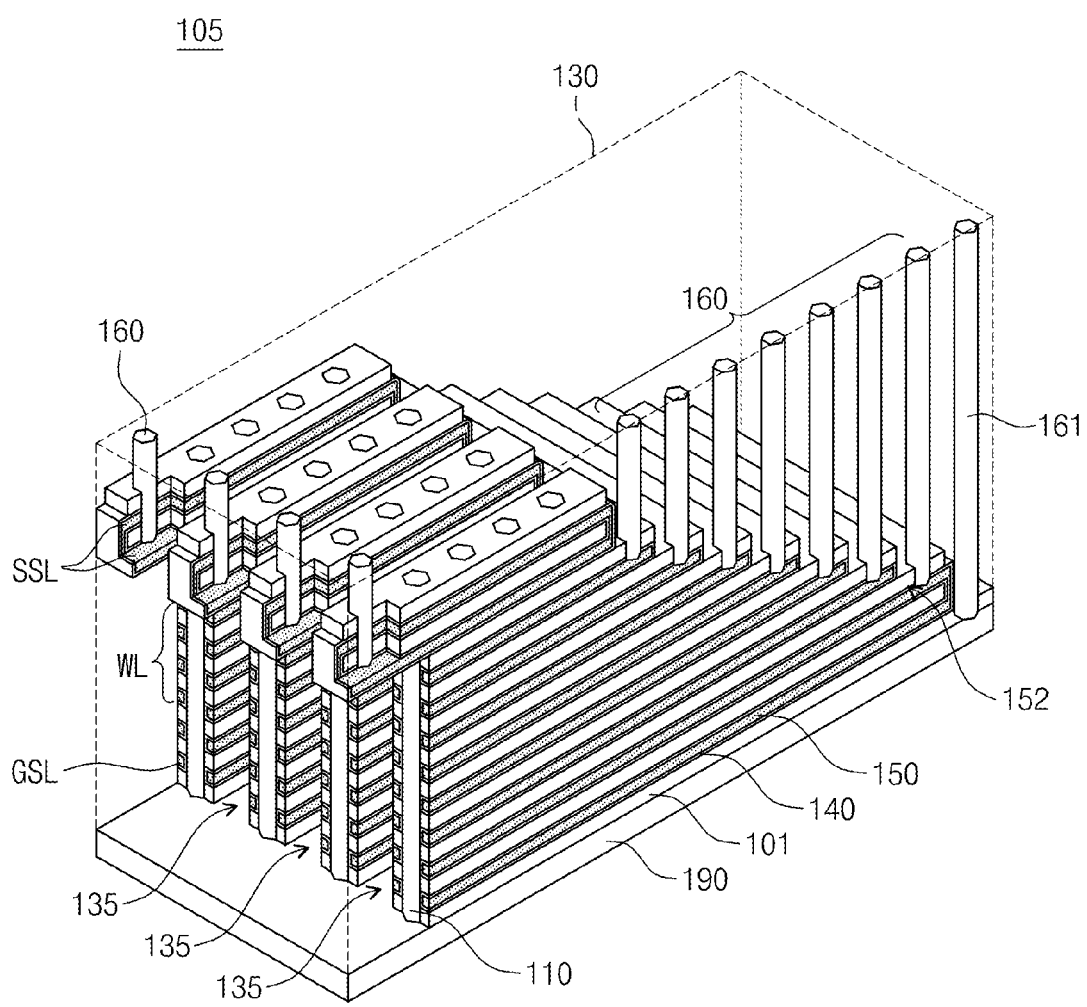

Referring to FIG. 4G, the word line cuts 135 may be filled with an insulator, and a plurality of contacts 160 may be formed through the insulating layer 130 in a manner such that the contacts 160 are connected to the pads 152 of the gates 150. Alternatively, a contact 161 may be further formed so that the contact 161 can be connected to a common source line disposed at the semiconductor substrate 190. In FIG. 4G, it is shown that the string selection lines SSL protrude from the other lines WL and GSL for giving a clear understanding of the structure. To form the contacts 160 and 161, the insulating layer 130 may be patterned to form a plurality of contact holes through which the pads 152 of the gates 150 and the semiconductor substrate 190 are exposed. In this case, since the contacts 160 and 161 have different depths, a process error may be generated. This will be explained in some additional detail with reference to FIGS. 4H and 4I.

Figure 4H:
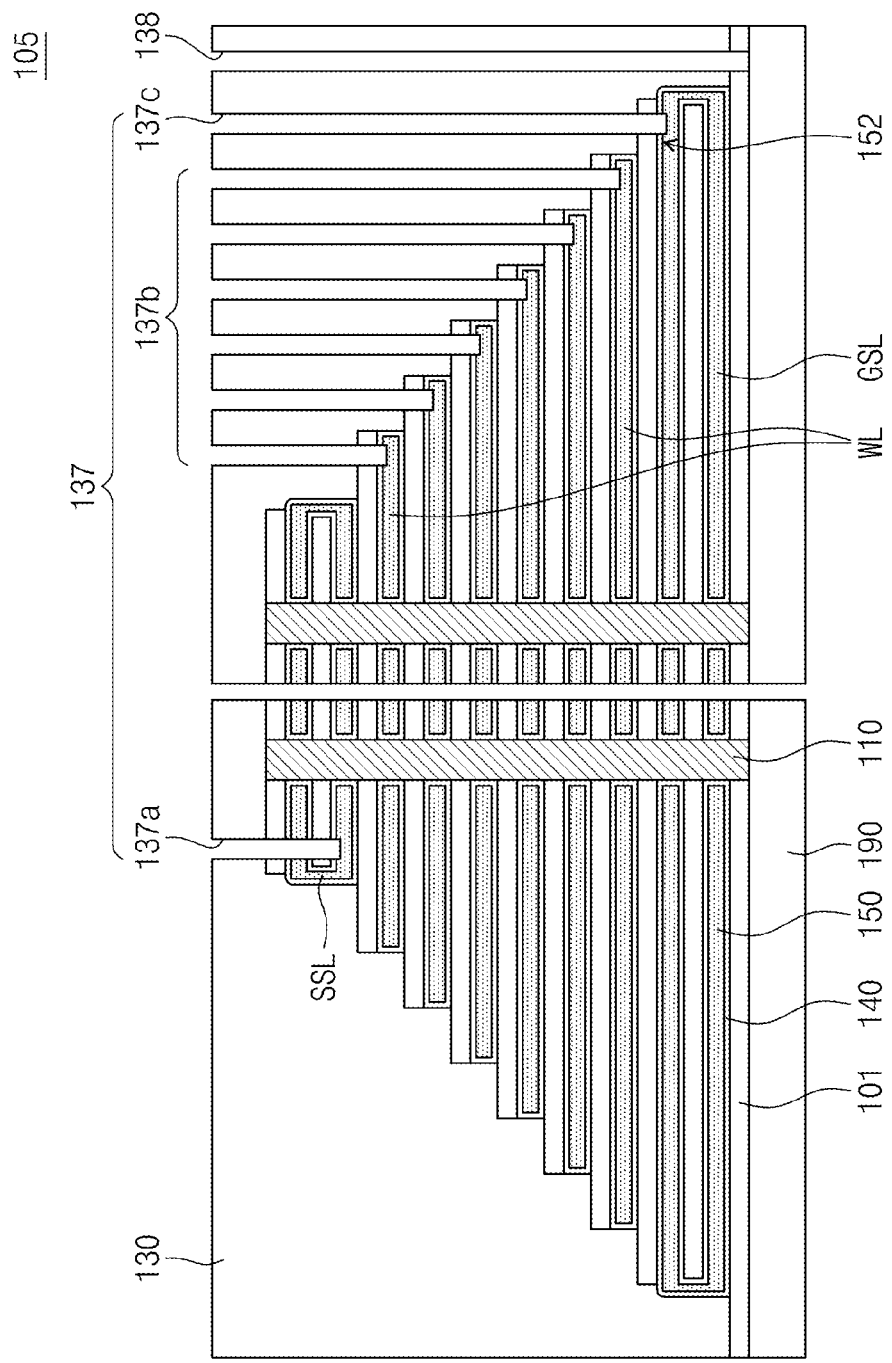
FIGS. 4H and 4I are sectional views for explaining the semiconductor device fabricating method of an embodiment of the inventive concept.
Figure 4I:
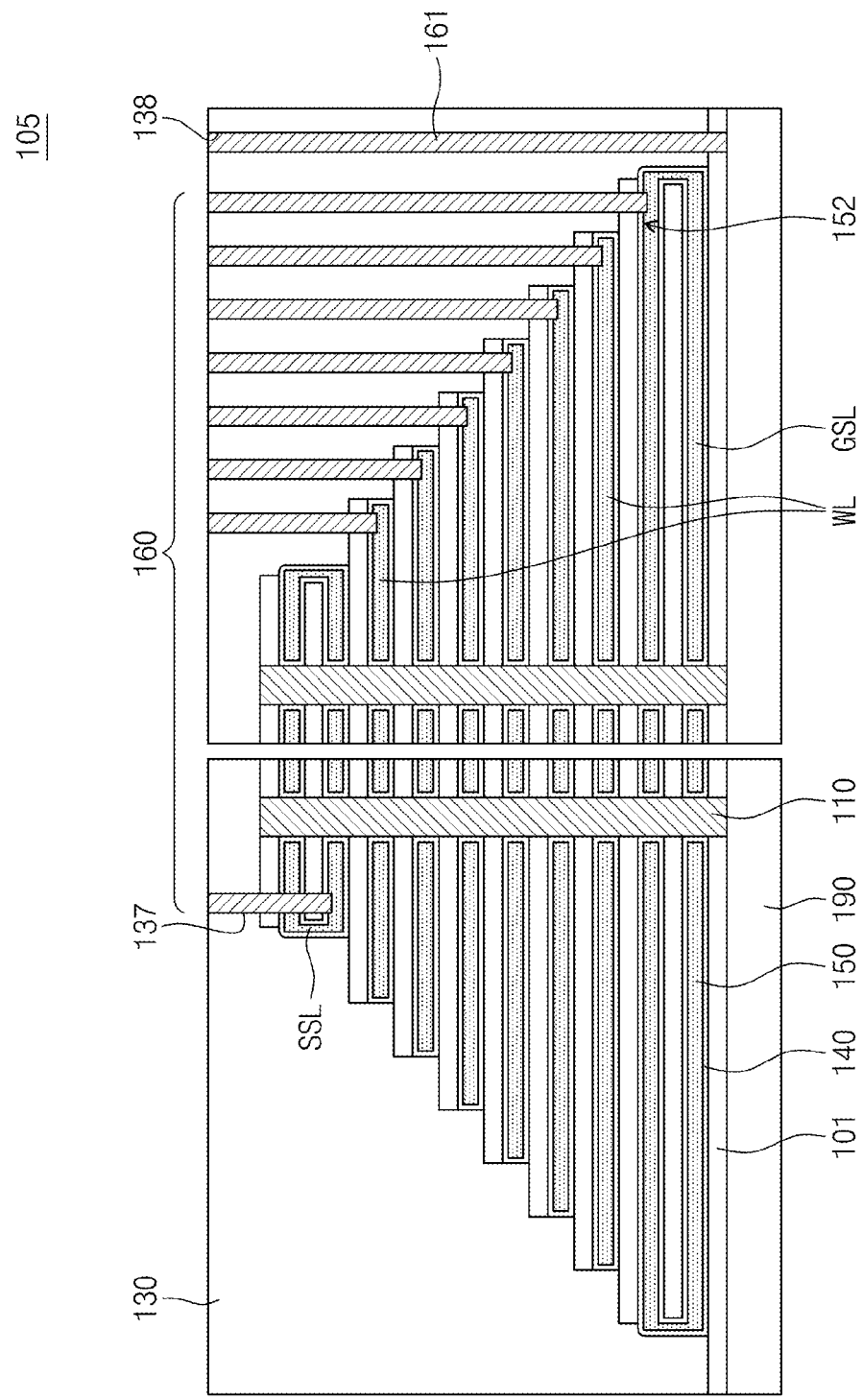

FIGS. 4H and 4I are sectional views further explaining the method described in relation to FIG. 4A through FIG. 4G. In FIGS. 4H and 4I, stair structures are shown at both sides of the gate stack 105 for providing a more complete understanding.

Referring to FIG. 4H, a plurality of contact holes 137 may be formed to expose the pads 152 of the gates 150 by patterning the insulation layer 130, for example, by an anisotropic etching process. By-products may remain in the contact holes 137. These by-products may be removed by an isotropic or anisotropic etching process. For clarity of the description, the contact holes 137 are classified into a first contact hole 137a through which the string selection line SSL are exposed, second contact holes 137b through which the word lines WL are exposed, and a third contact hole 137c through which the ground selection line GSL is exposed. Since the gates 150 are patterned in a stair shape, the depths of the contact holes 137 may be different. For example, the first contact hole 137a may be shallowest, and the third contact hole 137c may be deepest. Accordingly, while the third contact hole 137c is being formed, the first contact hole 173a may penetrate the uppermost gate 150 and extend to another gate 150 constituting the word line WL. When a contact is formed in the first contact hole 137a that has been undesirably deepened by over-etching, vertically adjacent gates 150 that has to be electrically insulated may be shorted. Although some of the contact holes 137 are formed separately, the over-etching may not be fundamentally prevented. The over-etching may be more serious when the number of the gates 150 increases and/or a fourth contact hole 138 is formed to expose the semiconductor substrate 190.

However, according to the illustrated embodiments, since the string selection line SSL are vertically connected in a two-layer structure, a sufficient etch margin can be ensured so that the first contact hole 137a may be allowed to penetrate the uppermost gate 150 and extend to the next gate 150 directly under the uppermost gate 150. In addition, the information storage layers 140 may function as etch stop layers. For example, as explained with reference to FIG. 4E, the information storage layers 140 may include silicon oxide layers or aluminum oxide layers as the blocking insulating layers 145. In this case, over-etching can be further prevented owing to the blocking insulating layers 145.

Referring to FIG. 4I, a plurality of contacts 160 connected to the gates 150 may be formed by filling the contact holes 137 with a conductive material such as copper or tungsten. A contact 161 connected to the semiconductor substrate 190 may be further formed. Then, the semiconductor device 1 shown in FIG. 1A may be formed by forming other elements such as bit lines connected to the vertical channels 110 and metal lines connected to the contacts 160.

FIGS. 5A through 5K are related sectional views explaining a trim process according to a method of fabricating a semiconductor device according to an embodiment of the inventive concept.

Figure 5A:
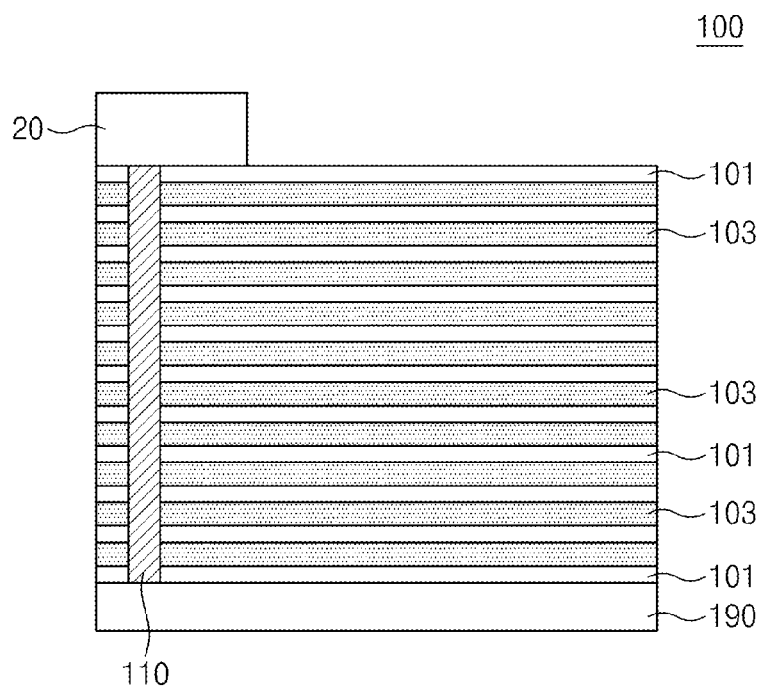
FIGS. 5A through 5K are sectional views for explaining a trim process in a method of fabricating a semiconductor device according to an embodiment of the inventive concept.

Referring to FIG. 5A, a first mask 20 may be formed on a mold stack 100. The first mask 20 may be formed by depositing a material having an etch selectivity with respect to insulating layers 101 and sacrificial layers 103, such as photoresist, and patterning the deposited photoresist. In the current embodiment, the first mask 20 may have a size suitable for forming an uppermost step.

Figure 5B:
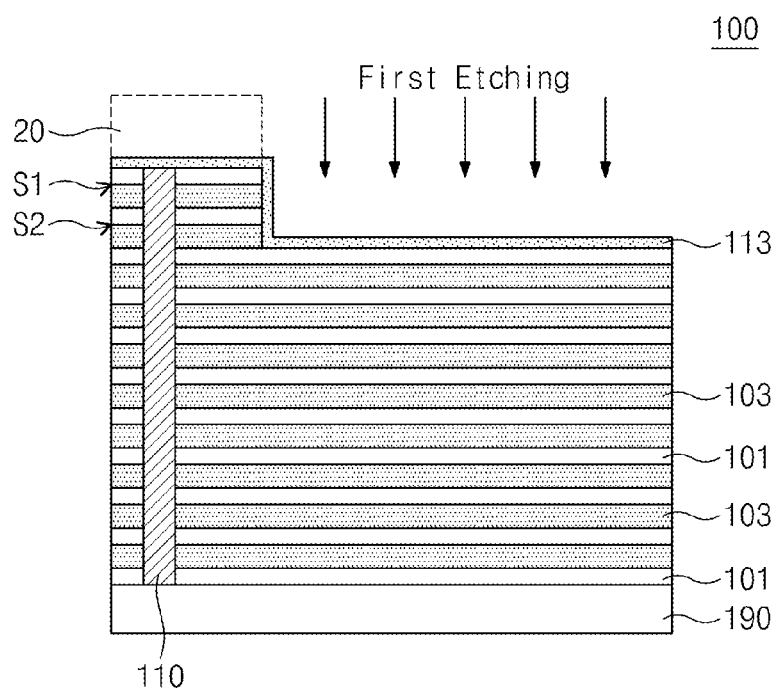

Referring to FIG. 5B, the mold stack 100 may be anisotropically etched through a first etch process by using the first mask 20 to pattern the uppermost insulating and sacrificial layers 101 and 103, and the next insulating and sacrificial layers 101 and 103 directly under the uppermost insulating and sacrificial layers 101 and 103. As a result, a first step S1 may be formed by the patterned uppermost insulating layer 101 and sacrificial layer 103, and a second step S2 may be formed by the patterned next insulating layer 101 and sacrificial layer 103. In the present embodiment, the first step S1 and the second step S2 may have the same shape or size. That is, the first and second steps S1 and S2 may not form a stair shape.

Next, the first mask 20 may be removed, and a sacrificial spacer layer 113 may be formed on the mold stack 100 where the first and second steps S1 and S2 are formed. The sacrificial spacer layer 113 may be formed by depositing the same or similar material as that used for forming the sacrificial layers 103. For example, the sacrificial spacer layer 113 may be formed by depositing a material having the same composition or an etch selectivity as that of a material used for forming the sacrificial layers 103. According to an embodiment of the present invention, if the sacrificial layers 103 are formed of silicon oxide layers, the sacrificial spacer layer 113 may be formed of a silicon nitride layer.

Figure 5C:
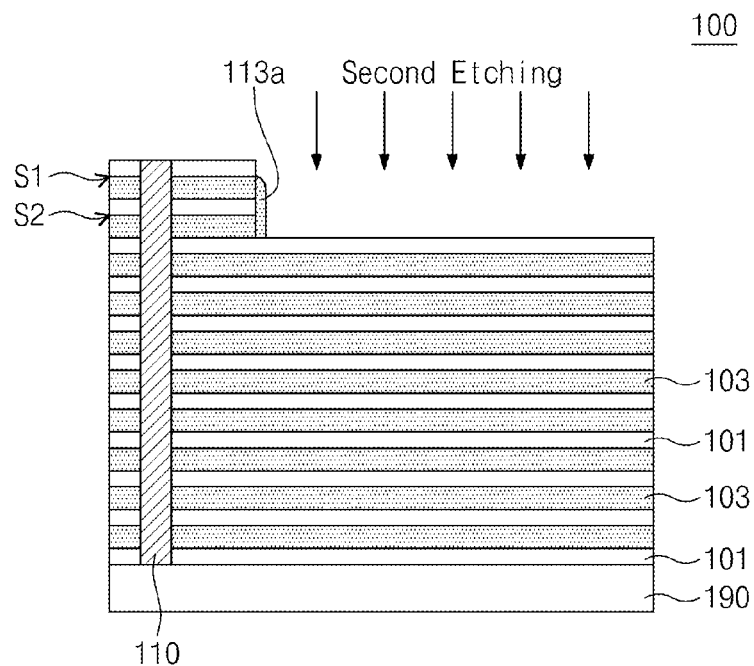

Referring to FIG. 5C, the sacrificial spacer layer 113 may be anisotropically etched through a second etch process to form a first sacrificial spacer 113a which is commonly contacted with lateral surfaces of the first and second steps S1 and S2. The first sacrificial spacer 113a may cover the lateral surfaces of the first and second steps S1 and S2. The first sacrificial spacer 113a may be formed at least on a side of the mold stack 100. For example, the first sacrificial spacer 113a may be formed on four sides, opposite two sides, or a side of the mold stack 100.

Figure 5D:
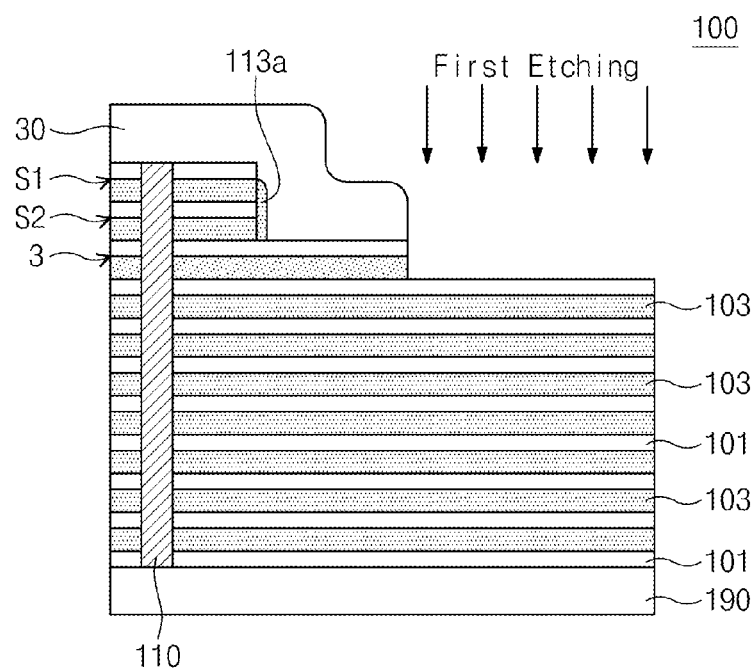
Figure 5E:
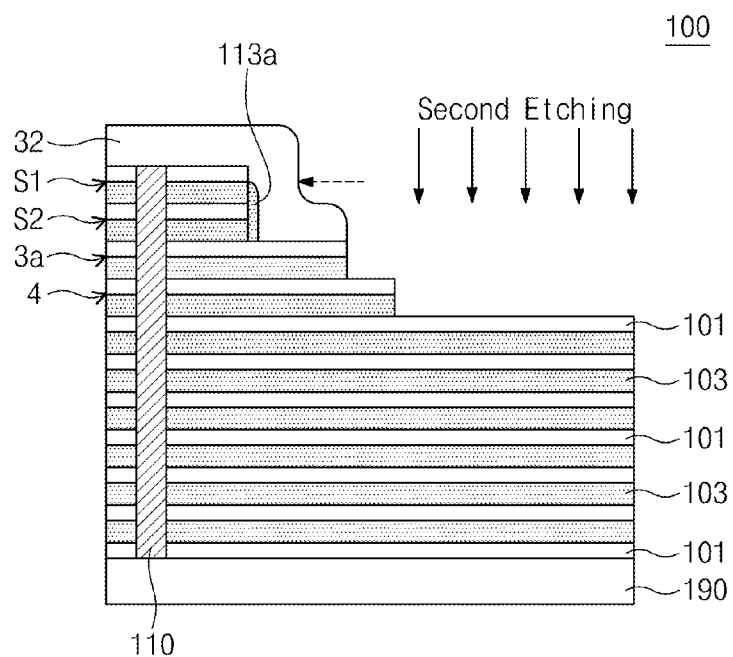

Referring to FIG. 5D, a second mask 30 may be formed by depositing a photoresist on the mold stack 100 where the first and second steps S1 and S2 are formed and patterning the deposited photoresist. Since the size of the second mask 30 is reduced in the trim process, the size of the second mask 30 may be determined according to the amount of reduction and the number of steps to be formed. The insulating layer 101 and the sacrificial layer 103 disposed just below the second step S2 may be patterned through a first etch process using the second mask 30 so as to form a third pattern 3.

Referring to FIG. 5E, the second mask 30 may be first reduced by a first trim process to form a first-trimmed second mask 32, and the third pattern 3 may be further patterned through a second etch process using the first-trimmed second mask 32 so as to form a reduced third pattern 3a. In the second etch process, while the reduced third pattern 3a is formed, the insulating layer 101 and the sacrificial layer 103 not covered with the third pattern 3 may be patterned into a fourth pattern 4.

In the second etch process, the etched depth of the insulating layer 101 and the sacrificial layer 103 of the third pattern 3 may be equal or similar to the etched depth of the insulating layer 101 and the sacrificial layer 103 disposed just below the third pattern 3 for the perfection of the step patterning process. For example, the mold stack 100 may be formed in a manner such that the insulating layers 101 have the same thickness or similar thicknesses and the sacrificial layers 103 have the same thickness or similar thicknesses. The insulating layers 101 and the sacrificial layers 103 may have the same thickness or different thicknesses. According to the size difference between the second mask 30 and the first-trimmed second mask 32, the area or size of a pad 152 (refer to FIG. 4F) may be determined.

Figure 5F:
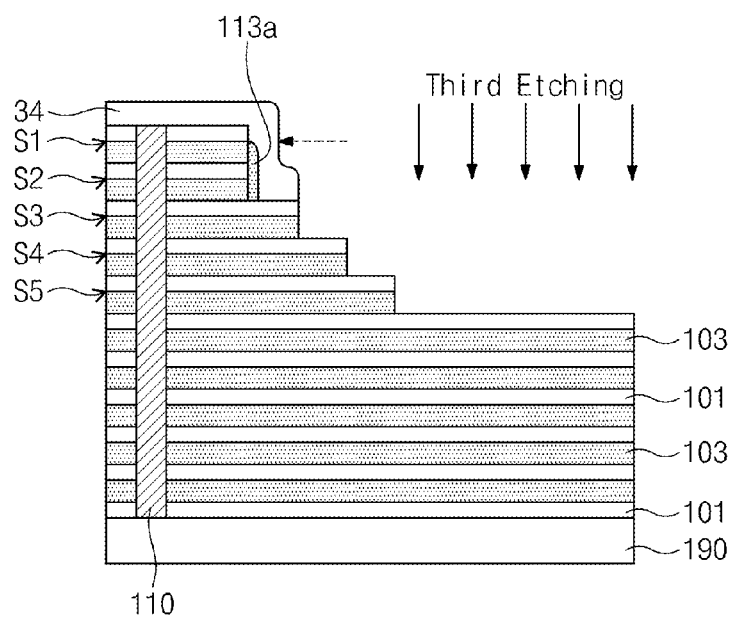

Referring to FIG. 5F, the first-trimmed second mask 32 may be second reduced by a second trim process to form a second-trimmed second mask 34, and the reduced third pattern 3a may be further patterned through a third etch process using the second-trimmed second mask 34 so as to form a third step S3. In the third etch process, while the third step S3 is formed, the fourth pattern 4 may be further patterned into a fourth step S4. Furthermore, in the third etch process, while the fourth step S4 is formed, the insulating layer 101 and the sacrificial layer 103 disposed just below the fourth pattern 4 may be patterned into a fifth pattern, that is, a fifth step S5.

Figure 5G:
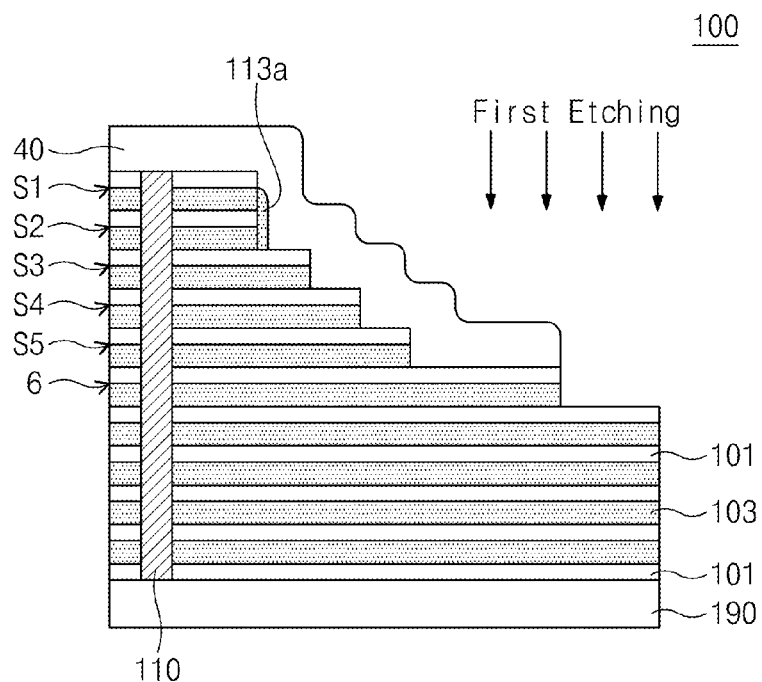

Referring to FIG. 5G, the second-trimmed second mask 34 may be removed, and a third mask 40 may be formed on the mold stack 100 where the first to fifth steps S1 to S5 are formed. The insulating layer 101 and the sacrificial layer 103 disposed just below the fifth step S5 may be patterned through a first etch process using the third mask 40 so as to form a sixth pattern 6.

Figure 5H:
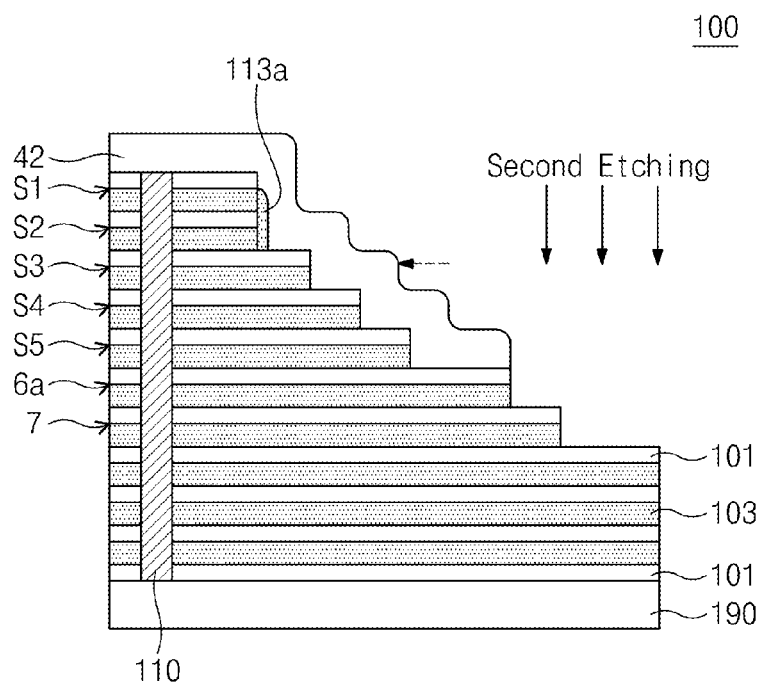

Referring to FIG. 5H, the third mask 40 may be initially reduced through a first trim process to form a first-trimmed third mask 42, and the sixth pattern 6 may be further patterned by a second etch process using the first-trimmed third mask 42 so as to form a reduced sixth pattern 6a. In the second etch process, while the reduced sixth pattern 6a is formed, the insulating layer 101 and the sacrificial layer 103 not covered with the sixth pattern 6 may also be patterned into a seventh pattern 7.

Figure 5I:
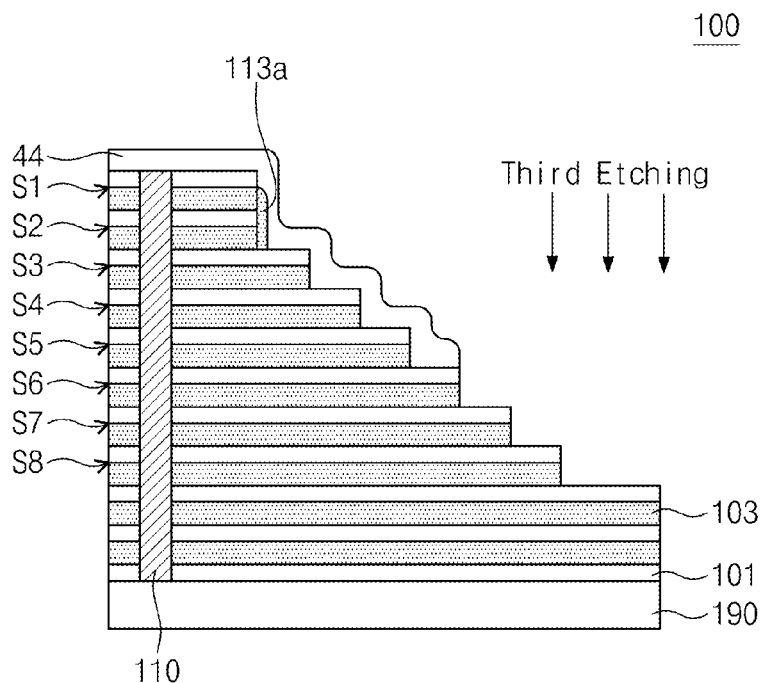

Referring to FIG. 5I, the first-trimmed third mask 42 may be additionally reduced by a second trim process to form a second-trimmed third mask 44, and the reduced sixth pattern 6a may be further patterned through a third etch process using the second-trimmed third mask 44 so as to form a sixth step S6. In the third etch process, while the sixth step S6 is formed, the seventh pattern 7 may be further patterned into a seventh step S7. Furthermore, in the third etch process, while the seventh step S7 is formed, the insulating layer 101 and the sacrificial layer 103 disposed just below the seventh pattern 7 may be patterned into a eighth pattern 8, that is, an eighth step S8.

Figure 5J:
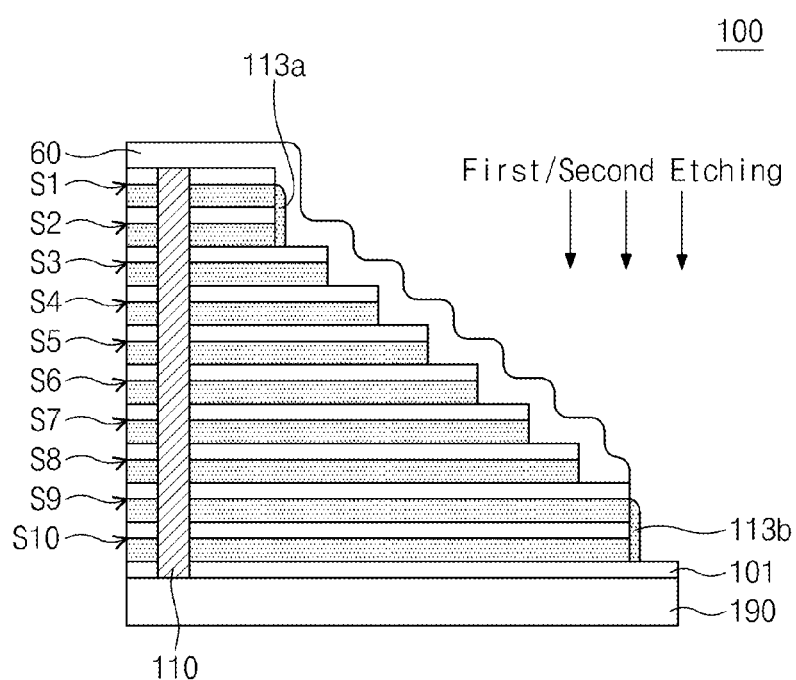

Referring to FIG. 5J, the second-trimmed third mask 44 may be removed, a fourth mask 60 may be formed on the mold stack 100 where the first to eighth steps S1 to S8 are formed. The insulating layer 101 and the sacrificial layer 103 disposed just below the eighth step S8, and the next insulating layer 101 and the sacrificial layer 103 may be patterned together through a first etch process using the fourth mask 60. As a result, a ninth step S9 and a tenth step S10 having the same size or shape may be simultaneously formed.

Next, a second sacrificial spacer 113b that makes contact with lateral surfaces of the ninth and tenth steps S9 and S10 may be formed through processes equal or similar to the processes explained with reference to FIGS. 5B and 5C. For example, the second sacrificial spacer 113b may be formed as follows: a material equal or similar to a material used for forming the sacrificial layers 103 may be deposited on the mold stack 100 covered with the fourth mask 60, and the deposited material may be patterned in a spacer shape through a second etch process.

Figure 5K:
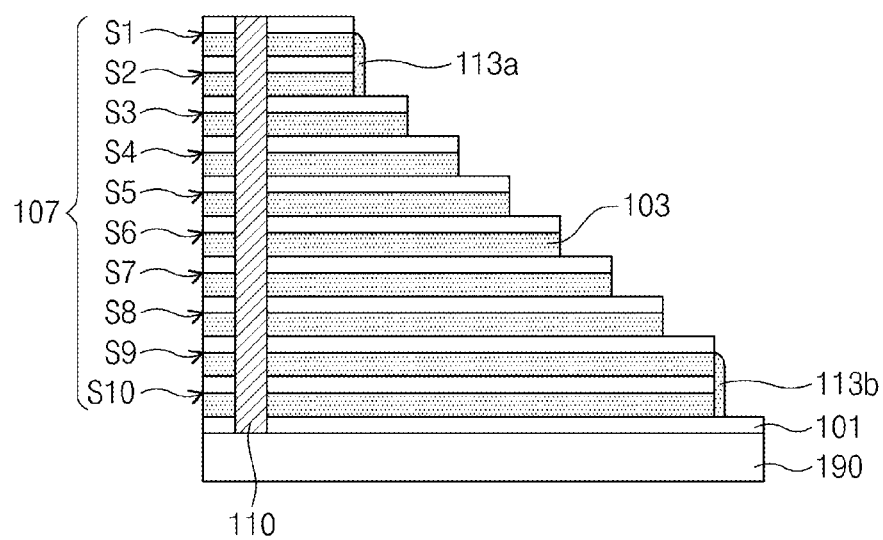

Referring to FIG. 5K, the fourth mask 60 may be removed using an ashing process to expose the mold stack 100. The mold stack 100 may have a stair structure 107 in which the first sacrificial spacer 113a is attached to the lateral surfaces of the first and second step S1 and S2 and the second sacrificial spacer 113b is attached to the lateral surfaces of the ninth and tenth steps S9 and S10. As described with reference to FIG. 4E, the sacrificial layers 103 of the first and second steps S1 and S2 may be replaced with a conductive material to form gates 150 constituting string selection lines SSL (refer to FIG. 1A); the sacrificial layers 103 of the third to eighth steps S3 to S8 may be replaced with a conductive material to form gates 150 constituting word lines WL (refer to FIG. 1A); and the sacrificial layers 103 of the ninth and tenth steps S9 and S10 may be replaced with a conductive material to form gates 150 constituting ground selection lines GSL.

According to another example, in the processes shown in FIG. 5J, the ninth and tenth steps S9 and S10 may be formed in a stair shape through a mask trim process and an etch process, and the second sacrificial spacer 113b may not be formed. In this case, the first and second steps S1 and S2 may have the same or similar sizes and may be connected to each other through the first sacrificial spacer 113a, and the third to tenth steps S3 to S10 may be formed in a stair shape so that the relative sizes of the third to tenth steps S3 and S10 increase as it goes downward.

Figure 5L:
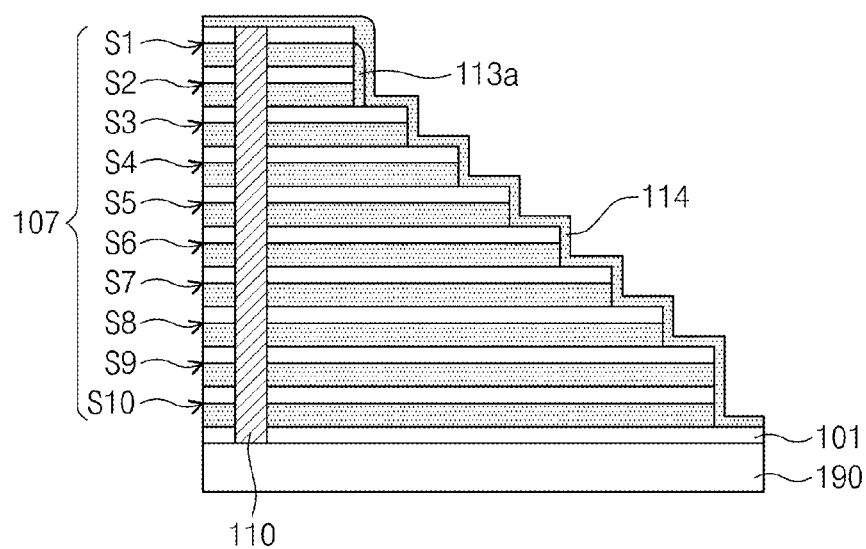
FIGS. 5L and 5M are sectional views for explaining a modification example of the semiconductor device fabricating method of the embodiment of the inventive concept.
Figure 5M:
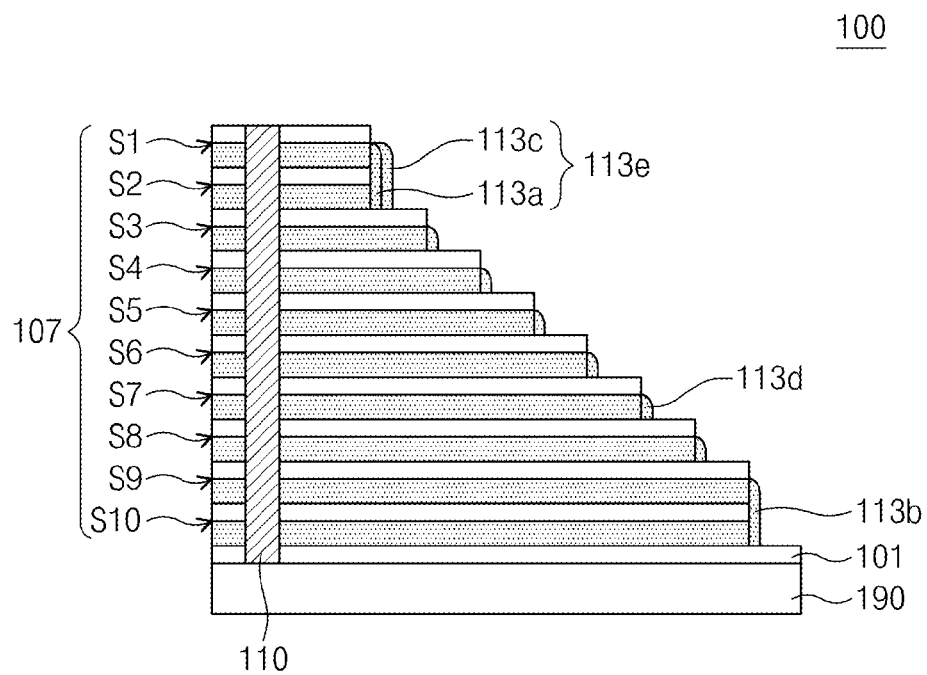

In another example, as shown in FIG. 5L, after the fourth mask 60 is removed in the process explained with reference to FIG. 5J, a material similar to a material used for forming the sacrificial layers 103 may be deposited on the mold stack 100 to form a second sacrificial spacer layer 114. Next, as shown in FIG. 5M, the second sacrificial spacer layer 114 may be etched to form a second sacrificial spacer 113b on lateral surfaces of the ninth and tenth steps S9 and S10. In this case, a third sacrificial spacer 113c may be further formed on the first sacrificial spacer 113a to form an enlarged first sacrificial spacer 113e. In addition, fourth sacrificial spacers 113d may be further formed on lateral surfaces of the third to eighth steps S3 to S8.

FIGS. 5N through 5R are related sectional views explaining a modification to the foregoing fabricating method for a semiconductor device according to an embodiment of the inventive concept.

Relative to the embodiment previously described in relation to FIGS. 5A through 5M, one or more lower steps of first to tenth steps S1 to S10 may be formed, and then the rest of the steps may be formed.

Figure 5N:
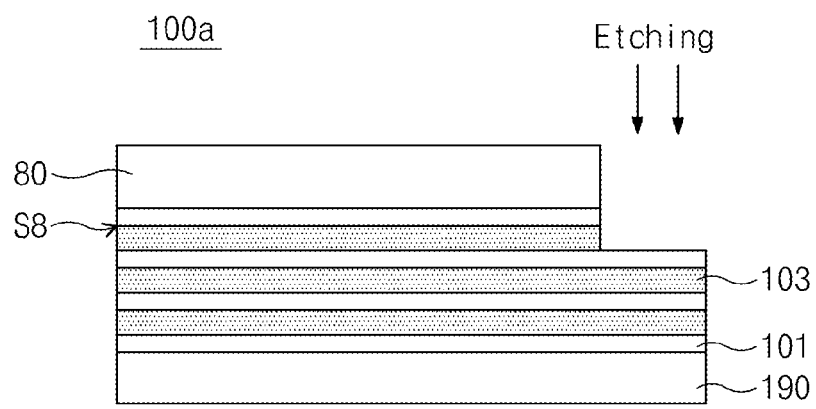
FIGS. 5N through 5R are sectional views for explaining a modification example of the semiconductor device fabricating method of the embodiment of the inventive concept.

Referring to FIG. 5N, a plurality of insulating layers 101 and a plurality of sacrificial layers 103 may be alternately formed on a semiconductor substrate 190 to form a reduced mold stack 100a which is lower than the mold stack 100 shown in FIG. 5A. An eighth step S8 may be formed by patterning the reduced mold stack 100a. For example, a mask 80 may be formed on the reduced mold stack 100a, and the uppermost insulating layer 101 and the uppermost sacrificial layer 103 may be patterned through an etch process using the mask 80 to form an eighth step S8.

Figure 5O:
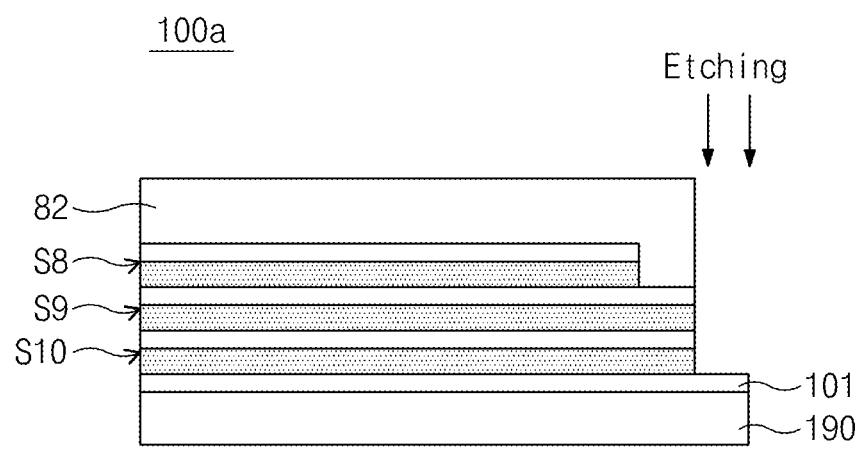

Referring to FIG. 5O, the mask 80 may be removed, and a mask 82 greater than the mask 80 may be formed. Then, the insulating layer 101 and the sacrificial layer 103 disposed just below the eighth step S8 may be simultaneously patterned through an etch process using the mask 82. As a result, a ninth step S9 and a tenth step S10 having the same size or similar sizes may be formed below the eighth step S8.

Figure 5P:
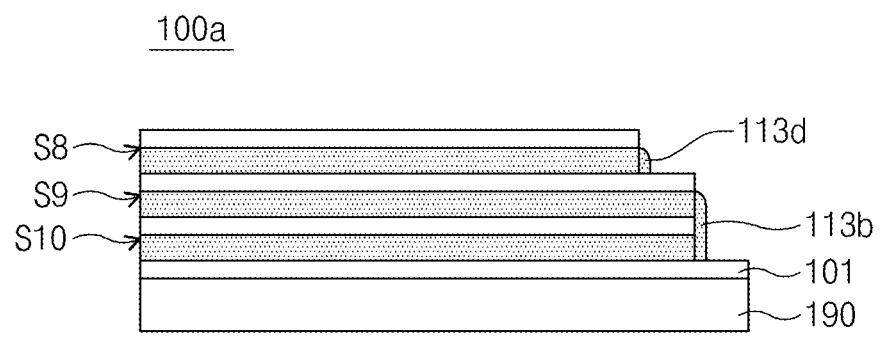

Referring to FIG. 5P, a material equal or similar to a material used for forming the sacrificial layers 103 may be deposited on the reduced mold stack 100a, and the deposited material may be etched to form a second sacrificial spacer 113b that makes contact with lateral surfaces of the ninth and tenth steps S9 and S10. At this time, a sacrificial spacer 113d may also be formed on a lateral surface of the eighth step S8.

Figure 5Q:
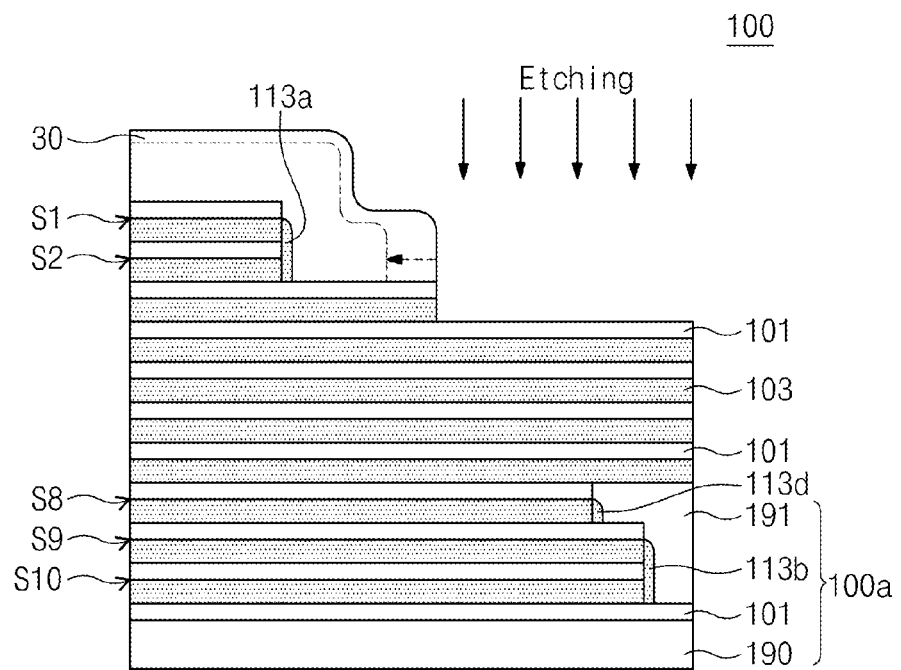

Referring to FIG. 5Q, a plurality of insulating layers 101 and a plurality of sacrificial layers 103 may be further stacked on the reduced mold stack 100a to form a mold stack 100. Before forming the mold stack 100, an insulating layer 191 may be formed on the reduced mold stack 100a by depositing an insulting material on the reduced mold stack 100a and polishing the insulating material in a manner such that the top surface of the insulating layer 191 is flush with the top surface of the reduced mold stack 100a. In this case, the mold stack 100 may be formed without a stepped part. Then, first and second steps S1 and S2 having the same size or similar sizes, and a first sacrificial spacer 113a contacting lateral surfaces of the first and second steps S1 and S2 may be formed through processes equal or similar to the processes explained with reference to FIGS. 5A through 5C. Then, in a step patterning process, etching and mask trim processes may be performed using a second mask 30.

Figure 5R:
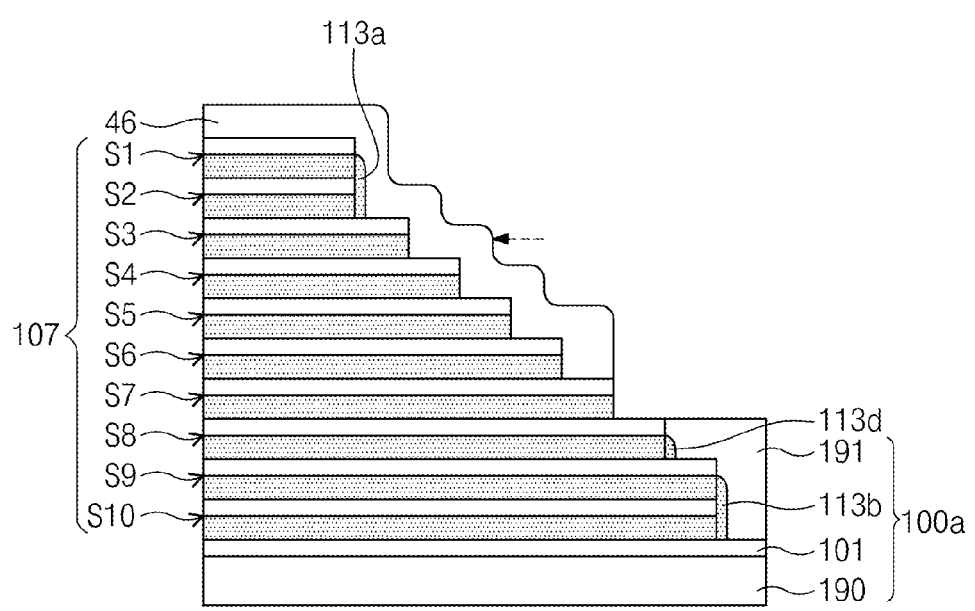

Referring to FIG. 5R, in the step patterning process, the mold stack 100 may be patterned in a stair structure 107. In the current embodiment, the height difference of the top surface of the mold stack 100 may be reduced by the height of the reduced mold stack 100a. Therefore, when a reduced mask 46 is formed through a mask trim process, the thickness of the reduced mask 46 may not be insufficiently maintained or the stair structure 107 may not be exposed to the outside the reduced mask 46 due to an insufficient mask margin.

FIGS. 6A through 6D are related sectional views explaining one possible attach process associated with a method of fabricating a semiconductor device according to an embodiment of the inventive concept.

Figure 6A:
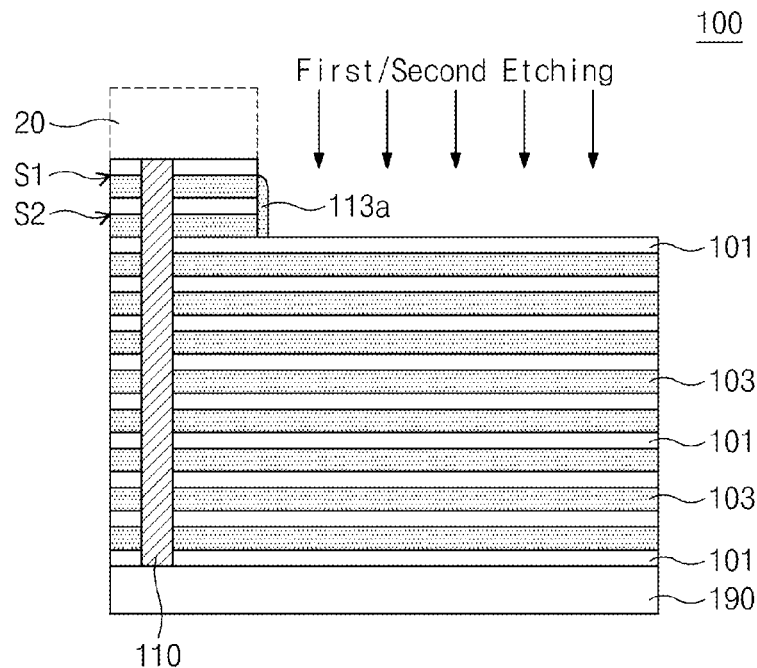
FIGS. 6A through 6D are sectional views for explaining an attach process in a method of fabricating a semiconductor device according to an embodiment of the inventive concept.

Referring to FIG. 6A, first and second steps S1 and S2 may be formed through a first etch process using a first mask 20 as described above with reference to FIGS. 5A to 5C. Then, the first mask 20 may be removed, and a sacrificial spacer layer may be deposited and etched through a second etch process to form a first sacrificial spacer 113a that makes contact with lateral surfaces of the first and second steps S1 and S2.

Figure 6B:
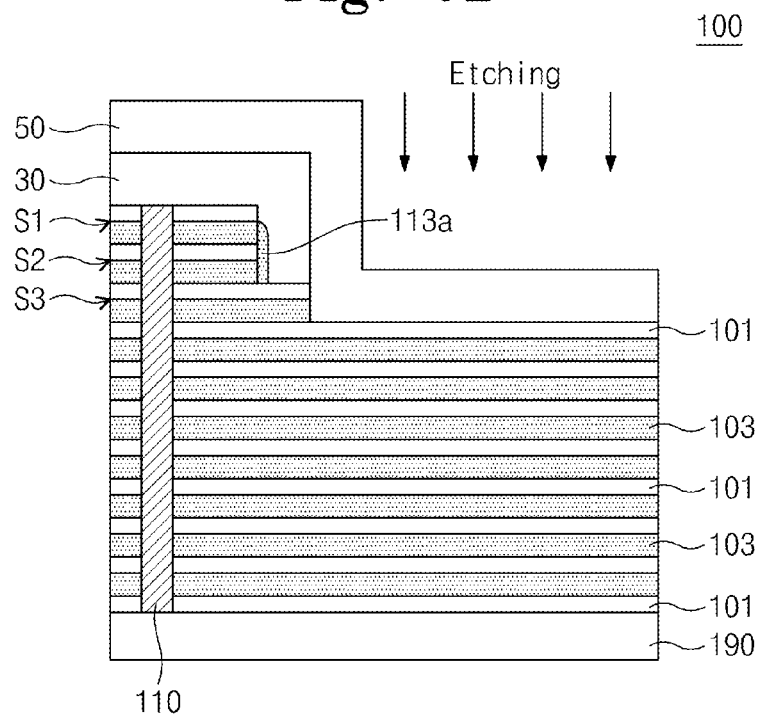

Referring to FIG. 6B, a second mask 30 may be formed on a mold stack 100, and an insulating layer 101 and a sacrificial layer 103 disposed just below the second step S2 may be patterned through an etch process using the second mask 30 so as to form a third step S3. Thereafter, a spacer layer 50 may be formed on the mold stack 100 to cover the second mask 30. The spacer layer 50 may be formed of a polymer such as a carbon polymer containing carbon (C) and hydrogen (H). For example, the spacer layer 50 may be formed through a polymer deposition process using plasma including gas containing carbon, hydrogen, fluorine (F), nitrogen (N) and/or argon (Ar).

Figure 6C:
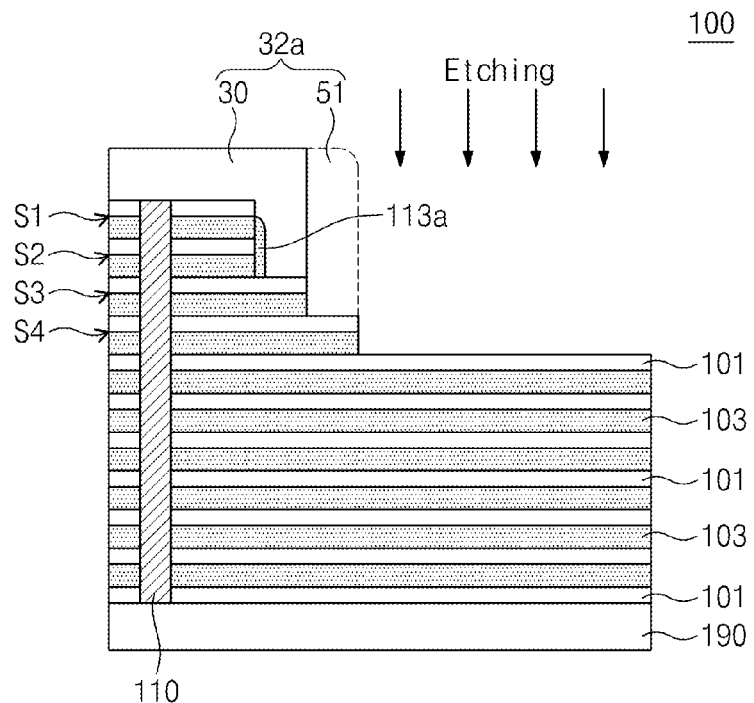

Referring to FIG. 6C, the spacer layer 50 may be partially removed through a polymer etch process to form a first spacer 51. The first spacer 51 may be formed on four sides, opposite two sides, or one side of the second mask 30. The first spacer 51 and the second mask 30 may constitute an enlarged second mask 32a. An insulating layer 101 and a sacrificial layer 103 disposed just below the third step S3 may be patterned through an etch process using the enlarged second mask 32a so as to form a fourth step S4.

The first spacer 51 may be formed by patterning the spacer layer 50 through an anisotropic etch process by using plasma containing the same gas as that used for forming the spacer layer 50. In the current embodiment, the polymer deposition process of FIG. 6A, and the polymer etch process of FIG. 6C can be performed by using the same plasma, and thus the polymer deposition process and the polymer etch process can be performed in situ. In the case where the polymer deposition process and the polymer etch process are performed in situ by using the same plasma, different process conditions may be used for performing the processes effectively. In the polymer deposition process, the concentrations of C and H or the concentration of C may be greater than that of F, and in the polymer etch process, the concentration of F may be greater than the concentrations of C and H or the concentration of C. For example, in the polymer deposition process, methyl fluoride ($CH_3F$) may be used, and in the polymer etch process, trifluoromethane ($CHF_3$), carbon tetrafluoride ($CF_4$), or a combination thereof may be used.

Figure 6D:
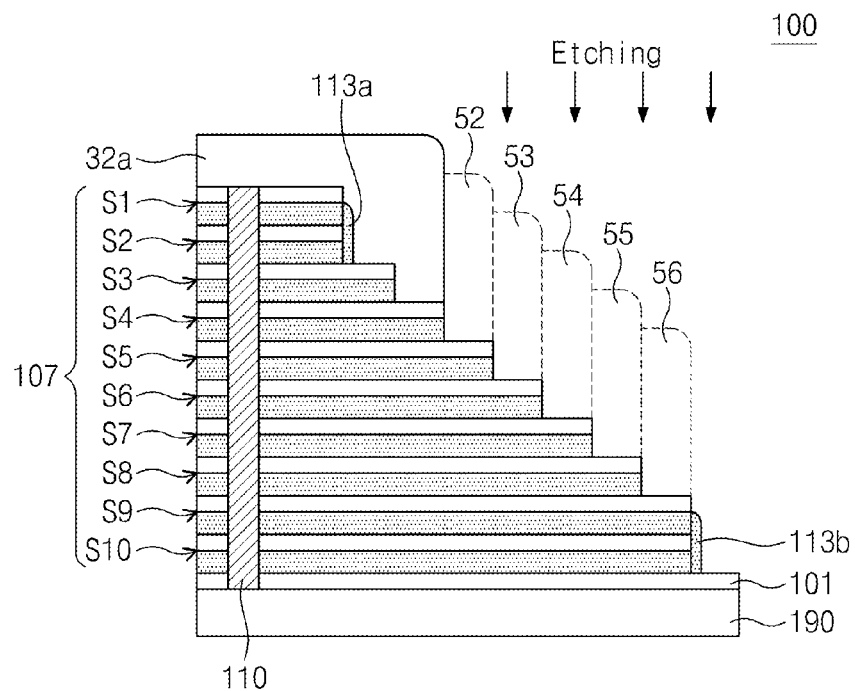

Referring to FIG. 6D, the polymer deposition process and the polymer etch process may be repeated to sequentially attach second to sixth spacers 52 to 56 on a sidewall of the enlarged second mask 32a so as to further enlarge the enlarged second mask 32a sequentially, and fifth to tenth steps S5 to S10 may be sequentially formed through sequentially etch processes using the sequentially-enlarged second mask 32a. The ninth and tenth steps S9 and S10 may have the same size or similar sizes. In the mask enlargement process using polymer attachment, since the spacers 51 to 56 are attached to the lateral surface of the second mask 30, deformation of the second mask 30, particularly, contraction of the second mask 30 may be prevented. In addition, deformation or contraction of the spacers 51 to 56 may not occur. Therefore, the widths of the spacers 51 to 56, that is, the horizontal lengths of the spacers 51 to 56 can be controlled as intended or uniformly maintained, and thus the sizes (horizontal lengths) of the third to tenth steps S3 to S10 can be controlled as intended.

Next, a second sacrificial spacer 113b that makes lateral surfaces of the ninth and tenth steps S9 and S10 may be formed through processes equal or similar to the processes explained with reference to FIGS. 5B and 5C. In this way, the mold stack 100 may have a stair structure 107 in which the first sacrificial spacer 113a is attached to the lateral surfaces of the first and second steps S1 and S2 and the second sacrificial spacer 113b is attached to the lateral surfaces of the ninth and tenth steps S9 and S10 like that shown in FIG. 5K. The attach process can be applied to the case where lower steps are formed and then the other steps are formed as described with reference to FIGS. 5N through 5P.

FIGS. 7A through 7D are related sectional views illustrating possible modifications to the mold stack according to a method of fabricating a semiconductor device according to embodiments of the inventive concept.

Figure 7A:
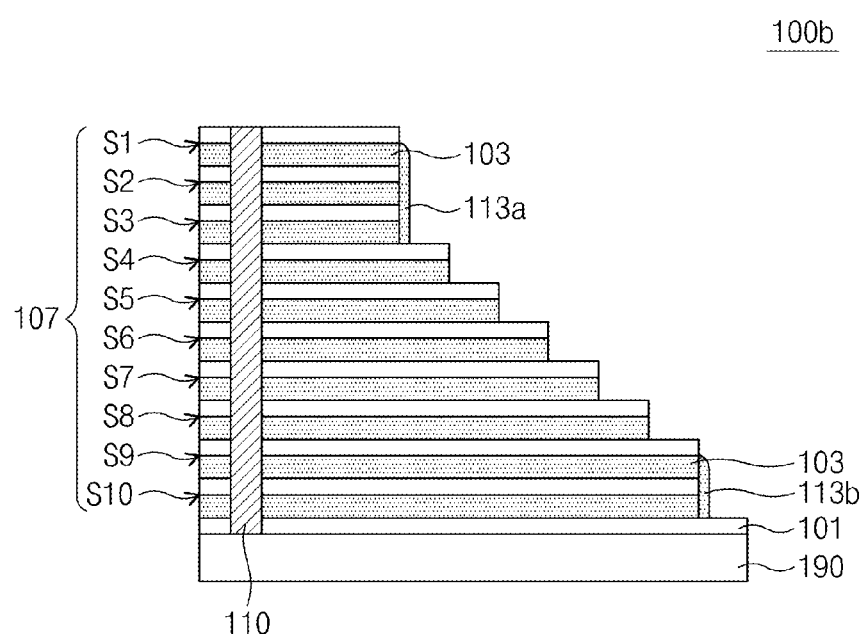
FIGS. 7A through 7D are sectional views illustrating modification examples of a mold stack in a method of fabricating a semiconductor device according to embodiments of the inventive concept.

Referring to FIG. 7A, a mold stack 100b may include first to third steps S1 to S3 having the same size or similar sizes, and a first sacrificial spacer 113a may be attached to lateral surfaces of the first to third steps S1 to S3. In the current embodiment, sacrificial layers 103 of the first to third steps S1 to S3 may be replaced with gates 150 (refer to FIG. 1K) to form a three-layer string selection lines SSL. In another example, the first sacrificial spacer 113a may be attached to the lateral surfaces of the first and second steps S1 and S2 to form string selection lines SSL as shown in FIG. 1L.

Figure 7B:
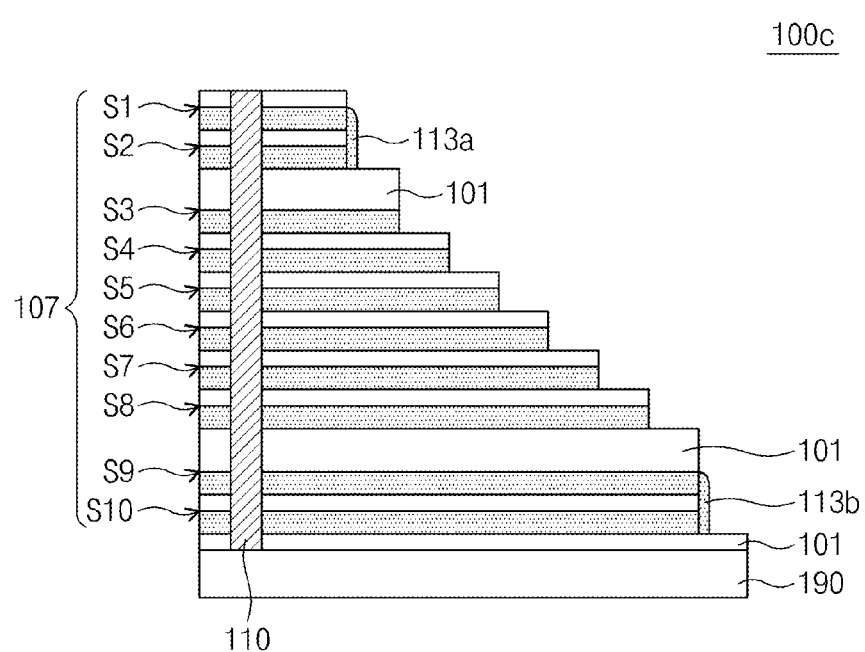

Referring to FIG. 7B, a mold stack 100c may include insulating layers 101 having different thicknesses. For example, an insulating layer 101 of a third step S3 and/or an insulating layer 101 of a ninth step S9 may be thicker than insulating layers 101 of other steps S2 to S8 and S10. First and second steps S1 and S2 may be used to form string selection lines SSL; the ninth and tenth steps S9 and S10 may be used to form ground selection lines GSL; and the third to eighth steps S3 to S8 may be used to form word lines WL. In the current embodiment, the thicker insulating layers 101 may reduce an electric shock caused by a voltage drop between the string selection lines SSL and the word lines WL, and/or a voltage drop between the ground selection lines GSL and the word lines WL.

Figure 7C:
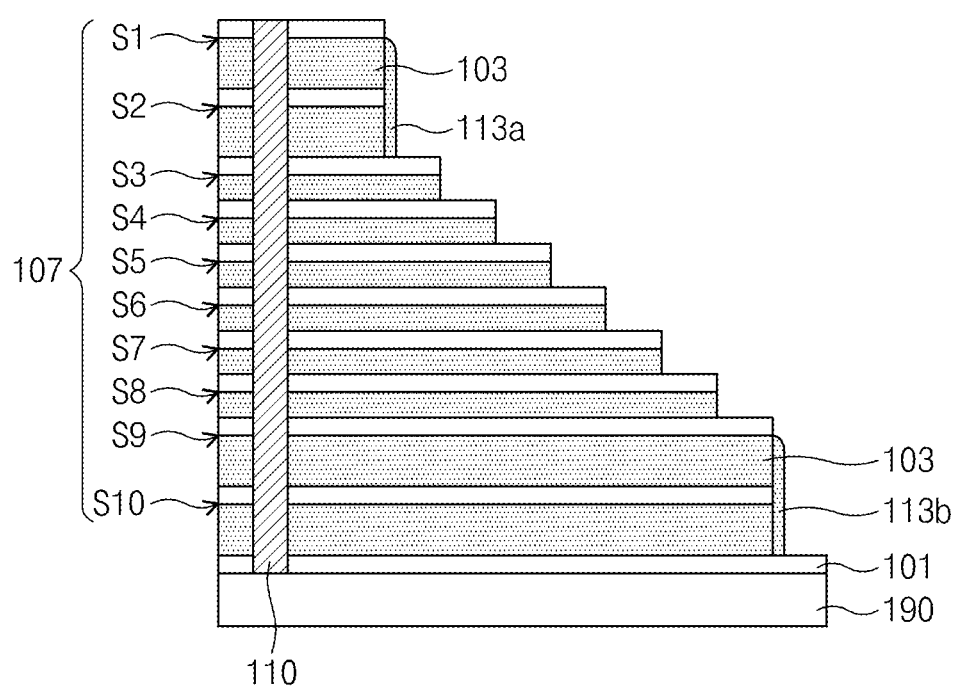

Referring to FIG. 7C, a mold stack 100d may include sacrificial layers 103 having different thicknesses. For example, as shown in FIG. 7C, sacrificial layers 103 of first and second steps S1 and S2, and/or sacrificial layers 103 of ninth and tenth steps S9 and S10 may be thicker than sacrificial layers 103 of the other steps S3 to S8. According to the illustrated embodiment, relatively thicker selection lines SSL and GSL may be formed by a gate replacement process. Therefore, a channel length may be increased to improve performance relative to leakage current.

Figure 7D:
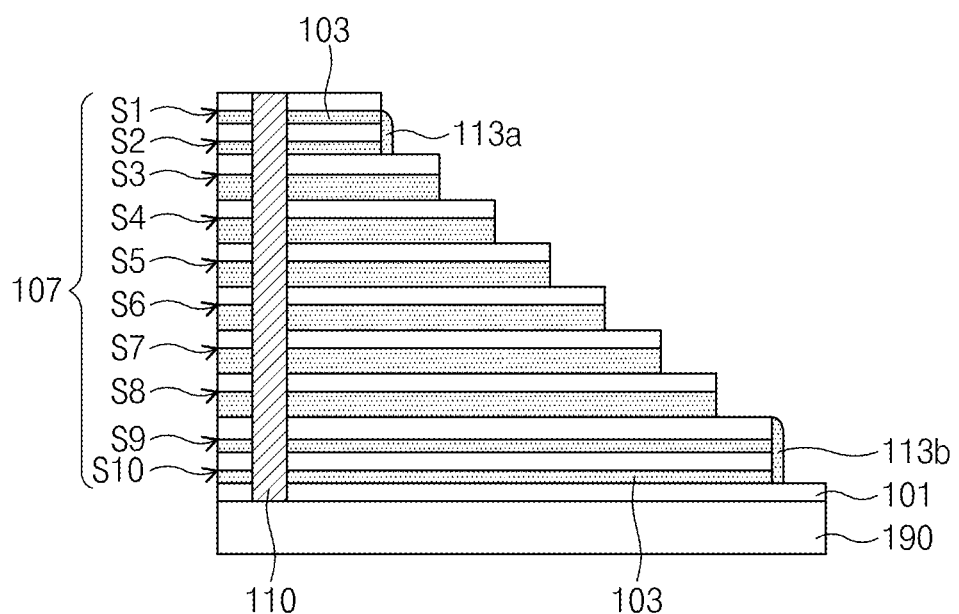

Refer to FIG. 7D, a mold stack 100e having a relatively reduced height may be formed. For example, sacrificial layers 103 of first and second steps S1 and S2, and/or sacrificial layers 103 of ninth and tenth steps S9 and S10 may be thinner than sacrificial layers 103 of the other steps S3 to S8. According to the current embodiment, although relatively thinner selection lines SSL and GSL are formed by a gate replacement process, a channel length may be substantially increased since upper and lower gates 150 of the selection lines SSL and GSL are connected to each other.

Figure 8A:
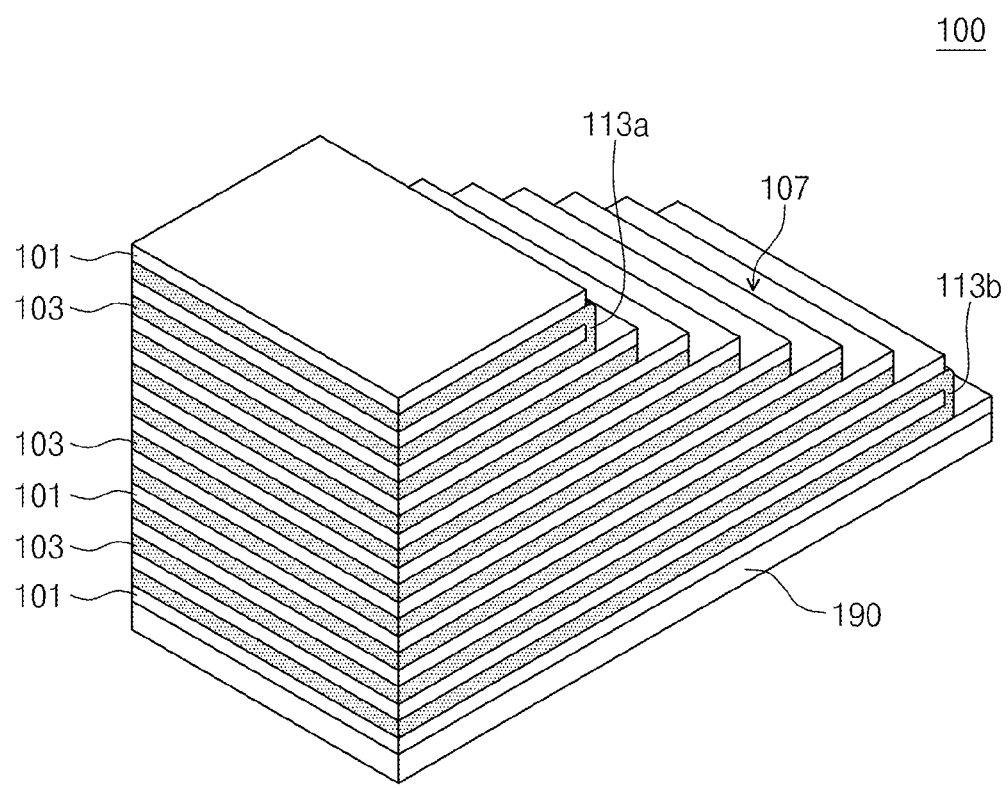
FIGS. 8A through 8C are perspective views for illustrating a method of fabricating a semiconductor device of an embodiment of the inventive concept.
Figure 8B:
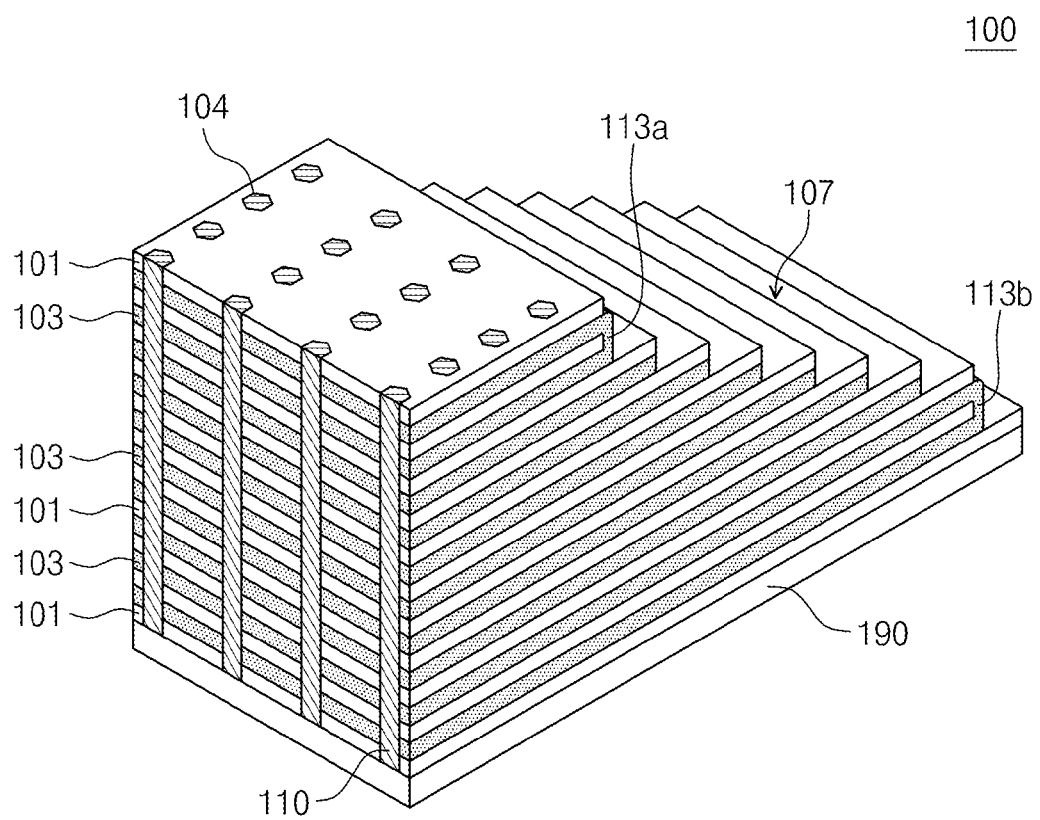
Figure 8C:
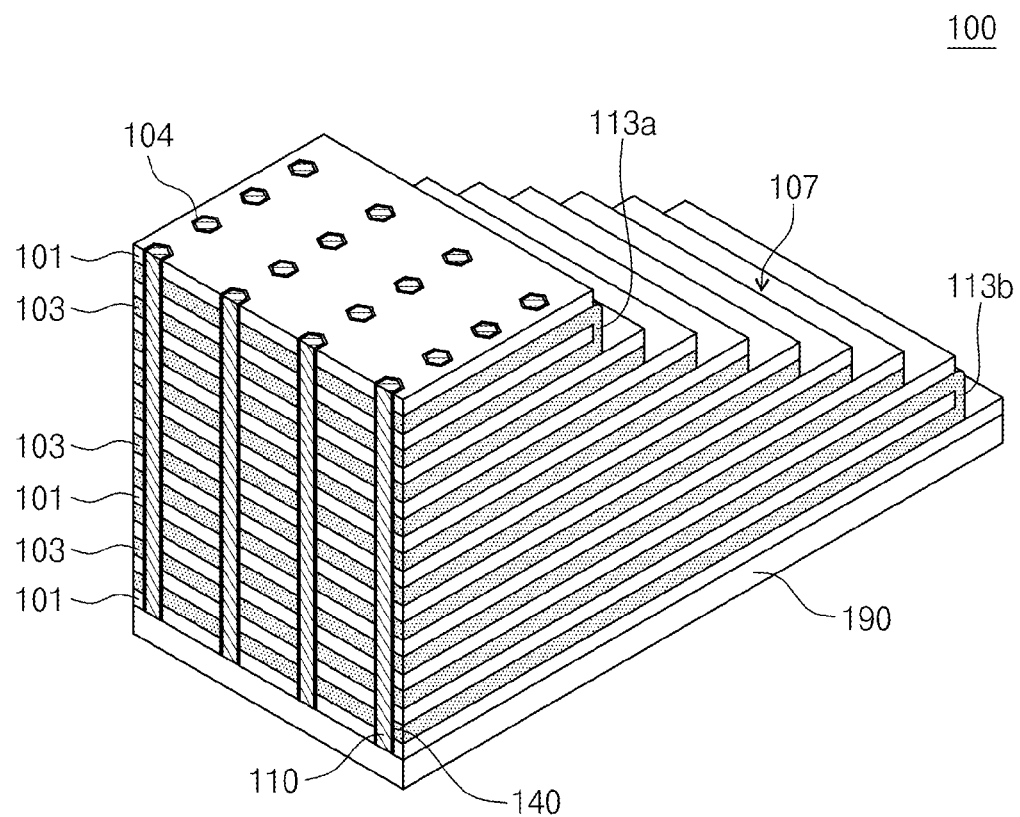

FIGS. 8A through 8C are related perspective views illustrating another method of fabricating a semiconductor device according to an embodiment of the inventive concept.

Referring to FIG. 8A, a mold stack 100 may be formed by alternately stacking insulating layers 101 and sacrificial layers 103, and the mold stack 100 may be patterned to a stair structure 107 on at least one side of the mold stack 100. The stair structure 107 may be formed through a trim process explained with reference to FIGS. 5A through 5R or an attach process explained with reference to FIGS. 6A through 6D. In the current embodiment, a first sacrificial spacer 113a may be formed to structurally connect the uppermost sacrificial layer 103 and the next sacrificial layer 103 directly under the uppermost sacrificial layer 103. Similarly, a second sacrificial spacer 113b may be formed to connect the lowermost sacrificial layer 103 and the next sacrificial layer 103 directly above the lowermost sacrificial layer 103.

Referring to FIG. 8B, after the step patterning process, vertical channels 110 may be formed. The vertical channels 110 may vertically penetrate the insulating layers 101 and the sacrificial layers 103 to a semiconductor substrate 190. Next, as described with reference to FIGS. 4C through 4I, a semiconductor device 1 such as that shown in FIG. 1A may be formed by performing a word line cutting process, a replacement process, and a contact forming process.

In another embodiment, as shown in FIG. 8C, information storage layers 140 may be formed on the sidewalls of channel holes 104, and then vertical channels 110 may be formed. The information storage layers 140 may extend vertically along the sidewalls of the vertical channels 110. As shown in FIG. 1D, the information storage layers 140 may include tunnel insulating layers 141, charge storage layers 143, and blocking insulating layers 145. Unlike the example shown in FIG. 1D, regions are not necessary between the insulating layers 101 for the information storage layers 140, and thus the height of the mold stack 100 can be reduced for decreasing the size of a semiconductor device. The process of forming the information storage layers 140 in the channel holes 104 may be applied to the embodiment explained with reference to FIGS. 4A through 4I.

FIGS. 9A through 9D are related perspective views illustrating a yet another method of fabricating a semiconductor device according to an embodiment of the inventive concept.

Figure 9A:
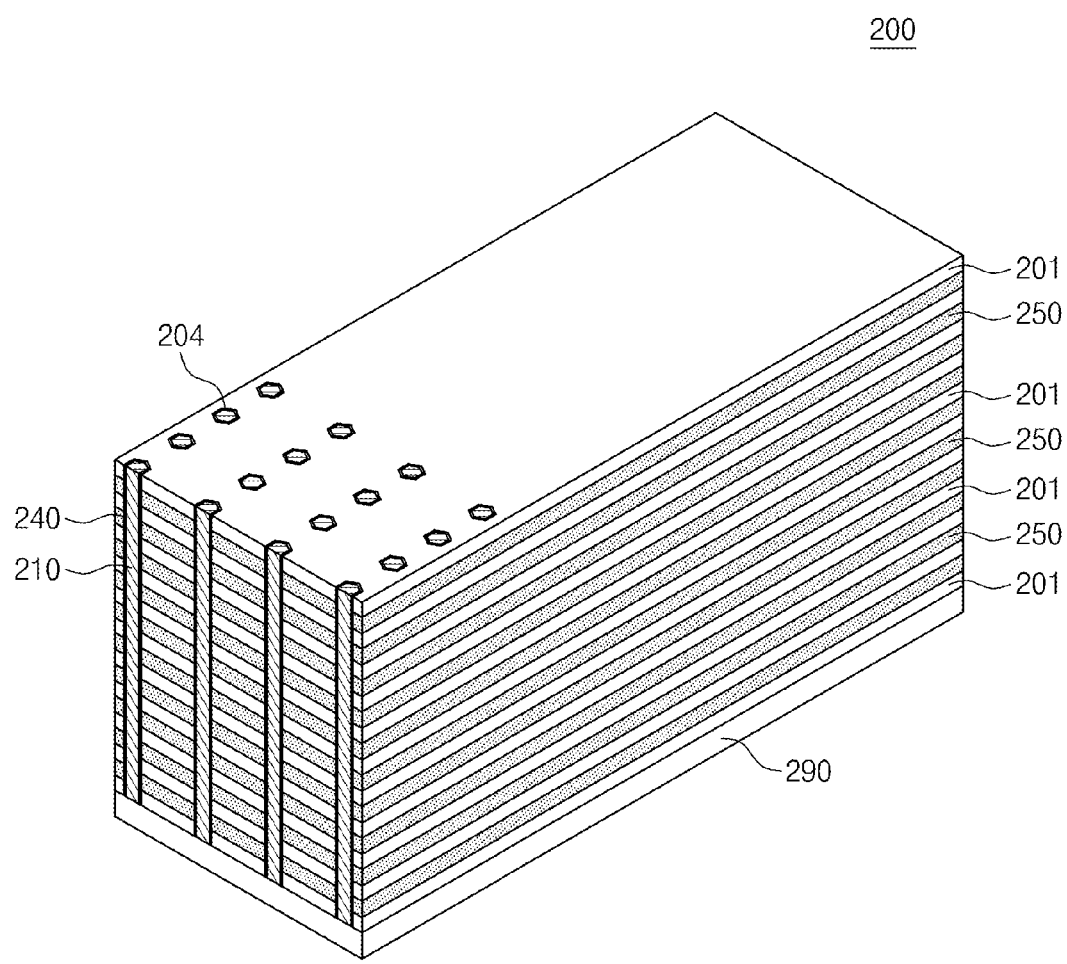
FIGS. 9A through 9D are perspective views for illustrating a method of fabricating a semiconductor device of an embodiment of the inventive concept.

Referring to FIG. 9A, a plurality of insulating layers 201 and a plurality of conductive layers 250 may be alternately stacked on a semiconductor substrate 290 to form a mold stack 200, and a plurality of channel holes 204 may be vertically formed through the mold stack 200 to expose the semiconductor substrate 290. For example, the insulating layers 201 may be formed by depositing silicon oxide layers or silicon nitride layers, and the conductive layers 250 may be formed by depositing silicon layers. Information storage layers 240 and vertical channels 210 may be formed in the channel holes 204. As shown in FIG. 3D, the information storage layers 240 may include charge storage layers and have a multi-layer structure vertically extending along the vertical channels 210. The vertical channels 210 may have a silicon bulk structure as shown in FIG. 3C or a macaroni structure as shown in FIG. 3E.

Figure 9B:
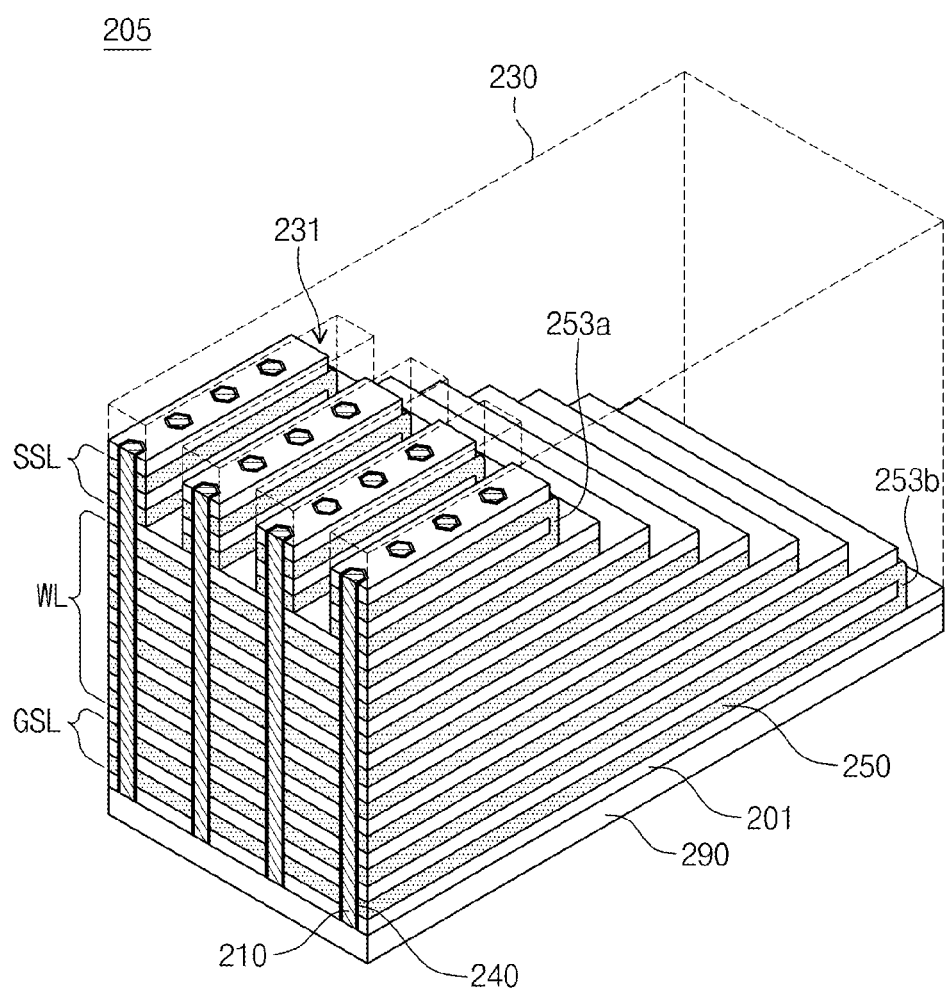

Referring to FIG. 9B, after the vertical channels 210 are formed, a step patterning process may be performed. For example, the mold stack 200 may be patterned to form a gate stack 205 in which the conductive layers 250 are stacked in a stair shape. The step patterning process for forming the gate stack 205 may be performed by using the trim process explained with reference to FIGS. 5A through 5R or the attach process explained with reference to FIGS. 6A through 6D. In the current embodiment, a first conductive spacer 253a may be formed to connect the uppermost conductive layer 250 (hereinafter referred to as a gate 250) and the next gate 250 directly under the uppermost conductive layer 250. Similarly, a second conductive spacer 253b may be formed to connect the lowermost gate 250 and the next gate 250 directly above the lowermost gate 250.

Figure 9C:
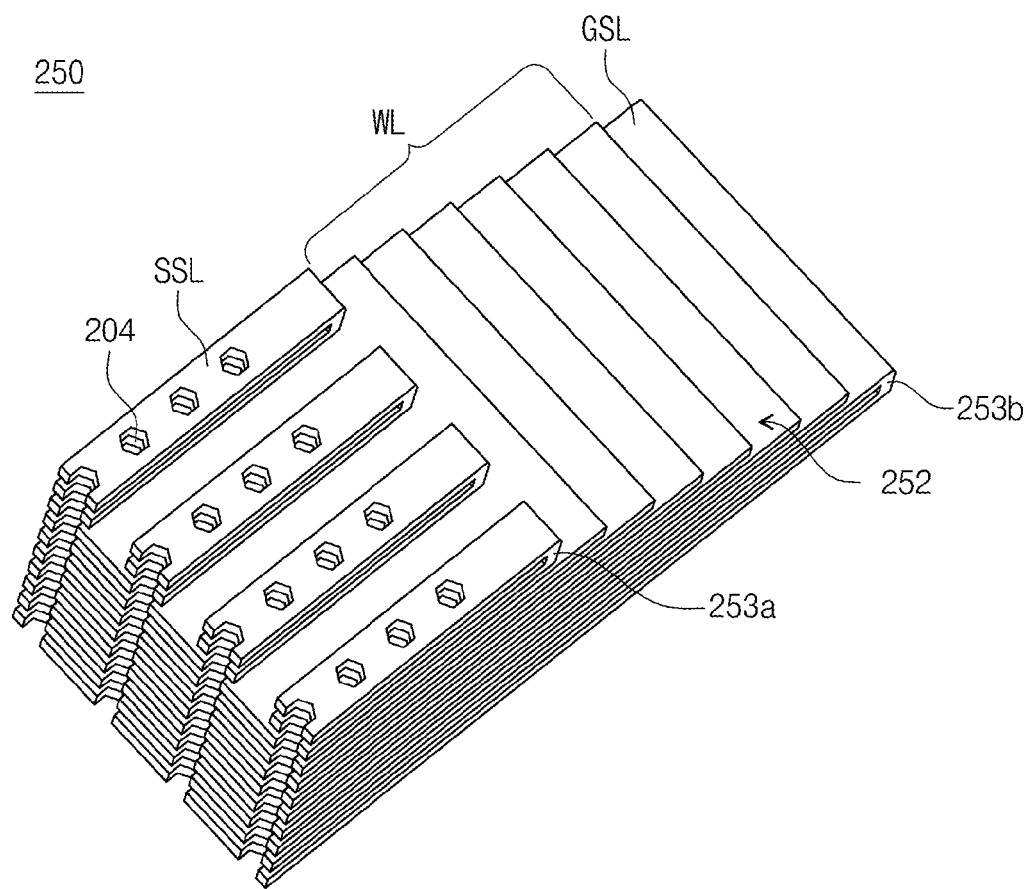

Next, an insulating layer 230 may be formed on the gate stack 205, and the gate stack 205 may be patterned by an anisotropic etch process to separate the uppermost insulating layer 201, the very next gate 250, the very next insulating layer 201, and the very next gate 250 in a line shape. The uppermost gate 250 and the very next gate 250 may constitute string selection lines SSL which are structurally connected in a two-layer, line-shaped structure. The lowermost gate 250 and the very next gate 250 may constitute ground selection lines GSL which are structurally connected in a two-layer, plate-shaped structure. The rest gates 250 may constitute single-layer, plate-shaped word lines WL. Detailed resulting shapes for the gates 250 are shown in FIG. 9C. Separation regions 231 may be filled with an insulating material.

Referring to FIG. 9C, the uppermost gate 250 and the very next gate 250 may constitute string selection lines SSL connected to each other via first conductive spacers 253a. Similarly, the lowermost gate 250 and the very next gate 250 may constitute ground selection lines GSL connected to each other via a second conductive spacer 253b. The other gates 250 may constitute single-layer word lines WL. The string selection lines SSL may have a line shape, and the word lines WL and the ground selection lines GSL may have a plate shape. Exposed parts of the gates 250 not covered with upper neighboring gates 250 may be defined as pads 252.

Figure 9D:
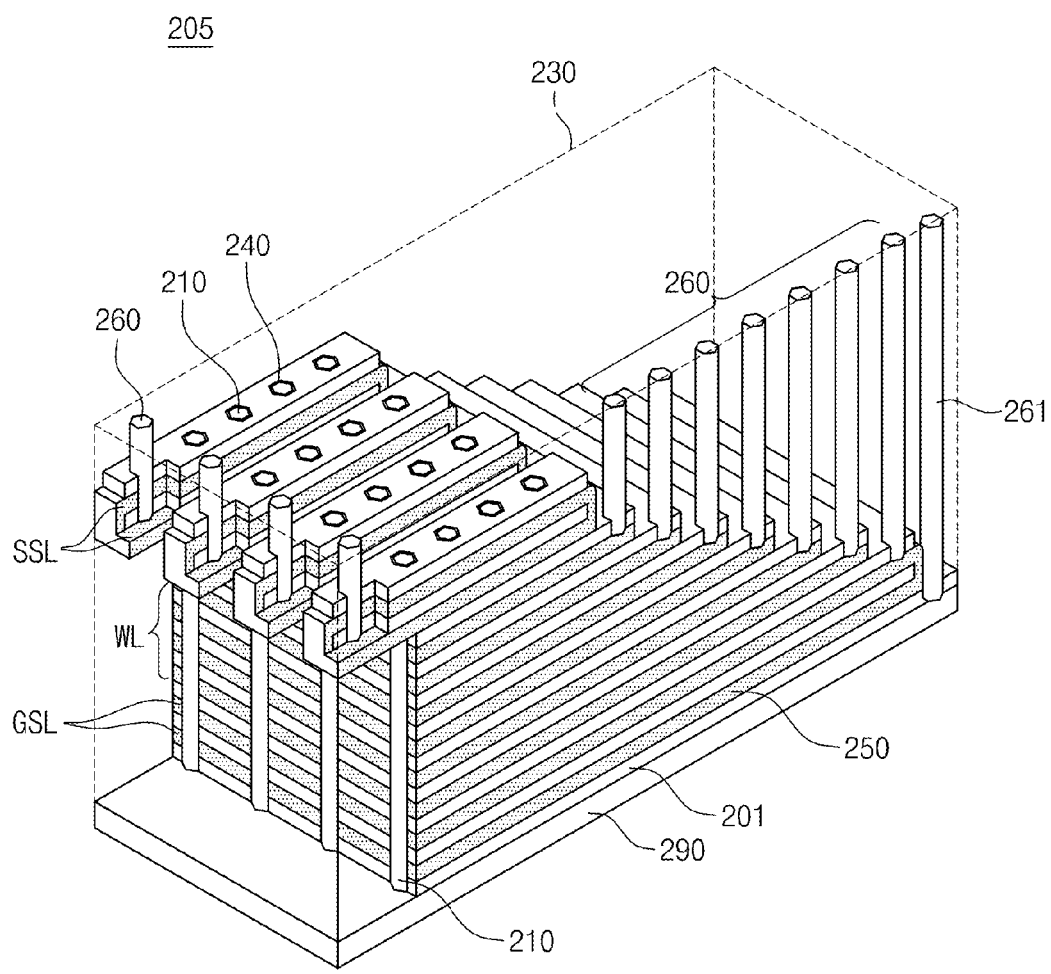

Referring to FIG. 9D, contacts 260 may be formed so that the contacts 260 penetrate the insulating layer 230 and are connected to the pads 252 of the gates 250. Optionally, a contact 261 may be further formed so that the contact 261 can be connected to the semiconductor substrate 290. When contact holes are formed before the contacts 260 and 261 are formed, over-etching caused by depth differences may be prevented as described with reference to FIGS. 4H and 4I. If the other elements such as bit lines and metal lines are formed, a semiconductor device 2 similar to that shown in FIG. 3A may be formed.

Figure 10A:
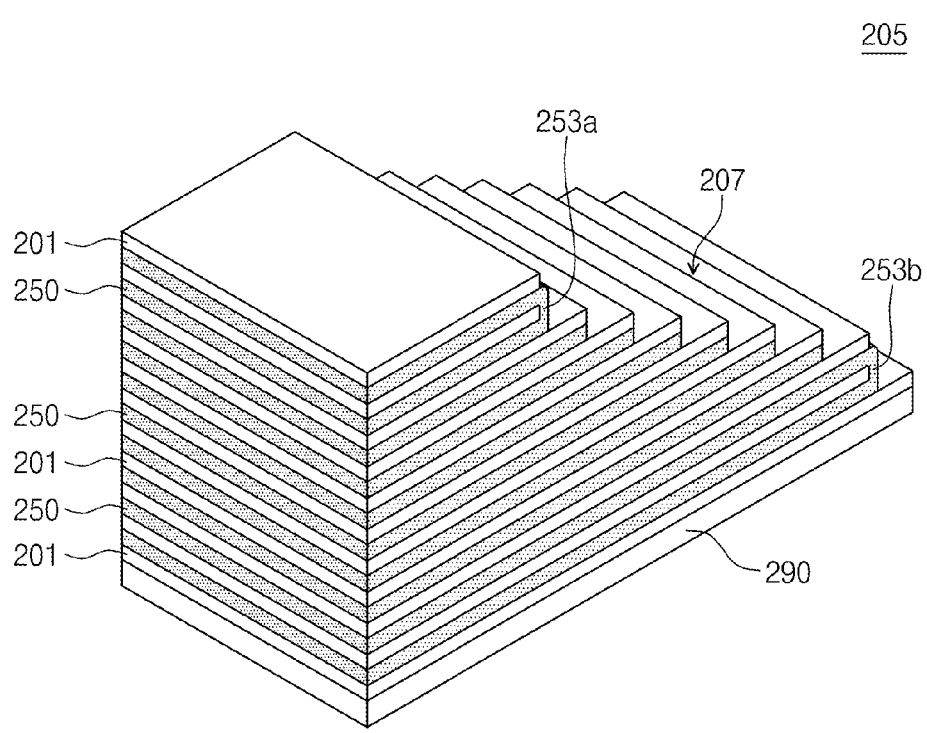
FIGS. 10A and 10B are perspective views for illustrating a method of fabricating a semiconductor device of an embodiment of the inventive concept.
Figure 10B:
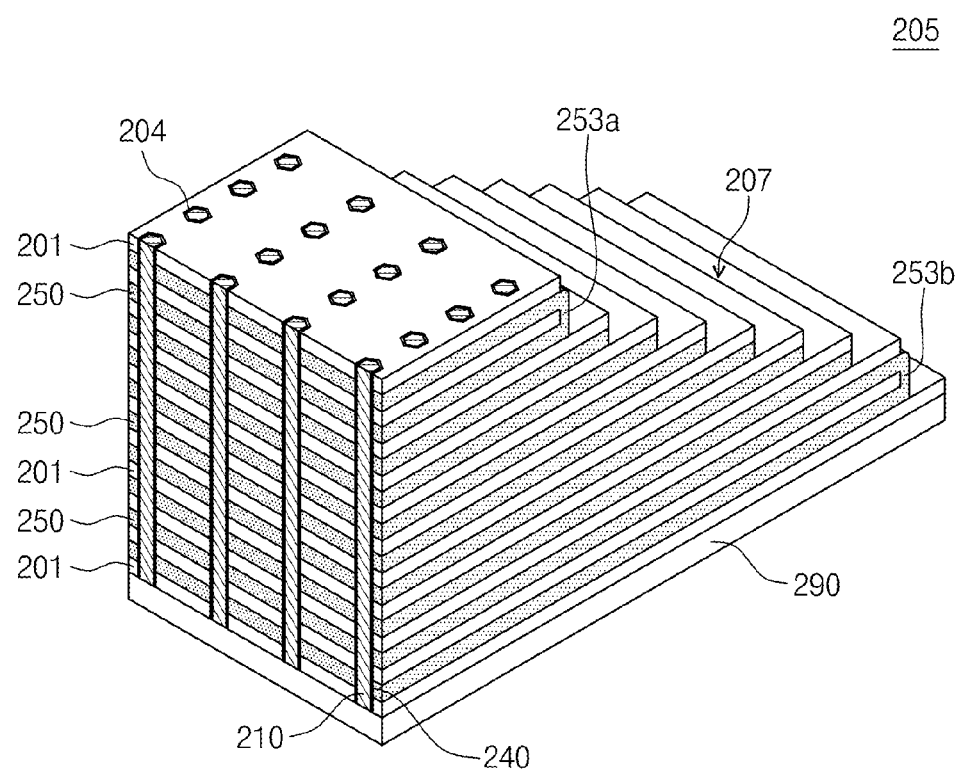

FIGS. 10A and 10B are perspective views illustrating yet another method of fabricating a semiconductor device according to an embodiment of the inventive concept.

Referring to FIG. 10A, a plurality of insulating layers 201 and a plurality of conductive layers 250 may be alternately stacked on a semiconductor substrate 290 to form a gate stack 205 having a stair structure 207 on at least one side. The stair structure 207 may be formed by a trim process or an attach process as described above. A first conductive spacer 253a may be formed to structurally connect the uppermost gate 250 and the very next gate 250. Similarly, a second spacer 253b may be formed to structurally connect the lowermost gate 250 and the very next gate 250.

Referring to FIG. 10B, after the step patterning process, vertical channels 210 may be formed. For example, a plurality of channel holes 204 may be formed through the gate stack 205 to expose the top surface of the semiconductor substrate 290, and a plurality of vertical channels 210 and information storage layers 240 extending along the length direction of the vertical channels 210 may be formed in the channel holes 204. Next, a string selection line separation process and a contact forming process may be performed as explained with reference to FIGS. 9B through 9D to form a semiconductor device such as the semiconductor device 2 shown in FIG. 3A.

Figure 11A:
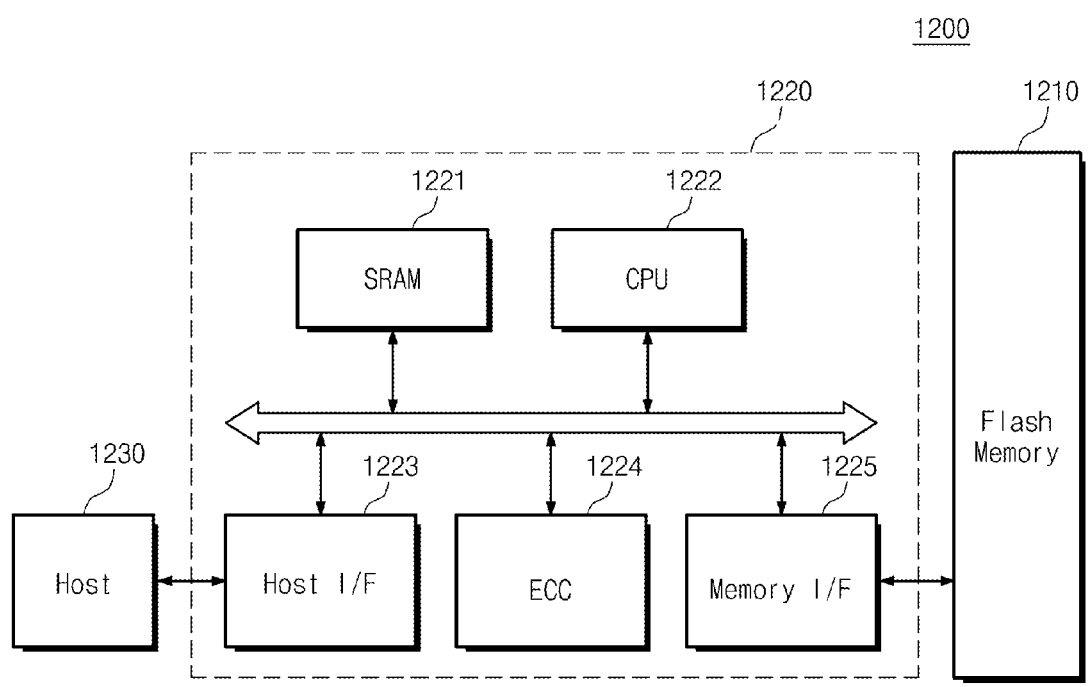
FIGS. 11A and 11B are block diagrams illustrating an application example of a semiconductor device according to an embodiment of the inventive concept.

FIG. 11A is a block diagram illustrating a memory card 1200 including a semiconductor device according to an embodiment of the inventive concept.

Referring to FIG. 11A, the memory card 1200 is for supporting high-capacity data storage capability and includes a flash memory 1210. The flash memory 1210 may include a semiconductor device such as the semiconductor devices of the forgoing embodiments. For example, the flash memory 1210 may include a vertical NAND flash memory device.

The memory card 1200 may include a memory controller 1220 that controls data exchange between a host 1230 and the flash memory 1210. An SRAM 1221 may be used as a working memory of a central processing unit (CPU) 1222. A host interface 1223 may have data exchange protocol of the host 1230 connected to the memory card 1200. An error correction code (ECC) 1224 may detect and correct an error included in data read from the flash memory 1210. A memory interface 1225 interfaces with the flash memory 1210. The CPU 1222 performs an overall control operation for data exchange of the memory controller 1220. Although not shown in the drawings, the memory card 1200 may further include a ROM (not shown) storing code data for interfacing with the host 1230.

Figure 11B:
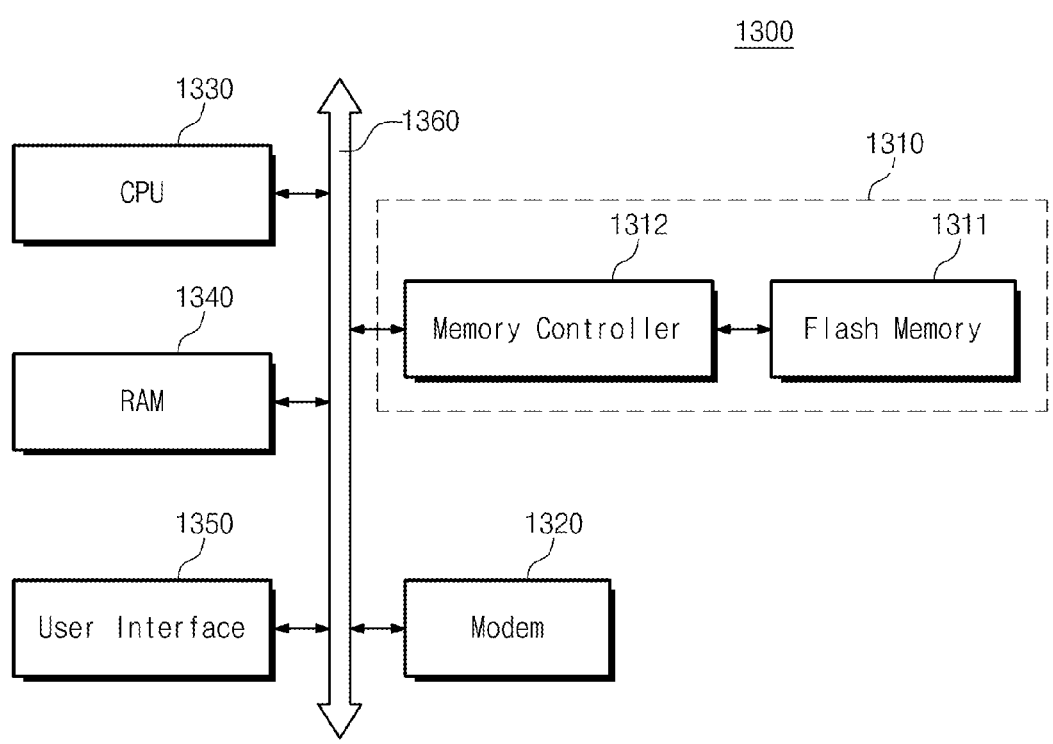

FIG. 11B is a block diagram illustrating an information processing system 1300 including a semiconductor device according to an embodiment of the inventive concept.

Referring to FIG. 11B, the information processing system 1300 according to the embodiment of the inventive concept may include a flash memory system 1310. The flash memory system 1310 may include a semiconductor device such as the semiconductor devices of the forgoing embodiments, for example, a vertical NAND flash memory device. The information processing system 1300 may include a mobile device, a computer or the like.

In one example, the information processing system 1300 may include a modem 1320 electrically connected to the flash memory system 1310 through a system bus 1360, a central processing unit (CPU) 1330, a RAM 1340, and a user interface 1350. Data processed by the CPU 1330 or external input data may be stored in the flash memory system 1310. The information processing system 1300 may be provided in the forms of a memory card, a solid state disk, a camera image sensor, and an application chipset. The flash memory system 1310 may be configured as a semiconductor disk device (SSD). In this case, the information processing system 1300 can stably and reliably store high-capacity data in the flash memory system 1310.

As described above, the process margin of an etch process for forming contact holes can be sufficiently ensured, and thus over-etching can be prevented even when the contact holes have different depths. Therefore, process errors can be reduced, and the process yield can be improved. In addition, the area required for pads formation and/or the number of contacts may be reduced owing to the reduced number of pads, and thus a semiconductor device having a relatively smaller size or area may be provided.

The above-disclosed subject matter is to be considered illustrative and not restrictive, and the appended claims are intended to cover all such modifications, enhancements, and other embodiments, which fall within the scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A method of fabricating a semiconductor device, the method comprising:
    forming a plurality of vertical channels on a substrate; and
    forming a gate stack having a stair-stepped structure on the substrate, the gate stack including vertically spaced apart conductive layers constituting gates, respectively, insulating layers each interposed between respective ones of the conductive layers, and an electrical conductor integral with first and second ones of the gates at lateral sides of the first and second gates so as to electrically connect the first and second gates,
    wherein the vertical channels extend vertically through the gate stack;
    the first and second gates are uppermost ones of the gates or lowermost ones of the,
    the insulating layers include a first insulating layer interposed between the first and second gates and having a lateral surface, and a second insulating layer disposed on the second gate and having a lateral surface vertically aligned with the lateral surface of the first insulating layer,
    the forming of the electrical conductor comprises forming electrically conductive material along the lateral surface of the first insulating layer,
    whereby a multi-layered structure constituted by the first and second gates and the electrical conductor is formed.

2. The method of claim 1, wherein the forming of the gate stack comprises:
    forming a mold stack of a plurality of sacrificial layers spaced apart from one another on the substrate;
    patterning the mold stack; and
    replacing the sacrificial layers with conductive layers to form the gates.

3. The method of claim 2, wherein the patterning of the mold stack comprises etching the sacrificial layers using sequentially decreasing or increasing masks so as to repeatedly and sequentially form steps in the stack of sacrificial layers.

4. The method of claim 3, wherein the patterning of the mold stack comprises simultaneously patterning a first one of the sacrificial layers and a second one of the sacrificial layers disposed adjacent to and under the first sacrificial layer to thereby form first and second sacrificial layer patterns; and
    the forming of the electrical conductor comprises forming a connection layer pattern making contact with lateral end surfaces of the first and second sacrificial layer patterns, and
    replacing the connection layer pattern with electrically conductive material,
    whereby the multi-layered structure is a one-piece structure constituted by the first and second gates and the electrical conductor.

5. The method of claim 4, wherein the forming of the connection layer pattern comprises:
    forming a connection layer on the mold stack from a material having at least one of a same composition and a same etch selectivity as the sacrificial layers; and
    anisotropically etching the connection layer to form the connection layer pattern on the lateral end surfaces of the first and second sacrificial layer patterns.

6. The method of claim 4, wherein the thickness of at least one of the first and second sacrificial layers is different from the thickness of each of the other sacrificial layers.

7. The method of claim 1, wherein the forming of the gate stack comprises:
    forming a stack of vertically spaced apart conductive layers on the substrate; and
    forming the stair-stepped structure by patterning the stack of conductive layers, and thereby forming the gates.

8. The method of claim 7, wherein the patterning of the stack of conductive layers comprises sequentially etching the conductive layers using sequentially decreasing or increasing masks so as to repeatedly and sequentially form steps in the stack of conductive layers.

9. The method of claim 7, wherein the patterning of the stack of conductive layers comprises patterning a first one of the conductive layers and a second one of the conductive layers disposed adjacent to and under the first conductive layer to thereby form patterned first and second conductive layers constituting the first and second gates, respectively; and
    the forming of the electrical conductor comprises forming a conductive spacer integrally with lateral surfaces of the patterned first and second conductive layers.

10. The method of claim 9, wherein the forming of the conductive spacer comprises:
    forming a conductive spacer layer on the mold stack using a material having a same composition as that of the conductive layers; and
    anisotropically etching the conductive spacer layer to form the conductive spacer on the lateral surfaces of the patterned first and second conductive layers.

11. The method of claim 9, wherein the thickness of each of the first and second conductive layers is different from the thickness of each of the other conductive layers.

12. The method of claim 4, wherein the first and second sacrificial layer patterns are replaced with respective ones of the conductive layers at the same time the connection layer pattern is replaced with the electrically conductive material.

13. The method of claim 1, wherein the forming of the electrical conductor comprises forming the electrically conductive material in contact with the lateral surface of the first insulating layer.

14. A method of fabricating a semiconductor device, the method comprising:
    forming a plurality of vertical channels on a substrate; and
    forming a gate stack having a stair-stepped structure on the substrate, the gate stack including a plurality of vertically spaced apart layers constituting gates, respectively, and an electrical conductor integral with first and second ones of the gates,
    wherein the vertical channels extend vertically through the gate stack;

the first and second gates are uppermost ones of the gates or lowermost ones of the gates;

the forming of the gate stack comprises:

forming a mold stack of a plurality of sacrificial layers spaced apart from one another on the substrate, patterning the mold stack by etching the sacrificial layers using sequentially decreasing or increasing masks so as to repeatedly and sequentially form steps in the stack of sacrificial layers, and the patterning of the mold stack includes simultaneously patterning a first one of the sacrificial layers and a second one of the sacrificial layers disposed adjacent to and under the first sacrificial layer to thereby form first and second sacrificial layer patterns, and replacing the sacrificial layers with electrically conductive layers to form the gates; and the forming of the electrical conductor comprises:

forming a connection layer pattern making contact with lateral end surfaces of the first and second sacrificial layer patterns, and replacing the connection layer pattern with electrically conductive material, whereby the multi-layered structure is a one-piece structure constituted by the first and second gates and the electrical conductor.

15. The method of claim 14, wherein the forming of the connection layer pattern comprises:

forming a connection layer on the mold stack from a material having at least one of a same composition and a same etch selectivity as the sacrificial layers, and anisotropically etching the connection layer to form the connection layer pattern on the lateral end surfaces of the first and second sacrificial layer patterns.

16. The method of claim 14, wherein the thickness of at least one of the first and second sacrificial layers is different from the thickness of each of the other sacrificial layers.

17. The method of claim 14, wherein the first and second sacrificial layer patterns are replaced with respective ones of the conductive layers at the same time the connection layer pattern is replaced with the electrically conductive material.

\* \* \* \* \*